(12) United States Patent
Jeong

(10) Patent No.: US 12,019,830 B2
(45) Date of Patent: Jun. 25, 2024

(54) BAND PASS FILTER AND SENSOR DEVICE INCLUDING THE SAME

(71) Applicant: SAMSUNG DISPLAY CO., LTD., Yongin-si (KR)

(72) Inventor: Moon Jae Jeong, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/992,173

(22) Filed: Nov. 22, 2022

(65) Prior Publication Data
US 2023/0280869 A1 Sep. 7, 2023

(30) Foreign Application Priority Data
Feb. 22, 2022 (KR) .................. 10-2022-0023184

(51) Int. Cl.
*G06F 3/044* (2006.01)
*H03H 11/12* (2006.01)
(Continued)

(52) U.S. Cl.
CPC ........... *G06F 3/044* (2013.01); *H03H 11/126* (2013.01); *H03H 19/004* (2013.01); *H04B 1/10* (2013.01)

(58) Field of Classification Search
CPC .. G06F 3/044; G06F 3/04166; G06F 3/04182; G06F 3/0445; G06F 3/04;
(Continued)

(56) References Cited

U.S. PATENT DOCUMENTS 6,172,631 B1 * 1/2001 Tsai ...................... H03M 3/342
341/143
8,497,746 B2 7/2013 Visconti et al.
(Continued)

FOREIGN PATENT DOCUMENTS

| CN | 109450402 A | 3/2019 |
|---|---|---|
| KR | 102198854 B1 | 12/2020 |
| KR | 10-2324765 B1 | 11/2021 |

OTHER PUBLICATIONS

A. Baschirotto et al., BiCMOS Switched-Capacitor Linear-Phase Bandpass Filter for RDS applications, ESSCIRC '90: Sixteenth European Solid-State Circuits Conference, Sep. 19-21, 1990.
(Continued)

*Primary Examiner* — Hong Zhou
(74) *Attorney, Agent, or Firm* — CANTOR COLBURN LLP

(57) ABSTRACT

A sensor device includes: first sensors; second sensors which form capacitances with the first sensors; a sensor transmitter connected to the first sensors, where the sensor transmitter supplies driving signals to the first sensors; and a sensor receiver connected to the second sensors, where the sensor receiver receives sensing signals from the second sensors, and the sensor receiver includes a band pass filter which filters the sensing signals. The band pass filter includes: a first integrator including a first amplifier; a first high pass filter converter connected to a first input terminal, a second input terminal and a first output terminal of the first amplifier, where the first high pass filter converter time-divisionally provides N high pass filter conversion paths; and a first gain auxiliary component connected to the first input terminal and the first output terminal of the first amplifier while the first integrator performs an integral function.

20 Claims, 27 Drawing Sheets

(51) Int. Cl.
*H03H 19/00* (2006.01)
*H04B 1/10* (2006.01)

(58) Field of Classification Search
CPC .. H03H 11/126; H03H 19/004; H03H 7/0161; H03H 7/12; H03H 19/002; H03H 11/1217; H03H 17/0009; H04B 1/10; G01D 5/24
See application file for complete search history.

(56) References Cited

U.S. PATENT DOCUMENTS

| | | | | |
|---|---|---|---|---|
| 8,648,652 | B2* | 2/2014 | Masui | H03H 11/0427 |
| | | | | 327/552 |
| 9,374,063 | B1* | 6/2016 | Mak | H03B 5/1246 |
| 9,639,733 | B2 | 5/2017 | Kremin et al. | |
| 9,704,936 | B2 | 7/2017 | Chae et al. | |
| 9,898,149 | B2 | 2/2018 | Kang et al. | |
| 10,211,865 | B1* | 2/2019 | Miller | H03G 1/0088 |
| 2004/0149910 | A1* | 8/2004 | Hatatani | G01J 5/34 |
| | | | | 250/338.3 |
| 2008/0238902 | A1* | 10/2008 | Huang | G06F 1/3203 |
| | | | | 345/204 |
| 2017/0033759 | A1* | 2/2017 | Saigusa | H04B 1/10 |
| 2017/0075495 | A1* | 3/2017 | Roberson | G06F 3/0446 |
| 2021/0313401 | A1* | 10/2021 | Lee | G06F 3/04182 |

OTHER PUBLICATIONS

G. Palmisano et al., Performance comparisons of pseudo-N-path SC cells in filters with real operational amplifiers, IEEE International Symposium on Circuits and Systems (ISCAS), vol. 2, 1467-1470, May 8-11, 1989.

G. Palmisano et al., Simplified pseudo-N-path cells for z to -z/sup N/ transformed SC active filters, IEEE Transactions on Circuits and Systems, vol. 36, No. 3, 461-463, Mar. 1989.

Giovanni Chiappano et al., A Tunable Switched-Capacitor Programmable N-Path Tone Receiver and Generator, IEEE Journal of Solid-State Circuits. Vol. 23. No. 6, Dec. 1988.

Milad Darvishi, Active N-path Filters: Theory and Design, University of twente research information, Sep. 25, 2013, URL: https://research.utwente.nl/en/publications/active-n-path-filterstheory-and-design.

* cited by examiner

BAND PASS FILTER AND SENSOR DEVICE INCLUDING THE SAME

This application claims priority to Korean patent application No. 10-2022-0023184, filed on Feb. 22, 2022, and all the benefits accruing therefrom under 35 U.S.C. § 119, the content of which in its entirety is herein incorporated by reference.

BACKGROUND

1. Field

The disclosure generally relates to a band pass filter and a sensor device including the band pass filter.

2. Related Art

With the development of information technologies, the importance of a display device which is a connection medium between a user and information increases. Accordingly, display devices such as a liquid crystal display device and an organic light emitting display device are increasingly used in various fields.

A display device may include a display unit for displaying an image and a sensor unit for sensing an input of a user. The sensor unit may include a band pass filter for acquiring signals in a desired frequency band from sensing signals.

SUMMARY

In general, a band pass filter has parameters including a center frequency, a Q-factor, a gain, and the like, which are dependently determined based on numerical values of a resistor and a capacitor. It may be difficult to set accurate parameters of the band pass filter due to mismatch between the resistor and the capacitor (e.g., Q-factor fluctuation).

In addition, the band pass filter may include a plurality of amplifies including an amplifier for implementing a buffer, an amplifier for implementing a variable gain, and the like.

Embodiments provide a band pass filter and a sensor device including the band pass filter, in which parameters may be determined based on a capacitance ratio of capacitors, such that the band pass filter may be implemented with a single amplifier without any mismatch between the resistor and the capacitor.

In accordance with an embodiment of the disclosure, a sensor device includes: first sensors; second sensors which form capacitances with the first sensors; a sensor transmitter connected to the first sensors, where the sensor transmitter supplies driving signals to the first sensors; and a sensor receiver connected to the second sensors, where the sensor receiver receives sensing signals from the second sensors, and the sensor receiver includes a band pass filter which filters the sensing signals. In such an embodiment, the band pass filter includes: a first integrator including a first amplifier; a first high pass filter converter connected to a first input terminal, a second input terminal and a first output terminal of the first amplifier, where the first high pass filter converter time-divisionally provides N (N is an integer greater than 1) high pass filter conversion paths; and a first gain auxiliary component connected to the first input terminal and the first output terminal of the first amplifier while the first integrator performs an integral function.

In an embodiment, the N high pass filter conversion paths may include a first high pass filter conversion path. In such an embodiment, a cycle in which the first integrator performs the integral function may be shorter than a cycle in which the first high pass filter conversion path is provided.

In an embodiment, the cycle in which the first integrator performs the integral function may be 1/N of the cycle in which the first high pass filter conversion path is provided.

In an embodiment, the first integrator may include a first input capacitor and a first integration capacitor. In such an embodiment, while the first integrator performs the integral function, the first input capacitor may be connected between a first input terminal of the band pass filter and the first input terminal of the first amplifier, and the first integration capacitor may be connected between the first input terminal and the first output terminal of the first amplifier.

In an embodiment, the first high pass filter converter may include N conversion capacitors corresponding to the N high pass filter conversion paths. In such an embodiment, capacitances of the N conversion capacitors and a capacitance of the first integration capacitor may be the same as each other.

In an embodiment, the first gain auxiliary component may include an auxiliary capacitor. In such an embodiment, a capacitance of the auxiliary capacitor and the capacitance of the first integration capacitor may be different from each other.

In an embodiment, the band pass filter may further include: a second high pass filter converter connected to the first input terminal, the second input terminal and a second output terminal of the first amplifier, where the second high pass filter may time-divisionally provide M (M is an integer greater than 1) high pass filter conversion paths; and a second gain auxiliary component connected to the second input terminal and the second output terminal of the first amplifier while the first integrator performs an integral function.

In an embodiment, N and M may be the same as each other.

In an embodiment, the band pass filter may further include: a second integrator including a second amplifier; a third high pass filter converter connected to a first input terminal, a second input terminal and a first output terminal of the second amplifier, where the third high pass filter converter may time-divisionally provide P (P is an integer greater than 1) high pass filter conversion paths; and a fourth high pass filter converter connected to the first input terminal, the second input terminal, and a second output terminal of the second amplifier, where the fourth high pass filter converter may time-divisionally provide Q (Q is an integer greater than 1) high pass filter conversion paths. In such an embodiment, t P and Q may be the same as each other.

In an embodiment, the band pass filter may further include: a third integrator including a third amplifier; a fifth high pass filter converter connected to a first input terminal, a second input terminal and a first output terminal of the third amplifier, where the fifth high pass filter converter may time-divisionally provide S (S is an integer greater than 1) high pass filter conversion paths; a third gain auxiliary component connected to the first input terminal and the first output terminal of the third amplifier while the third integrator performs an integral function; a sixth high pass filter converter connected to the first input terminal, the second input terminal and a second output terminal of the third amplifier, where the sixth high pass filter converter may time-divisionally provide T (T is an integer greater than 1) high pass filter conversion paths; and a fourth gain auxiliary component connected to the second input terminal and the second output terminal of the third amplifier while the third integrator performs the integral function. In such an embodiment, S and T may be the same as each other.

In an embodiment, The first high pass filter converter may include: a first conversion capacitor; a second conversion capacitor; a first switch connected between the first input terminal of the first amplifier and a first electrode of the first conversion capacitor; a second switch connected between the second input terminal of the first amplifier and a first electrode of the second conversion capacitor; a third switch including a first terminal connected to a second electrode of the first conversion capacitor; a fourth switch including a first terminal connected to a second electrode of the second conversion capacitor; a fifth switch connected between the first output terminal of the first amplifier and a second terminal of the third switch; and a sixth switch connected between a second terminal of the fourth switch and a reference power source.

In an embodiment, the first integrator may include: a first integration capacitor including a first electrode connected to the first input terminal of the first amplifier; a seventh switch connected between a second electrode of the first integration capacitor and the first output terminal of the first amplifier; an eighth switch connected between the second electrode of the first integration capacitor and the reference power source; a first input capacitor; a ninth switch connected between the first input terminal of the band pass filter and a first electrode of the first input capacitor; a tenth switch connected between a second electrode of the first input capacitor and the first input terminal of the first amplifier; an eleventh switch connected between the first electrode of the first input capacitor and the reference power source; a twelfth switch connected between the second electrode of the first input capacitor and the reference power source; a thirteenth switch connected between the first output terminal of the first amplifier and a first output terminal of the band pass filter; and a fourteenth switch connected between the first output terminal of the band pass filter and the reference power source.

In an embodiment, the first integrator may further include: a second input capacitor; a fifteenth switch connected between a second input terminal of the band pass filter and a first electrode of the second input capacitor; a sixteenth switch connected between a second electrode of the second input capacitor and the second input terminal of the first amplifier; a seventeenth switch connected between the first electrode of the second input capacitor and the reference power source; an eighteenth switch connected between the second electrode of the second input capacitor and the reference power source; a nineteenth switch connected between the second output terminal of the first amplifier and a second output terminal of the band pass filter; a twentieth switch connected between the second output terminal of the band pass filter and the reference power source; a second integration capacitor including a first electrode connected to the second input terminal of the first amplifier; a twenty-first switch connected between a second electrode of the second integration capacitor and the second output terminal of the first amplifier; and a twenty-second switch connected between the second electrode of the second integration capacitor and the reference power source.

In an embodiment, the second high pass filter converter may include: a third conversion capacitor; a fourth conversion capacitor; a twenty-third switch connected between the second input terminal of the first amplifier and a first electrode of the third conversion capacitor; a twenty-fourth switch connected between the first input terminal of the first amplifier and a first electrode of the fourth conversion capacitor; a twenty-fifth switch including a first terminal connected to a second electrode of the third conversion capacitor; a twenty-sixth switch including a first terminal connected to a second electrode of the fourth conversion capacitor; a twenty-seventh switch connected between the second output terminal of the first amplifier and a second terminal of the twenty-fifth switch; and a twenty-eighth switch connected between a second terminal of the twenty-sixth switch and the reference power source.

In an embodiment, the first gain auxiliary component may include a first auxiliary capacitor connected between the second electrode of the first input capacitor and the first output terminal of the band pass filter.

In an embodiment, the second gain auxiliary component may include a second auxiliary capacitor connected between the second electrode of the second input capacitor and the second output terminal of the band pass filter.

In accordance with an embodiment of the disclosure, a band pass filter includes: a first integrator including a first amplifier; a first high pass filter converter connected to a first input terminal, a second input terminal and a first output terminal of the first amplifier, where the first high pass filter converter time-divisionally provides N (N is an integer greater than 1) high pass filter conversion paths; and a first gain auxiliary component connected to the first input terminal and the first output terminal of the first amplifier while the first amplifier performs an integral function.

In an embodiment, the band pass filter may further include: a second high pass filter converter connected to the first input terminal, the second input terminal and a second output terminal of the first amplifier, where the second high pass filter converter may time-divisionally provide M (M is an integer greater than 1) high pass filter conversion paths; and a second gain auxiliary component connected to the second input terminal and the second output terminal of the first amplifier while the first amplifier performs the integral function.

In an embodiment, the band pass filter may further include: a second integrator including a second amplifier; a third high pass filter converter connected to a first input terminal, a second input terminal and a first output terminal of the second amplifier, where the third high pass filter converter may time-divisionally provide P (P is an integer greater than 1) high pass filter conversion paths; and a fourth high pass filter converter connected to the first input terminal, the second input terminal and a second output terminal of the second amplifier, where the fourth high pass filter converter may time-divisionally provide Q (Q is an integer greater than 1) high pass filter conversion paths. In such an embodiment, P and Q may be the same as each other.

In an embodiment, the band pass filter may further include: a third integrator including a third amplifier; a fifth high pass filter converter connected to a first input terminal, a second input terminal and a first output terminal of the third amplifier, where the fifth high pass filter converter may time-divisionally provide S (S is an integer greater than 1) high pass filter conversion paths; a third gain auxiliary component connected to the first input terminal and the first output terminal of the third amplifier while the third integrator performs an integral function; a sixth high pass filter converter connected to the first input terminal, the second input terminal and a second output terminal of the third amplifier, where the sixth high pass filter converter may time-divisionally provide T (T is an integer greater than 1) high pass filter conversion paths; and a fourth gain auxiliary component connected to the second input terminal and the second output terminal of the third amplifier while the third amplifier performs the integral function. In such an embodiment, S and T may be the same as each other.

BRIEF DESCRIPTION OF THE DRAWINGS

The above and other features of the invention will become more apparent by describing in further detail embodiments thereof with reference to the accompanying drawings, in which.

DETAILED DESCRIPTION

Figure 1:
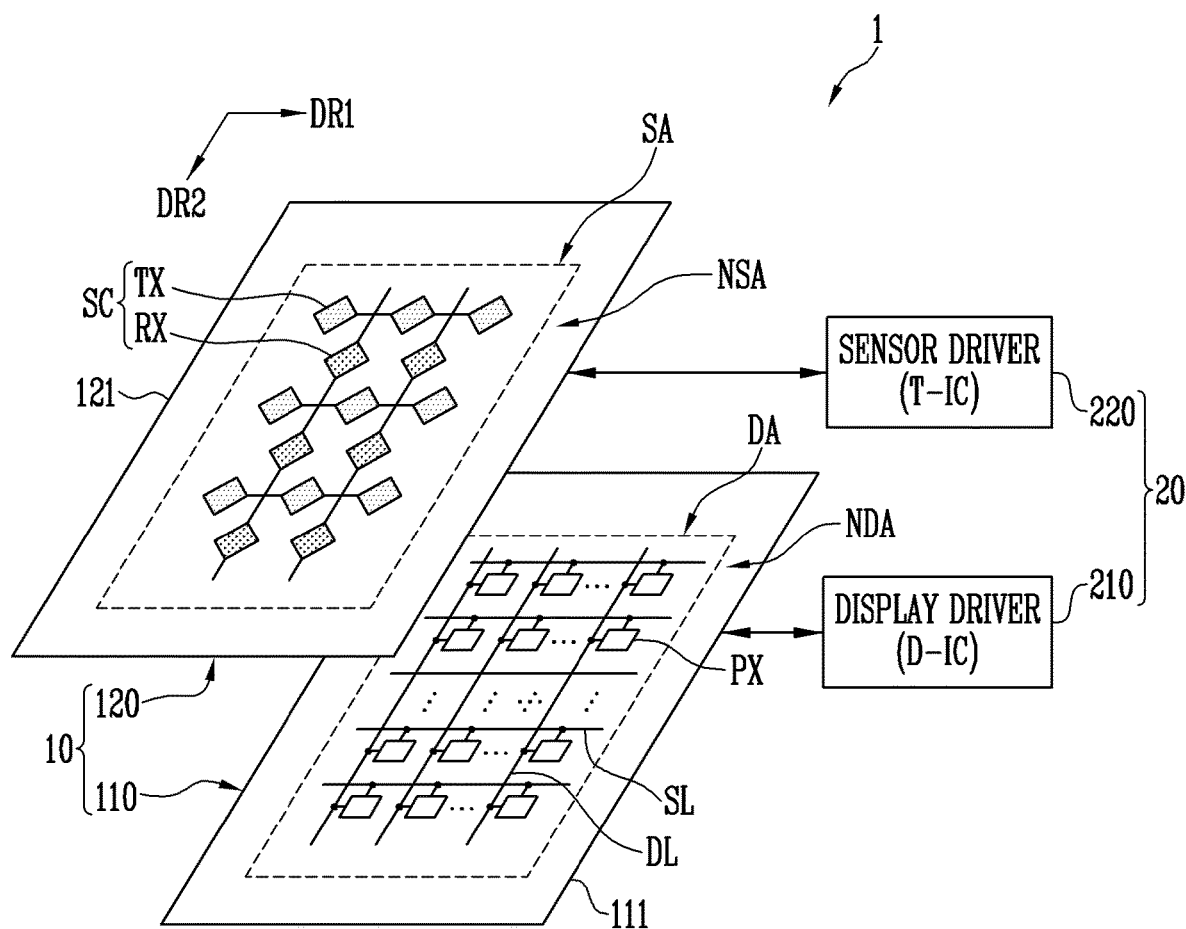
FIGS. 1 and 2 are diagrams illustrating a display device in accordance with an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

In description, the expression "equal" may mean "substantially equal." That is, this may mean equality to a degree to which those skilled in the art can understand the equality. Other expressions may be expressions in which "substantially" is omitted.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 2:
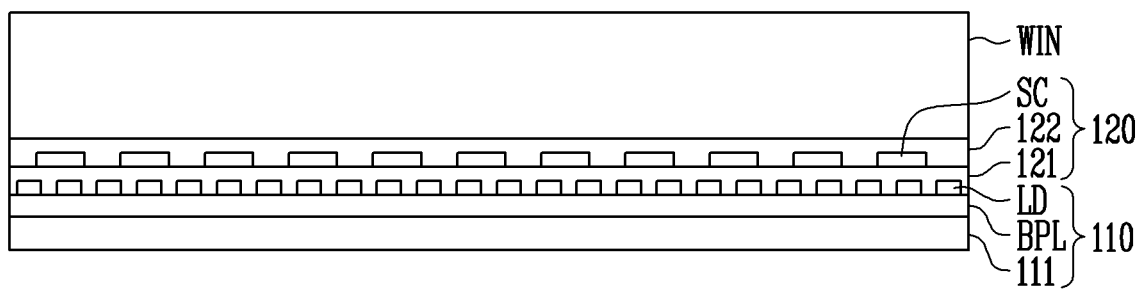

FIGS. 1 and 2 are diagrams illustrating a display device in accordance with an embodiment of the disclosure.

Referring to FIG. 1, the display device 1 in accordance with an embodiment of the disclosure may include a panel 10 and a driving circuit 20 for driving the panel 10.

In an embodiment, the panel 10 may include a display unit 110 for displaying an image and a sensor unit 120 for sensing a touch, a pressure, a fingerprint, hovering, etc. In an embodiment, the display unit 110 may include pixels PX and the sensor unit 120 may include sensors SC overlapping at least some of the pixels PX. In an embodiment, the sensors SC may include first sensors TX and second sensors RX. In an alternative embodiment (e.g., a self-capacitance type), the sensors SC may be configured with one kind of sensors without distinguishing the first and second sensors from each other. The driving circuit 20 may include a display driver 210 for driving the display unit 110 and a sensor driver 220 for driving the sensor unit 120. For example, the pixels PX may display an image based on a display frame period as a unit. For example, the sensors SC may sense an input of a user by using a sensing frame period as a unit. The sensing frame period and the display frame period may be independent from each other or be different from each other. The sensing frame period and the display frame period may be synchronized with each other or be unsynchronized with each other.

In some embodiments, after the display unit 110 and the sensor unit 120 are manufactured separately from each other, the display unit 110 and the sensor unit 120 may be disposed and/or coupled to overlap with each other in at least one area. Alternatively, the display unit 110 and the sensor unit 120 may be integrally manufactured with each other. For example, the sensor unit 120 may be formed directly on at least one substrate (e.g., an upper substrate and/or a lower substrate of a display panel, or a thin film encapsulation layer), or another insulating layer or one of various types of functional layers (e.g., an optical layer or a protective layer), which constitutes the display unit 110.

in an embodiment, as illustrated in FIG. 1, the sensor unit 120 may be disposed on a front surface (e.g., an upper surface on which an image is displayed) of the display unit 110, but the position of the sensor unit 120 is not limited thereto. For example, in an alternative embodiment, the sensor unit 120 may be disposed on a rear surface or both of the front and rear surfaces of the display unit 110. In another alternative embodiment, the sensor unit 120 may be disposed in at least one edge area of the display unit 110.

The display unit 110 may include a display substrate 111 and a plurality of pixels PX formed on the display substrate 111. The pixels PX may be disposed in a display area DA of the display substrate 111.

The display substrate 111 may include the display area DA in which an image is displayed and a non-display area NDA at the periphery of the display area DA. In some embodiments, the display area DA may be disposed in a central area of the display unit 110, and the non-display area NDA is disposed in an edge area of the display unit 110 to surround the display area DA.

The display substrate 111 may be a rigid substrate ora flexible substrate, and the material or property of the display substrate 111 is not particularly limited. For example, the display substrate 111 may be a rigid substrate including or made of glass or tempered glass, or a flexible substrate configured with or defined by a thin film including or made of plastic or metal.

Scan lines SL and data lines DL, and the pixels PX connected to the scan lines SL and the data lines DL are disposed in the display area DA. Pixels PX are selected by a scan signal having a turn-on level, which is supplied from the scan lines SL, to be supplied with a data signal from the data lines DL, and emit light with a luminance corresponding to the data signal. Accordingly, an image corresponding to the data signal is displayed in the display area DA. In embodiments of the disclosure, the structure, driving method, and the like of the pixels PX are not particularly limited. For example, each of the pixels PX may be implemented as a pixel having various structures and/or various driving methods, which are currently known in the art.

Various types of lines and/or a built-in circuit, which are connected to the pixels PX of the display area DA, may be disposed in the non-display area NDA. In an embodiment, a plurality of lines for supplying various power sources and various control signals to the display area DA may be disposed in the non-display area NDA. In addition, a scan driver and the like may be further disposed in the non-display area NDA.

In embodiments of the disclosure, the kind of the display unit 110 is not particularly limited. For example, an embodiment of the display unit 110 may be implemented as a self-luminescent display panel such as an organic light emitting display panel. In such an embodiment, where the display unit 110 is implemented as a self-luminescent display panel, each pixel may not be limited to a case where the pixel includes only an organic light emitting element. For example, a light emitting element of each pixel may be configured as an organic light emitting diode, an inorganic light emitting diode or a quantum dot/well light emitting diode, etc. A plurality of light emitting elements may be provided in each pixel. The plurality of light emitting elements may be connected to each other in series, parallel, series/parallel, etc. Alternatively, the display unit 110 may be implemented as a non-light emitting display panel such as a liquid crystal display panel. In an embodiment where the display unit 110 is implemented as a non-light emitting display panel, the display device 1 may additionally include a light source such as a back-light unit.

The sensor unit 120 may include a sensor substrate 121 and a plurality of sensors SC formed on the sensor substrate 121. The sensors SC may be disposed in a sensing area SA on the sensor substrate 121.

The sensor substrate 121 may include the sensing area SA capable of sensing a touch input or the like and a peripheral area NSA at the periphery of the sensing area SA. In some embodiments, the sensing area SA may be disposed to overlap with at least one area of the display area DA. In an embodiment, the sensing area SA may be set as an area corresponding to the display area DA (e.g., an area overlapping with the display area DA), and the peripheral area NSA may be set as an area corresponding to the non-display area NDA (e.g., an area overlapping with the non-display area NDA). In an embodiment where a touch input or the like is provided on the display area DA, the touch input may be detected through the sensor unit 120.

The sensor substrate 121 may be a rigid or flexible substrate. In addition, the sensor substrate 121 may be configured with at least one insulating layer. Also, the sensor substrate 121 may be a transparent or translucent light transmission substrate, but the disclosure is not limited thereto. That is, in embodiments of the disclosure, the material and property of the sensor substrate 121 are not particularly limited. For example, an embodiment of the sensor substrate 121 may be a rigid substrate configured with glass or tempered glass, or a flexible substrate configured with a thin film made of plastic or metal. In some embodiments, at least one substrate (e.g., the display substrate 111, an encapsulation substrate, and/or a thin film encapsulation layer) constituting the display unit 110 or, at least one insulating layer or at least one functional layer, disposed at the inside and/or an outer surface of the display 110 may be used as the sensor substrate 121.

The sensing area SA is set as an area capable of reacting with a touch input (i.e., an active area of sensors). In such an embodiment, sensors SC for sensing a touch input or the like may be disposed in the sensing area SA. In some embodiments, the sensors SC may include first sensors TX and second sensors RX.

In such embodiments, for example, each of the first sensors TX may extend in a first direction DR1. The first sensors TX may be arranged in a second direction DR2. The second direction DR2 may be different from the first direction DR1. For example, the second direction DR2 may be a direction orthogonal to the first direction DR1. In an alternative embodiment, the extending direction and arrangement direction of the first sensors TX may be variously modified based on another conventional configuration. Each of the first sensors TX may have a form in which first cells having a relatively wide area and first bridges having a relatively narrow area are connected to each other. Although an embodiment where each of the first cells has a diamond shape is illustrated in FIG. 1, each of the first cells may be configured in various conventional shapes including a circular shape, a quadrangular shape, a triangular shape, a mesh shape, and the like. For example, the first bridges may be integrally formed with the first cells in a same layer. In an alternative embodiment, the first bridges may be formed in a layer different from that of the first cells, to electrically connect adjacent first cells to each other.

For example, each of the second sensors RX may extend in the second direction DR2. The second sensors RX may be arranged in the first direction DR1. In an alternative embodiment, the extending direction and arrangement direction of the second sensors RX may be variously modified based on another conventional configuration. Each of the second sensors RX may have a form in which second cells having a relatively wide area and second bridges having a relatively narrow area are connected to each other. Although an embodiment where each of the second cells has a diamond shape is illustrated in FIG. 1, each of the first cells may be configured in various conventional shapes including a circular shape, a quadrangular shape, a triangular shape, a mesh shape, and the like. For example, the second bridges may be integrally formed with the second cells in a same layer. In an alternative embodiment, the second bridges may be formed in a layer different from that of the second cells, to electrically connect adjacent second cells to each other.

In some embodiments, each of the first sensors TX and the second sensors RX may include at least one selected from a metal material, a transparent conductive material, and various other conductive materials, thereby having conductivity. In an embodiment, the first sensors TX and the second sensors RX may include at least one selected from various metal materials including gold (Au), silver (Ag), aluminum (Al), molybdenum (Mo), chromium (Cr), titanium (Ti), nickel (Ni), neodymium (Nd), copper (Cu), platinum (Pt), and the like, or alloys thereof. The first sensors TX and the second sensors RX may be configured in a mash shape. Also, the first sensors TX and the second sensors RX may include at least one selected from various transparent conductive materials including silver nano wire (AgNW), indium tin oxide (ITO), indium zinc oxide (IZO), indium gallium zinc oxide (IGZO), antimony zinc oxide (AZO), indium tin zinc oxide (ITZO), zinc oxide (ZnO), tin oxide ($SnO_2$), carbon nano tube, graphene, and the like. In addition, the first sensors TX and the second sensors RX may include at least one selected from various conductive materials, thereby having conductivity. Also, each of the first sensors TX and the second sensors RX may be configured as or defined by a single layer or a multi-layer, and its sectional structure is not particularly limited.

In an embodiment, sensor lines for electrically connecting the sensors SC to the sensor driver 220, and the like may be concentrically disposed in the peripheral area NSA.

The driving circuit 20 may include the display driver 210 for driving the display unit 110 and the sensor driver 220 for driving the sensor unit 120. In an embodiment, the display driver 210 and the sensor driver 220 may be configured as integrated chips (ICs) separate from each other. In an alternative embodiment, at least a portion of the display driver 210 and at least a portion of the sensor driver 220 may be integrated together in one IC.

The display driver 210 is electrically connected to the display unit 110 to drive the pixels PX. For example, the display device 210 may include a data driver and a timing controller, and a scan driver may be separately mounted in the non-display area NDA of the display unit 110. In an alternative embodiment, the display driver 210 may include the whole or at least a portion of the data driver, the timing controller, and the scan driver. In another alternative embodiment, the display driver 210 may correspond to at least one selected from a graphic processing unit (GPU), a central processing unit (CPU), an application processor (AP), and the like. In another alternative embodiment, the display driver 210 may be one indicating a set of the timing controller and at least one selected from the GPU, the CPU and the AP.

The sensor driver 220 is electrically connected to the sensor unit 120 to drive the sensor unit 120. The sensor driver 220 may include a sensor transmitter and a sensor receiver. In some embodiments, the sensor transmitter and the sensor receiver may be integrated in one IC, but the disclosure is not limited thereto.

Referring to FIG. 2, for example, the sensor unit 120 may be disposed on (or stacked on the top of) the display unit 110, and a window WIN may be disposed on the sensor unit 120.

The display unit 110 may include a display substrate 111, a circuit element layer BPL formed on the display substrate 111, and light emitting elements LD formed on the circuit element layer BPL. The circuit element layer BPL may include pixel circuits for driving light emitting elements LD of pixels PX, scan lines SL, data lines DL, and the like.

The sensor unit 120 may include a sensor substrate 121, sensors SC formed on the sensor substrate 121, and a protective layer 122 covering the sensors SC. In an embodiment, as shown in FIG. 2, the sensor substrate 121 may be in the form of an encapsulation layer covering the pixels PX. In an alternative embodiment, the sensor substrate 121 may be defined separately from the encapsulation layer covering the pixels PX.

The window WIN is a protective member disposed at the uppermost end of the module of the display device 1, and may be substantially a transparent light transmission substrate. The window WIN may have a multi-layered structure selected from a glass substrate, a plastic film, and a plastic substrate. The window WIN may include a rigid or flexible material, and the material constituting the window WIN is not particularly limited.

Although not shown in the drawing, the display device 1 may further include a polarizing plate (or another kind of anti-reflection layer) for preventing reflection of external light between the window WIN and the sensor unit 120.

Figure 3:
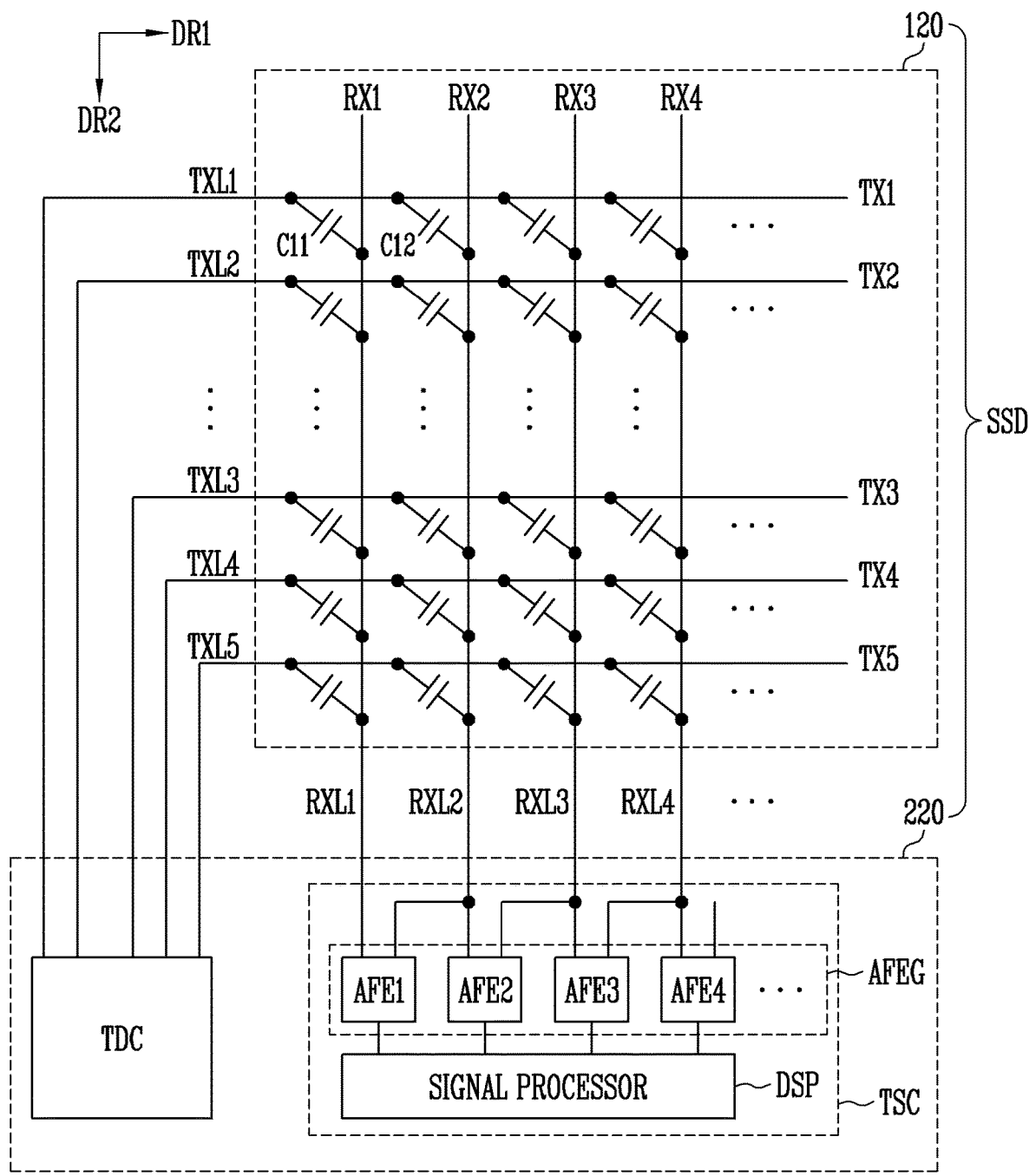
FIG. 3 is a diagram illustrating a sensor device in accordance with an embodiment of the disclosure.

FIG. 3 is a diagram illustrating a sensor device in accordance with an embodiment of the disclosure.

Referring to FIG. 3, the sensor device SDD in accordance with an embodiment of the disclosure may include a sensor unit 120 and a sensor driver 220. The sensor device SSD may be included in the display device 1. In an embodiment, the sensor device SSD may be configured as a separate independent product or module, regardless of the display device 1.

The sensor unit 120 may include first sensors TX1, TX2, TX3, TX4, and TX5 and second sensors RX1, RX2, RX3, and RX4. The first sensors TX1 to TX5 may extend in the first direction DR1, and be arranged in the second direction DR2. The second sensors RX1 to RX4 may extend in the second direction DR2, and be arranged in the first direction DR1. The second sensors RX1 to RX4 may intersect the first sensors TX1 to TX5. The first sensors TX1 to TX5 and the second sensors RX1 to RX4 may form a mutual capacitance. For example, a capacitance C11 may be formed between a first sensor TX1 and a second sensor RX1, and a capacitance C12 may be formed between the first sensor TX1 and a second sensor RX2. The sensor driver 220 may sense a change in the capacitances C11 and C12, thereby determining whether a touch of a user has been input, etc.

The sensor driver 220 may include a sensor transmitter TDC and a sensor receiver TSC. The sensor transmitter TDC may be connected to the first sensors TX1 to TX5, and supply driving signals to the first sensors TX1 to TX5. The sensor transmitter TDC may be connected to the first sensors TX1 to TX5 through first sensor lines TXL1, TXL2, TXL3, TXL4, and TXL5.

The sensor receiver TSC may be connected to the second sensors RX1 to RX4, and receive sensing signals from the second sensors RX1 to RX4. The sensor receiver TSC may be connected to the second sensors RX1 to RX4 through second sensor lines RXL1, RXL2, RXL3, and RXL4. The sensor receiver TSC may include an analog front end group AFEG and a signal processor DSP.

The analog front end group AFEG may include a plurality of analog front ends AFE1, AFE2, AFE3, and AFE4. Each of the analog front ends AFE1, AFE2, AFE3, and AFE4 may be connected to two adjacent second sensors among the second sensors RX1 to RX4. For example, a first analog front end AFE1 may be connected to the second sensor RX1 and the second sensor RX2. A second analog front end AFE2 may be connected to the second sensor RX2 and a second sensor RX3. A third analog front end AFE3 may be connected to the second sensor RX3 and the second sensor RX4. A fourth analog front end AFE4 may be connected to the second sensor RX4 and a second sensor (not shown). Each of the analog front ends AFE1, AFE2, AFE3, and AFE4 generates a digital signal from which a common noise is removed by using sensing signals of adjacent sensor sensors as differential signals, so that a signal to noise ratio (SNR) may be increased.

The signal processor DSP may calculate sensing values by using digital signals provided from the analog front end group AFEG. For example, a digital signal provided from the first analog front end AFE1 may correspond to a difference between a level (Iv2) of a sensing signal of the second sensor RX2 and a level (Iv1) of a sensing signal of the second sensor RX1 (i.e., Iv2−Iv1). A digital signal provided from the second analog front end AFE2 may correspond to a difference between a level (Iv3) of a sensing signal of the second sensor RX3 and the level (Iv2) of the sensing signal of the second sensor RX2 (i.e., Iv3−Iv2). A digital signal provided from the third analog front end AFE3 may correspond to a difference between a level (Iv4) of a sensing signal of the second sensor RX4 and the level (Iv3) of the sensing signal of the second sensor RX3 (i.e., Iv4−Iv3).

For example, the signal processor DSP may calculate a relative level (Iv2') of the sensing signal of the second sensor RX2, a relative level (Iv3') of the sensing signal of the second sensor RX3, and a relative level (Iv4') of the sensing signal of the second sensor RX4, by using the following Equation 1 to Equation 3.

$$Iv2'=Iv2-Iv1=(Iv2-Iv1) \qquad \text{Equation 1}$$

$$Iv3'=Iv3-Iv1=(Iv3-Iv2)+(Iv2-Iv1) \qquad \text{Equation 2}$$

$$Iv4'=Iv4-Iv1=(Iv4-Iv3)+(Iv3-Iv2)+(Iv2-Iv1) \qquad \text{Equation 3}$$

The signal processor DSP may determine whether a touch of a user has been input, etc. by using the levels (Iv2', Iv3', and Iv4') as sensing values, or transfer the sensing values to the display driver 210.

Figure 4:
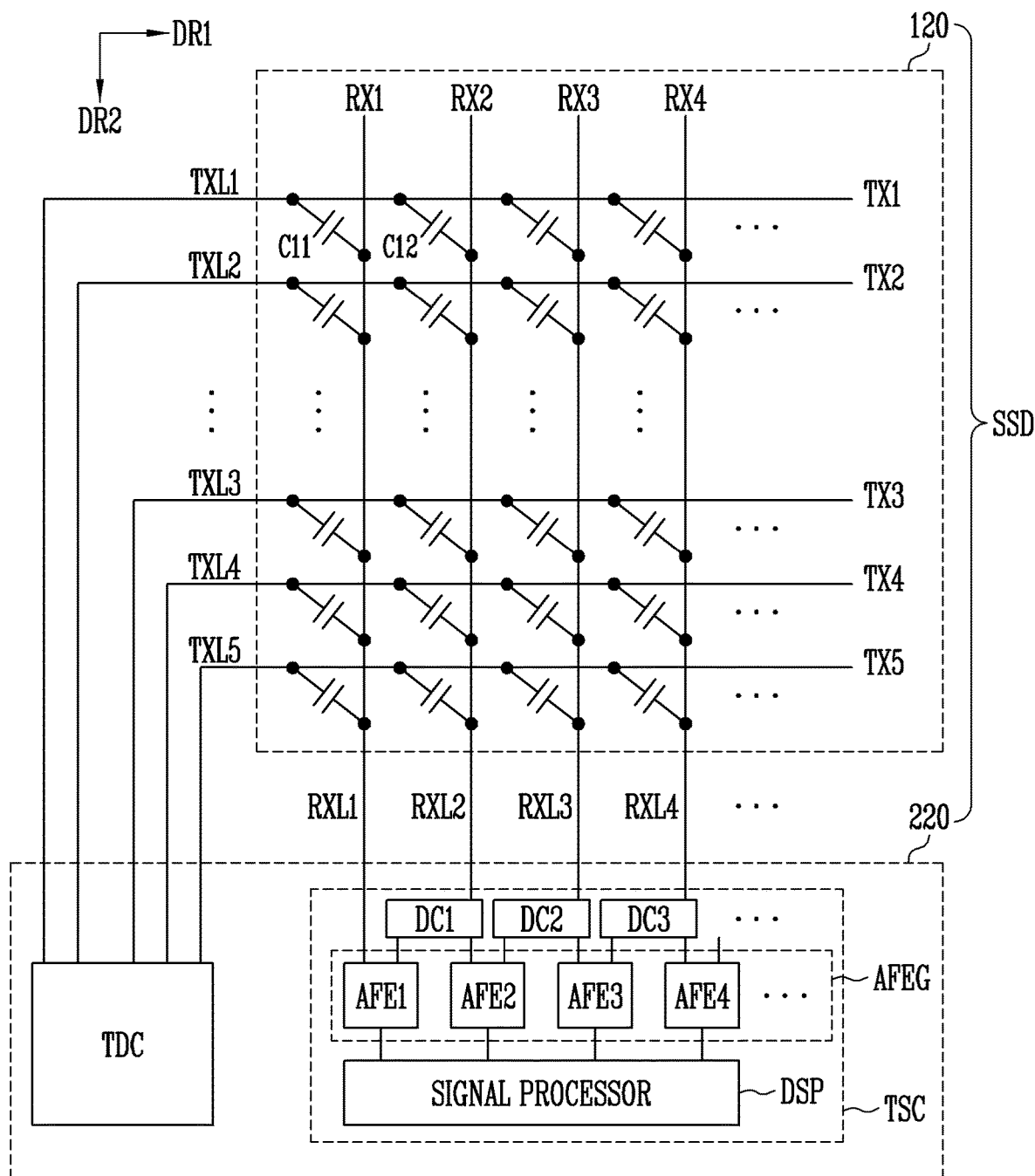
FIG. 4 is a diagram illustrating a sensor device in accordance with an alternative embodiment of the disclosure.

FIG. 4 is a diagram illustrating a sensor device in accordance with an alternative embodiment of the disclosure.

A sensor receiver TSC shown in FIG. 4 is substantially the same as the sensor receiver TSC shown in FIG. 3, except that the sensor receiver TSC shown in FIG. 4 further includes distribution circuits DC1, DC2, and DC3.

The distribution circuits DC1, DC2, and DC3 may be disposed between at least some of second sensors RX1 to RX4 and analog front ends AFE1 to AFE4, generate a plurality of signals having a same magnitude (e.g., a same voltage level or a same current amount) as each other, based on each of sensing signals provided from the at least some of the second sensors RX1 to RX4, and distribute the generated signals to the analog front ends AFE1 to AFE4. For example, the distribution circuits DC1, DC2, and DC3 may be configured to include an amplifier, a buffer, and the like, and amplify or mirror each of the sensing signals, thereby outputting the amplified or mirrored to sensing signal.

For example, a first distribution circuit DC1 may receive a second sensing signal provided from a second sensor RX2, and provide signals having a same magnitude as the second sensing signal respectively to a first analog front end AFE1 and a second analog front end AFE2. If the second sensing signal does not pass through the first distribution circuit DC1, the second sensing signal may be simultaneously supplied to the first analog front end AFE1 and the second analog front end AFE2. Therefore, a magnitude of the second sensing signal may be different from that of a first sensing signal received from a second sensor RX1 due to a relative increase in load with respect to the second sensing signal. For example, the magnitude of the second sensing signal may be smaller than that of the first sensing signal. Therefore, in such an embodiment, signals having a same magnitude as the second sensing signal may be respectively provided to the first analog front end AFE1 and the second analog front end AFE2 by using the first distribution circuit DC1.

In such an embodiment, a second distribution circuit DC2 may receive a third sensing signal provided from a second sensor RX3, and provide signals having the same magnitude as the third sensing signal respectively to the second analog front end AFE2 and a third analog front end AFE3. A third distribution circuit DC3 may receive a fourth sensing signal provided from a second sensor RX4, and provide signals having the same magnitude as the fourth sensing signal respectively to the third analog front end AFE3 and a fourth analog front end AFE4.

Figure 5:
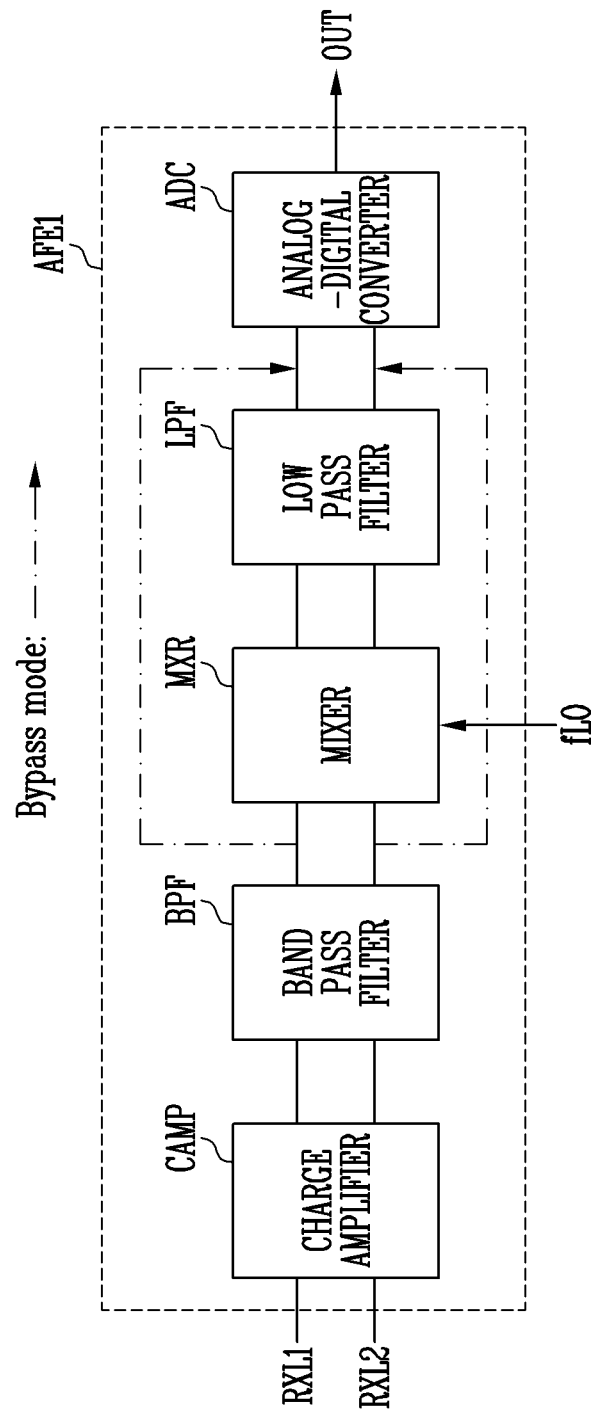
FIG. 5 is a diagram illustrating an analog front end in accordance with an embodiment of the disclosure.

FIG. 5 is a diagram illustrating an analog front end in accordance with an embodiment of the disclosure.

Referring to FIG. 5, a first analog front end AFE1a in accordance with an embodiment of the disclosure may include a charge amplifier CAMP, a band pass filter BPF, a mixer MXR, a low pass filter LPF, and an analog-digital converter ADC. The other analog front ends AFE2, AFE3, and AFE4 may have a same configuration as the first analog front end AFE1a, except for second sensors connected thereto, and therefore, any repetitive detailed descriptions thereof will be omitted (see FIGS. 3 and 4).

The charge amplifier CAMP may receive sensing signals from two sensors RX1 and RX2 among the second sensors RX1 to RX4. For example, a first input terminal (e.g., a non-inverting terminal) of the charge amplifier CAMP may be connected to the second sensor line RXL2, and a second input terminal (e.g., an inverting terminal) of the charge amplifier CAMP may be connected to the second sensor line RXL1. Therefore, the charge amplifier CAMP may output a signal corresponding to a difference of a level of a sensing signal of the second sensor RX2 and a level of a sensing signal of the second sensor RX1. The charge amplifier CAMP may be configured as a fully differential amplifier, to output the signal corresponding to the difference between the level of the sensing signal of the second sensor RX2 and the level of the sensing signal of the second sensor RX1 and an inverted signal thereof. In an embodiment, as shown in FIG. 5, two internal signal lines may be in parallel and the elements BPF, MXR, LPF, and ADC connected to an output terminal of the charge amplifier CAMP may have a specification with an input signal and an inverted input signal. Each of the elements BPF, MXR, LPF, and ADC may remove common mode noise by using the input signal and the inverted input signal.

However, in an alternative embodiment, the elements BPF, MXR, LPF, and ADC may be configured with a specification with only the input signal without the inverted input signal. In such an embodiment, the output terminal of the charge amplifier CAMP may be configured as a single-ended terminal, to output only the signal corresponding to the difference between the level of the sensing signal of the second sensor RX2 and the level of the sensing signal of the second sensor RX1. In such an embodiment, a single internal signal line may connect the charge amplifier CAMP and each of the elements BPF, MXR, LPF, and ADC to each other. Hereinafter, for convenience of description, embodiments where the charge amplifier CAMP outputs a signal and an inverting signal thereof will be described in detail.

The band pass filter BPF may be connected to the output terminal of the charge amplifier CAMP. The band pass filter BPF may filter sensing signals (or a difference signal of the sensing signals and an inverting signal thereof). The band pass filter BPF may filter an output signal of the charge amplifier CAMP to have a set frequency band. For example, a frequency band may be predetermined to include a frequency (or central frequency) of sensing signals, and noise components may be located at the outside of the frequency band. The central frequency of the sensing signals may be the same as that of driving signals.

The mixer MXR may mix an output signal of the band pass filter BPF and a local clock signal fLO. The mixer MXR may include frequency components corresponding to a difference and a sum of a frequency of the output signal of the band pass filter BPF and a frequency of the local clock signal fLO. For example, when the frequency of the output signal of the band pass filter BPF and the frequency of the local clock signal fLO are the same as each other, an output signal of the mixer MXR may include a frequency component having 0 Hz as the central frequency.

The low pass filter LPF may filter the output signal of the mixer MXR to have a set frequency band. The set frequency band of the low pass filter LPF may be lower than that of the band pass filter LPF. For example, the low pass filter LPF may allow only a signal of a low frequency band having 0 Hz as the central frequency in the output signal of the mixer MXR to pass therethrough. Accordingly, the low pass filter LPF may filter frequency components corresponding to noise.

The analog-digital converter ADC may convert an output of the low pass filter LPF into a digital signal OUT. Since the analog-digital converter ADC receives the signal of the low frequency band from the low pass filter LPF, the analog-digital converter ADC may operate at a small sampling rate, and the frequency of a clock signal may be low. Accordingly, in such an embodiment, the analog-digital converter ADC has desired features in terms of power cost and configuration cost.

The signal processor DSP may determine final sensing values by using a digital signal OUT output from each of the analog front ends AFE1, AFE2, AFE3, and AFE4 (see FIG. 3 and Equations 1 to 3).

However, when the sensor receiver is driven in a bypass mode, functions of the mixer MXR and the low pass filter LPF may be performed in a digital form in the signal processor DSP. An output of the band pass filter BPF may be directly transferred as an input of the analog-digital converter ADC.

FIGS. 6 to 9 are diagrams illustrating characteristics of a band pass filter implemented in various configurations.

Figure 6:
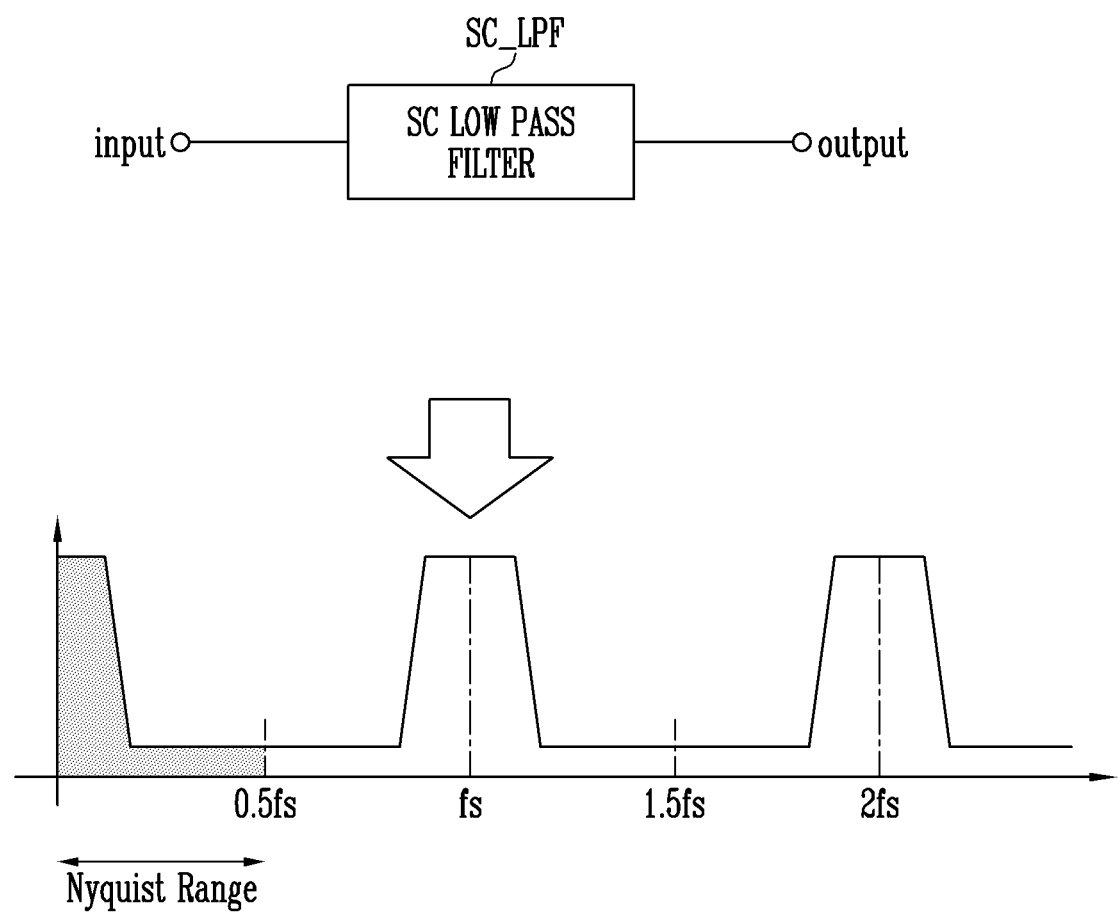
FIGS. 6 to 9 are diagrams illustrating characteristics of a band pass filter implemented in various configurations.

Referring to FIG. 6, a characteristic of a case where a band pass filter is implemented with (or defined by) a single switched-capacitor (SC) low pass filter SC_LPF is illustrated. The SC low pass filter SC_LPF may have a passband having 0 Hz as a central frequency. A maximum value (0.5 fs) of a Nyquist frequency of the SC low pass filter SC_LPF corresponds to ½ of a sampling frequency (fs) of the SC low pass filter SC_LPF as known well in the art.

Figure 7:
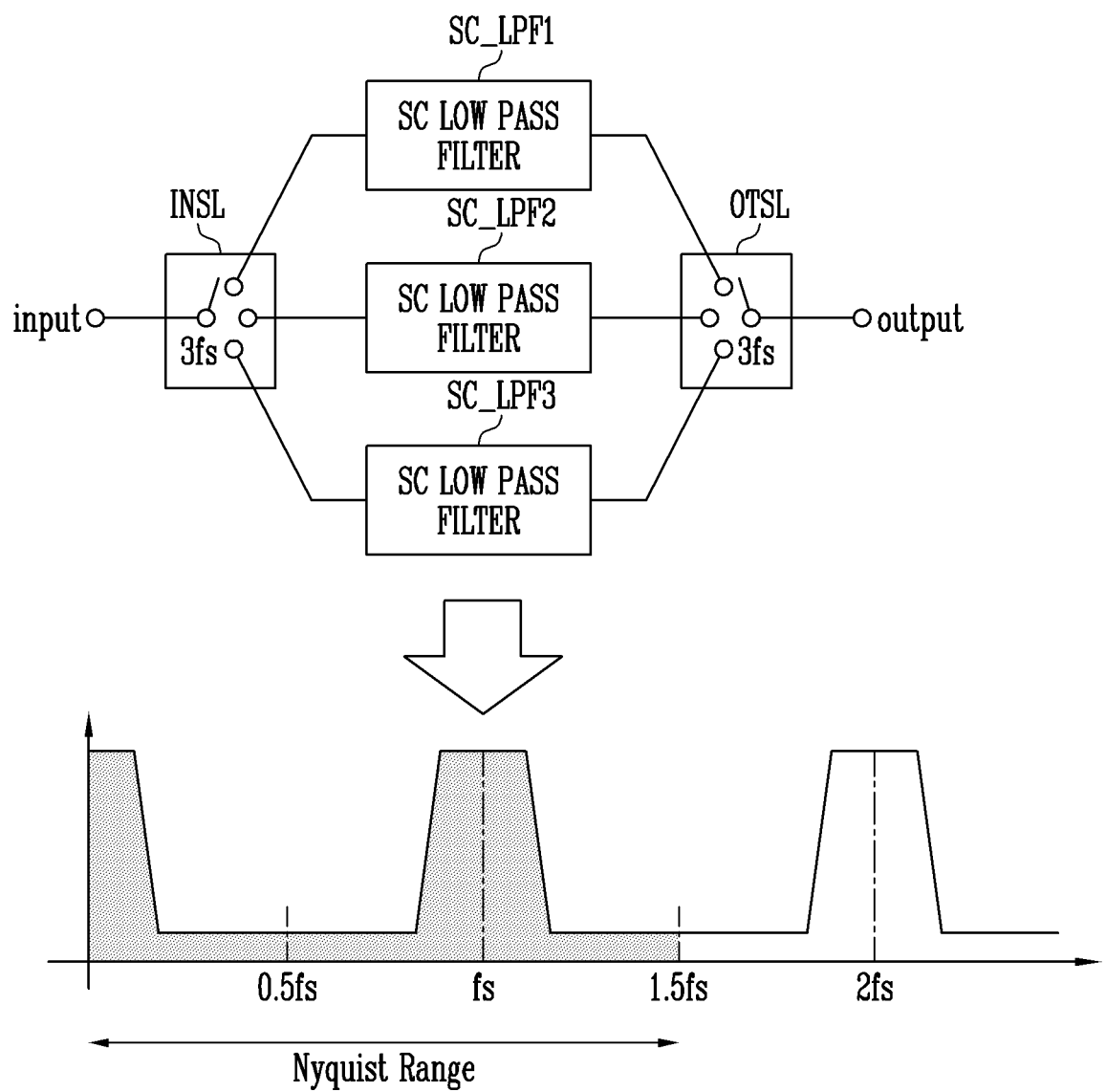

Referring to FIG. 7, when considering the Nyquist range frequency, a case where a band pass filter is implemented with three SC low pass filters SC_LPF1, SC_LPF2, and SC_LPF3 connected to each other in parallel is illustrated to implement a band pass filter having a passband with a central frequency (fs).

When considering a sampling frequency (fs) of each of the SC low pass filters SC_LPF1, SC_LPF2, and SC_LPF3, a frequency (3 fs) of an input switch INSL and a frequency (3 fs) of an output switch OTSL may become three times of the sampling frequency (fs). Although clock signals provided to the respective SC low pass filters SC_LPF1, SC_LPF2, and SC_LPF3 have a same sampling frequency (fs) as each other, phases of the clock signals provided to the respective SC low pass filters SC_LPF1, SC_LPF2, and SC_LPF3 may be different from one another.

Figure 8:
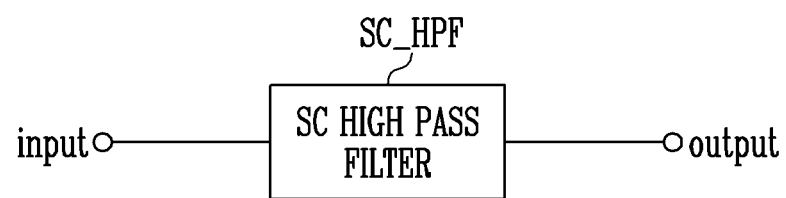
Figure 8:
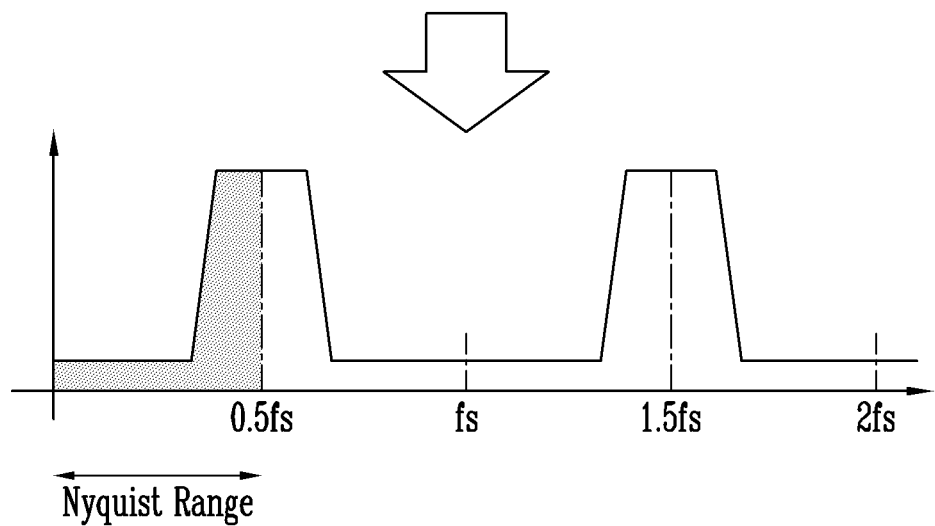

Referring to FIG. 8, a characteristic of a case where a band pass filter is implemented with a single SC high pass filter SC_HPF is illustrated. It is assumed that a sampling frequency (fs) of the SC high pass filter SC_HPF is fs equal to the sampling frequency (fs) of the above-described SC low pass filter SC_LPF. The SC high pass filter SC_HPF may have a passband having the maximum value (0.5 fs) of the Nyquist frequency as a central frequency.

Figure 9:
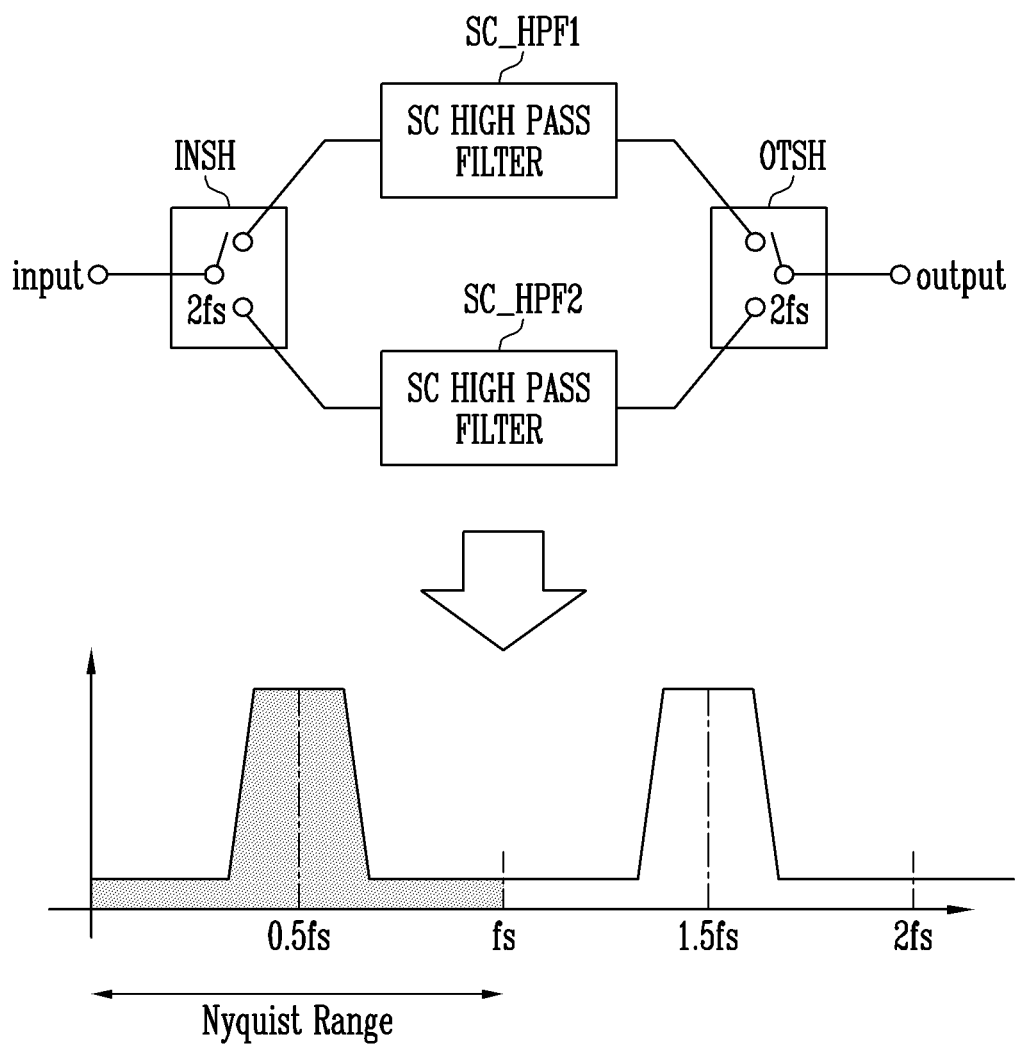

Referring to FIG. 9, when considering the Nyquist frequency, a case where a band pass filter is implemented with two SC high pass filters SC_HPF1 and SC_HPF2 connected to each other in parallel is illustrated to implement a band pass filter having a passband with a central frequency (0.5 fs).

When considering a sampling frequency (fs) of each of the SC high pass filters SC_HPF1 and SC_HPF2, a frequency (2 fs) of an input switch INSL and a frequency (2 fs) of an output switch OTSL may become double of the sampling frequency (fs). Although clock signals provided to the respective SC high pass filters SC_HPF1 and SC_HPF2 have a same sampling frequency (fs) as each other, the clock signals provided to the respective SC high pass filters SC_HPF1 and SC_HPF2 may have different phases from each other.

As shown in FIGS. 6 to 9, in embodiments where a band pass filter is implemented with the SC high pass filters SC_HPF1 and SC_HPF2, a number of filters therein is smaller than a number of filters in a case where a band pass filter is implemented with the SC low pass filters SC_LPF1, SC_LPF2, and SC_LPF3. For example, a band pass filter may be implemented with only two SC high pass filters SC_HPF1 and SC_HPF2. Hereinafter, embodiments of a band pass filter implemented with high pass filters which have this desired feature will be described.

Figure 10:
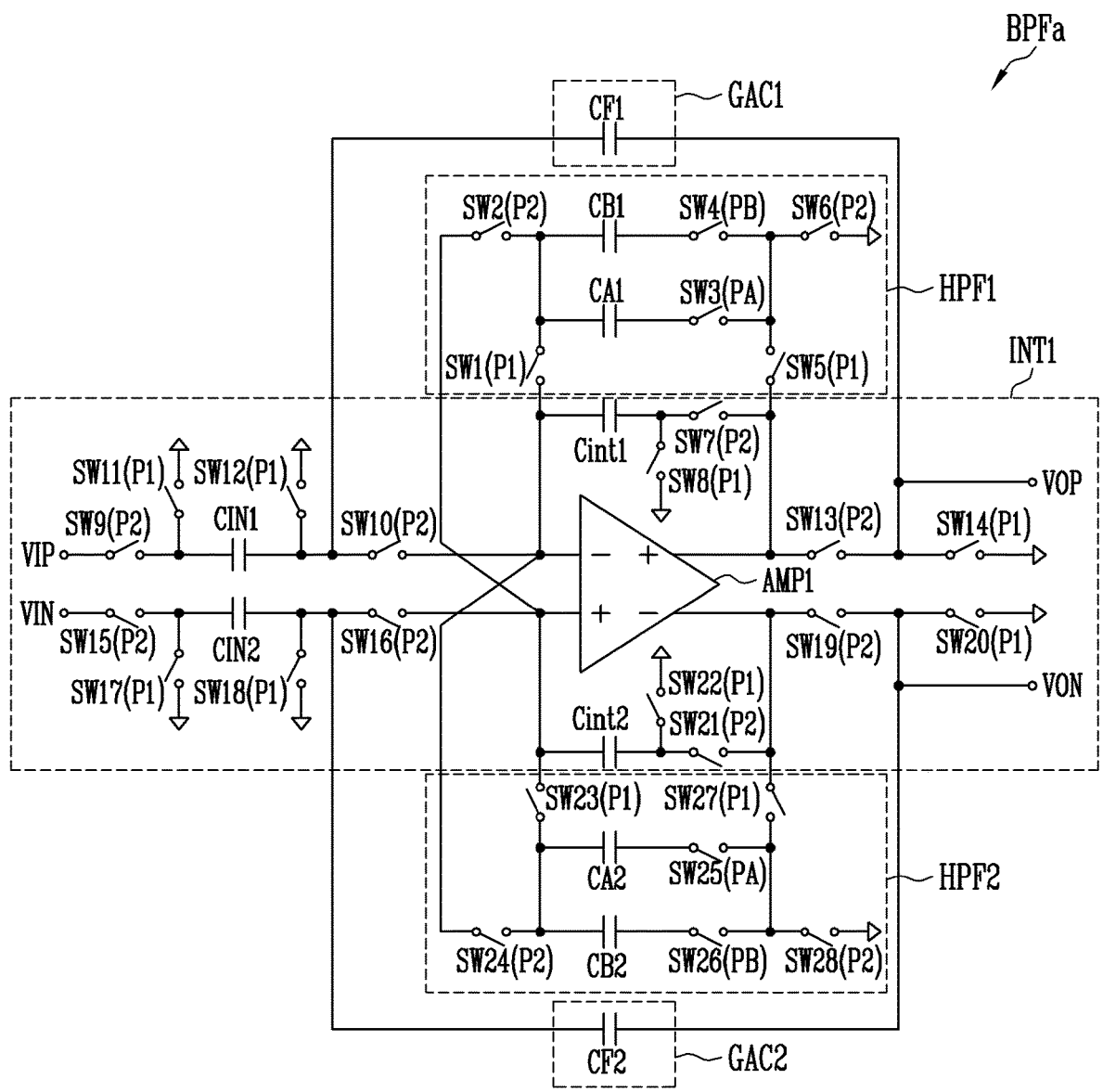
FIGS. 10 and 11 are diagrams illustrating a band pass filter in accordance with an embodiment of the disclosure.
Figure 11:
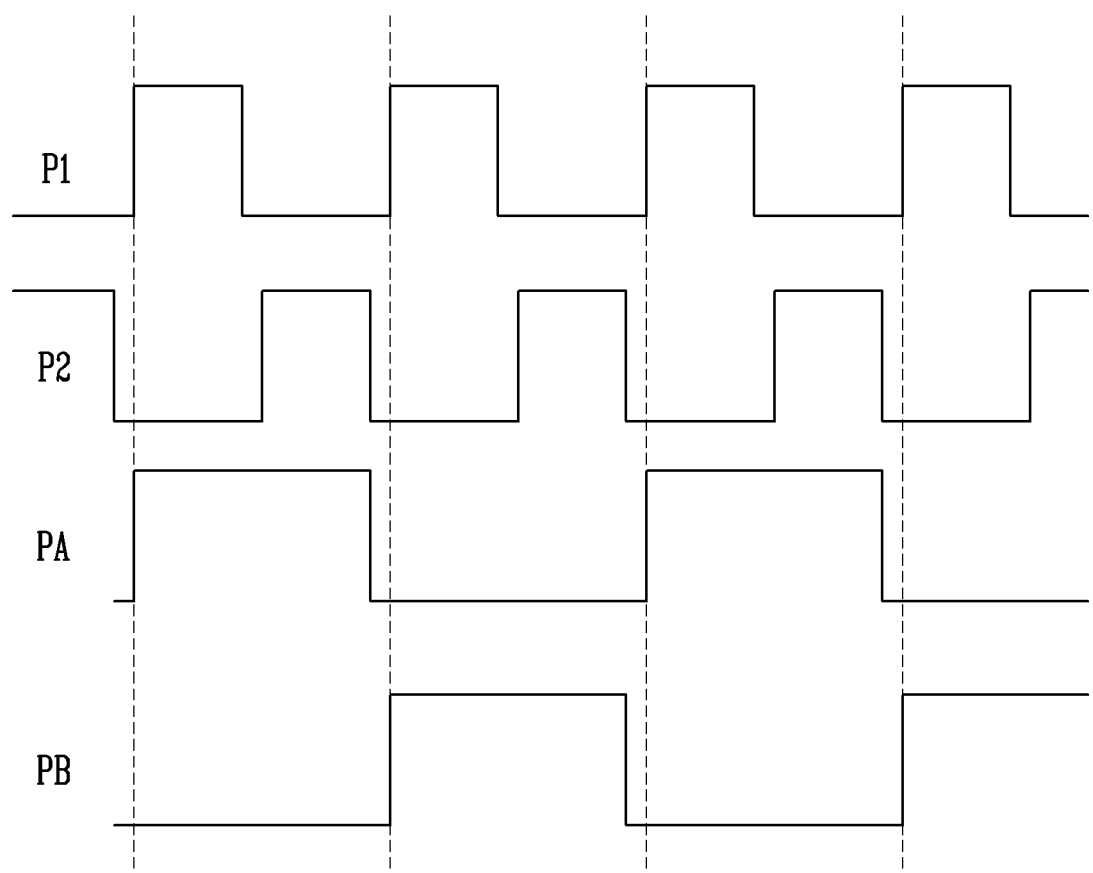

FIGS. 10 and 11 are diagrams illustrating a band pass filter in accordance with an embodiment of the disclosure.

Referring to FIG. 10, the band pass filter BPFa in accordance with an embodiment of the disclosure a first integrator INT1, a first high pass filter converter HPF1, a first gain auxiliary component GAC1, a second high pass filter converter HPF2, and a second gain auxiliary component GAC2.

The first integrator INT1 may include a first amplifier AMP1, a first input capacitor CIN1, a second input capacitor CIN2, a first integration capacitor Cint1, a second integration capacitor Cint2, and switches SW7 to SW22.

Output terminals of the first amplifier AMP1 may be configured as two fully differential amplifiers. A first electrode of the first integration capacitor Cint1 may be connected to a first input terminal (e.g., an inverting input terminal) of the first amplifier AMP1, and a second electrode of the first integration capacitor Cint1 may be connected to a first terminal of a seventh switch SW7. The seventh switch SW7 may be connected between the second electrode of the first integration capacitor Cint1 and a first output terminal (e.g., a non-inverting output terminal) of the first amplifier AMP1. An eighth switch SW8 may be connected between the second electrode of the first integration capacitor Cint1 and a reference power source (e.g., a ground).

A ninth switch SW9 may be connected between a first input terminal VIP of the band pass filter BPFa and a first electrode of the first input capacitor CIN1. The first input terminal VIP of the band pass filter BPFa may be a non-inverting input terminal. A tenth switch SW10 may be connected between a second electrode of the first input capacitor CIN1 and the first input terminal of the first amplifier AMP1. An eleventh switch SW11 may be connected between the first electrode of the first input capacitor CIN1 and the reference power source. A twelfth switch SW12 may be connected between the second electrode of the first input capacitor CIN1 and the reference power source.

A thirteenth switch SW13 may be connected between the first output terminal of the first amplifier AMP1 and a first output terminal VOP of the band pass filter BPFa. The first output terminal VOP of the band pass filter BPFa may be a non-inverting output terminal. A fourteenth switch SW14 may be connected between the first output terminal VOP of the band pass filter BPFa and the reference power source.

A fifteenth switch SW15 may be connected between a second input terminal VIN of the band pass filter BPFa and a first electrode of the second input capacitor CIN2. The second input terminal VIN of the band pass filter BPFa may be an inverting input terminal. A sixteenth switch SW16 may be connected between a second electrode of the second input capacitor CIN2 and a second input terminal of the first amplifier AMP1. The second input terminal of the first amplifier AMP1 may be a non-inverting input terminal. A seventeenth switch SW17 may be connected between the first electrode of the second input capacitor CIN2 and the reference power source. An eighteenth switch SW18 may be connected between the second electrode of the second input capacitor CIN2 and the reference power source.

A nineteenth switch SW19 may be connected between a second output terminal of the first amplifier AMP1 and a second output terminal VON of the band pass filter BPFa. The second output terminal of the first amplifier AMP1 may be an inverting output terminal. A twentieth switch SW20 may be connected between the second output terminal VON of the band pass filter BPFa and the reference power source.

A first electrode of the second integration capacitor Cint2 may be connected to the second input terminal of the first amplifier AMP1. A twenty-first switch SW21 may be connected between a second electrode of the second integration capacitor Cint2 and the second output terminal of the first amplifier AMP1. A twenty-second switch SW22 may be connected between the second electrode of the second integration capacitor Cint2 and the reference power source.

The first high pass filter converter HPF1 may include a first conversion capacitor CA1, a second conversion capacitor CB1, and switches SW1 to SW6. The first high pass filter converter HPF1 may be connected to the first input terminal, the second input terminal, and the first output terminal of the first amplifier AMP1.

A first switch SW1 may connect the first input terminal of the first amplifier AMP1 and a first electrode of the first conversion capacitor CA1 to each other. A second switch SW2 may connect the second input terminal of the first amplifier AMP1 and a first electrode of the second conversion capacitor CB1. A first terminal of a third switch SW3 may be connected to a second electrode of the first conversion capacitor CA1. A fourth switch SW4 may be connected to a second electrode of the second conversion capacitor CB1. A fifth switch SW5 may be connected between the first output terminal of the first amplifier AMP1 and a second terminal of the third switch SW3. A sixth switch SW6 may be connected between a second terminal of the fourth switch SW4 and the reference power source.

The first gain auxiliary component GAC1 may include a first auxiliary capacitor CF1. The first auxiliary capacitor CF1 may be connected between the second electrode of the first input capacitor CIN1 and the first output terminal VOP of the band pass filter BPFa.

The second high pass filter converter HPF2 may be connected to the first input terminal, the second input terminal, and the second output terminal of the first amplifier AMP1. The second high pass filter converter HPF2 may include a third conversion capacitor CA2, a fourth conversion capacitor CB2, and switches SW23 to SW28. A twenty-third switch SW23 may connect the second input terminal of the first amplifier AMP1 and a first electrode of the third conversion capacitor CA2 to each other. A twenty-fourth switch SW24 may connect the first input terminal of the first amplifier AMP1 and a first electrode of the fourth conversion capacitor CB2. A first terminal of a twenty-fifth switch SW25 may be connected to a second electrode of the third conversion capacitor CA2. A first terminal of a twenty-sixth switch SW26 may be connected to a second electrode of the fourth conversion capacitor CB2. A twenty-seventh switch SW27 may be connected between the second output terminal of the first amplifier AMP1 and a second terminal of the twenty-fifth switch SW25. A twenty-eighth switch SW28 may be connected between a second terminal of the twenty-sixth switch SW26 and the reference power source.

The second gain auxiliary component GAC2 may include a second auxiliary capacitor CF2. The second auxiliary capacitor CF2 may be connected between the second electrode of the second input capacitor CIN2 and the second output terminal VON of the band pass filter BPFa.

Referring to FIG. 11, a control timing of the switches SW1 to SW28 is exemplarily illustrated.

The switches SW1, SW5, SW8, SW11, SW12, SW14, SW17, SW18, SW20, SW22, SW23, and SW27 may be turned on when a first control signal P1 is received. For example, that "the first control signal P1 is received" may mean that the first control signal P1 having a logic high level is received.

The switches SW2, SVV7, SW9, SW10, SW13, SW15, SW16, SW19, SW21, SW24, and SW28 may be turned on when a second control signal P2 is received. For example, that "the second control signal P2 is received" may mean that the second control signal P2 having a logic high level is received.

The switches SW3 and SW25 may be turned on when a third control signal PA is received. For example, that "the third control signal PA is received" may mean that the third control signal PA having a logic high level is received.

The switches SW4 and SW26 may be turned on when a fourth control signal PB is received. For example, that "the fourth control signal PB is received" may mean that the fourth control signal PB having a logic high level is received.

The first control signal P1 and the second control signal P2 may be signals which have a same frequency as each other and have different phases from each other. A pulse having the logic high level of the first control signal P1 and a pulse having the logic high level of the second control signal P2 may not temporally overlap with each other.

The third control signal PA and the fourth control signal PB may be signals which have a same frequency as each other and have different phases from each other. A pulse having the logic high level of the third control signal PA and a pulse having the logic high level of the fourth control signal PB may not temporally overlap with each other. The frequency of each of the third control signal PA and the fourth control signal PB may correspond to ½ of the frequency of each of the first control signal P1 and the second control signal P2. A pulse of the third control signal PA may temporally overlap with a pulse of the first control signal P1 and a pulse of the second control signal P2, which are temporally most adjacent thereto. A pulse of the fourth control signal PB may temporally overlap with a pulse of the first control signal P1 and a pulse of the second control signal P2, which are temporally most adjacent thereto.

While the first integrator INT1 performs an integral function, the first input capacitor CIN1 may be connected between the first input terminal VIP of the band pass filter BPFa and the first input terminal of the first amplifier AMP1, and the first integration capacitor Cint1 may be connected between the first input terminal and the first output terminal of the first amplifier AMP1. The first integrator INT1 may discharge capacitors while the first control signal P1 has the logic high level, and perform the integral function while the second control signal P2 has the logic high level.

The first high pass filter converter HPF1 may time-divisionally provide N (here, N is an integer greater than 1) high pass filter conversion paths. The first high pass filter converter HPF1 may include N conversion capacitors CA1 and CB1 corresponding to the N high pass filter conversion paths. The N conversion capacitors CA1 and CB1 and the first integration capacitor Cint1 may have a same capacitance as each other.

For example, N may be 2, and the first high pass filter converter HPF1 may include a first high pass conversion path and a second high pass conversion path. The case where N is 2 may represent a minimum number as described in FIG. 9, and N may be set greater than 2.

The first high pass conversion path may be activated when the third switch SW3 is turned on. For example, when the third control signal PA has the logic high level, the first high pass conversion path may be activated. When the third control signal PA has the logic high level and the first control signal P1 has the logic high level, charges stored in the first integration capacitor Cint1 are transmitted to a first conversion capacitor CA1. When the third control signal PA has the logic high level and the second control signal P2 has the logic high level, charges are provided to the first integrator INT1 from the third conversion capacitor CA2, and the first integrator INT1 performs integration including these charges, thereby serving as a sign-inverted z to −z transformed switched-capacitor (SC) integrator. Accordingly, the first integrator INT1 and the first high pass conversion path serve as a high pass filter.

The second high pass conversion path may be activated when the fourth switch SW4 is turned on. For example, when the fourth control signal PB has the logic high level, the second high pass conversion path may be activated. When the fourth control signal PB has the logic high level and the first control signal P1 has the logic high level, charges stored in the first integration capacitor Cint1 are transmitted to the second conversion capacitor CB1. When the fourth control signal PB has the logic high level and the second control signal P2 has the logic high level, charges are provided to the first integrator INT1 from the fourth conversion capacitor CB2, and the first integrator INT1 performs integration including these charges, thereby serving as a sign-inverted z to −z transformed SC integrator. Accordingly, the first integrator INT1 and the second high pass conversion path serve as a high pass filter.

The first high pass conversion path and the second high pass conversion path alternately operate, to operate as the band path filter BPFa as described above with reference to FIG. 9.

A cycle in which the first integrator INT1 performs an integral function may be shorter than a cycle in which the first high pass filter conversion path is provided. For example, a cycle of the second control signal P2 may be shorter than a cycle of the third control signal PA. The cycle in which the first integrator INT1 performs the integral function may be 1/N of the cycle in which the first high pass filter conversion path is provided. For example, the cycle of the second control signal P2 may be ½ of the cycle of the third control signal PA.

The second high pass filter converter HPF2 may time-divisionally provide M (here M is an integer greater than 1) high pass filter conversion paths. In an embodiment, N and the M are the same as each other. The second high pass filter converter HPF2 has a structure corresponding (or symmetrical) to the first high pass filter converter HPF1, and operates substantially identically to the first high pass filter converter HPF1. Therefore, any repetitive detailed descriptions thereof will be omitted.

The first gain auxiliary component GAC1 may be connected to the first input terminal and the first output terminal of the first amplifier AMP1 while the first integrator INT1 performs the integral function. The first auxiliary capacitor CF1 and the first integration capacitor Cint1 may have different capacitances from each other. In addition, the first input capacitor CIN1, the first auxiliary capacitor CF1, and the first integration capacitor Cint1 may have different capacitances from each other. For example, the first input capacitor CIN1 may be set to have a capacitance of 0.5 picofarad (pF), the first auxiliary capacitor CF1 may be set to have a capacitance of 0.25 pF, and the first integration capacitor Cint1 may be set to have a capacitance of 1.38 pF. For example, each of the first conversion capacitor CA1 and the second conversion capacitor CB1 may be set to have a capacitance of 1.38 pF. In accordance with an embodiment, capacitors may operate even when capacitances of the capacitors are set to be very small, and the occupation area of the band pass filter BPFa may be decreased.

The second gain auxiliary component GAC2 may be connected to the second input terminal and the second output terminal of the first amplifier AMP1 while the first integrator INT1 performs the integral function. The second gain auxiliary component GAC2 has a structure corresponding (or symmetrical) to the first gain auxiliary component GAC1, and operates substantially identically to the first gain auxiliary component GAC1. Therefore, any repetitive detailed descriptions thereof will be omitted. The second input capacitor CIN2 may have a same capacitance as the first input capacitor CIN1. The second integration capacitor Cint2 may have a same capacitance as the first integration capacitor Cint1. The third conversion capacitor CA2 and the fourth conversion capacitor CB2 may have the same capacitances as the first conversion capacitor CA1 and the second conversion capacitor CB1, respectively. The second auxiliary capacitor CF2 may have a same capacitance as the first auxiliary capacitor CF1.

A transfer function of the band pass filter BPFa is as shown in the following Equation 4.

$$\frac{V(VOP) - V(VON)}{V(VIP) - V(VIN)} = \frac{-C(CIN1)}{C(CF1)*(1+z^{-2})} \qquad \text{Equation 4}$$

Here, V(VOP) denotes a voltage of the first output terminal VOP, V(VON) denotes a voltage of the second output terminal VON, V(VIP) denotes a voltage of the first input terminal VIP, and V(VIN) denotes a voltage of the second input terminal VIN. In addition, C(CIN1) denotes a capacitance of the first input capacitor CIN1, and C(CF1) denotes a capacitance of the first auxiliary capacitor CF1.

A central frequency of the band pass filter BPFa is as shown in the following Equation 5.

$$fc=fs/(2(N-1)) \qquad \text{Equation 5}$$

In Equation 5, N denotes a number of high pass filter conversion paths (N=1 in FIG. 10). In addition, fs denotes a sampling frequency, where the sampling frequency may mean a frequency of the third control signal PA or the fourth control signal PB. In addition, fc denotes the central frequency of the band pass filter BPFa.

A bandwidth of the band pass filter BPFa is as shown in the following Equation 6.

$$fBW=2*fBWLPF/(N-1) \qquad \text{Equation 6}$$

Here, fBWLPF denotes a bandwidth of a low pass filter (i.e., a bandwidth of the first integrator INT1 itself). As described above, N denotes a number of high pass filter conversion paths (N=2 in FIG. 10). In addition, fBW denotes the bandwidth of the band pass filter BPFa.

Figure 12:
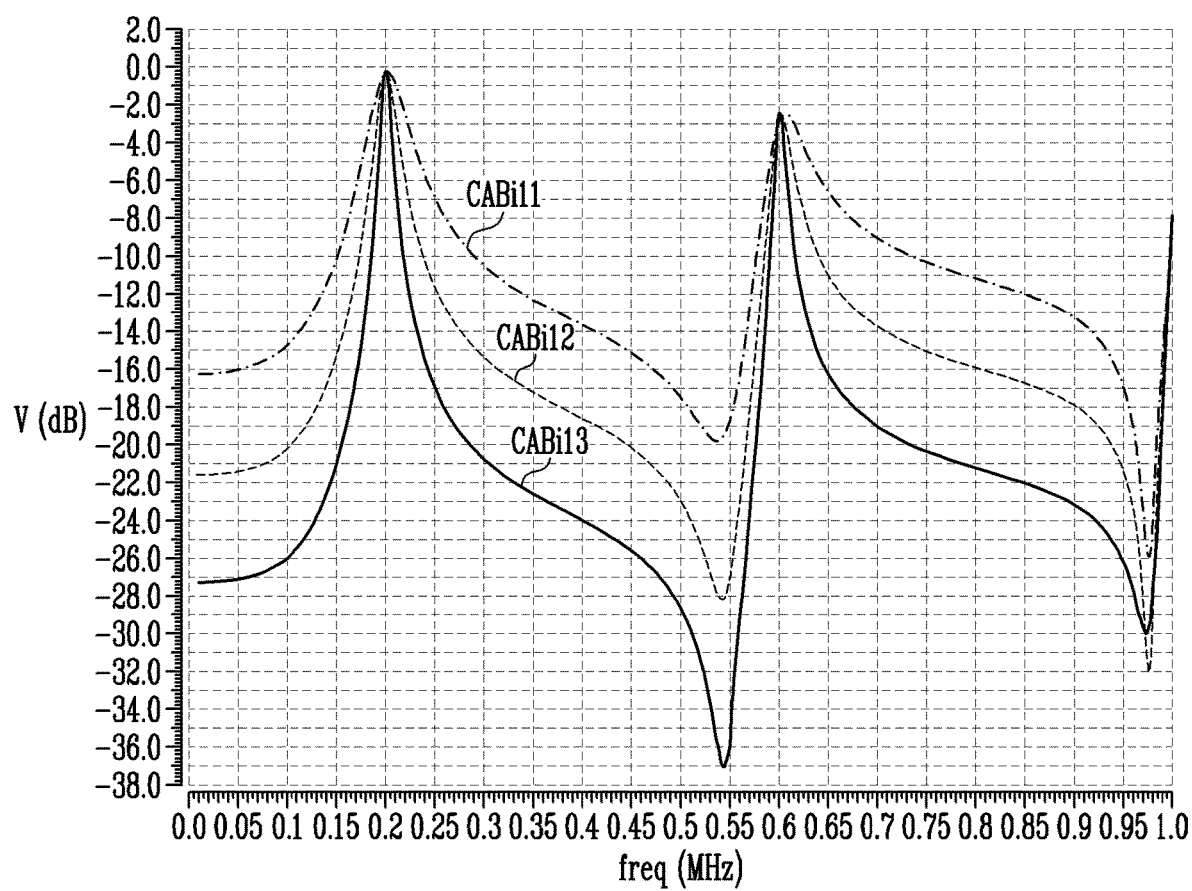
FIG. 12 is a diagram illustrating that a Q factor of the band pass filter shown in FIG. 10 may be independently set.

FIG. 12 is a diagram illustrating that a Q factor of the band pass filter shown in FIG. 10 may be independently set.

Referring to FIG. 12, amplitude graphs in cases where capacitances of the capacitors CA1, CB1, Cint1, CA2, CB2, and Cint2 are set as capacitances CABi11, CABi12, and CABi13 are illustrated. The capacitances of the capacitors CA1, CB1, Cint1, CA2, CB2, and Cint2 may be set equal to one another.

FIG. 12 shows a case where the capacitance CABi11 is smallest and the capacitance CABi13 is largest. For example, FIG. 12 is a graph in a case where the capacitance CABi11 is set to have a capacitance of 0.5*1.38 pF, the capacitance CABi12 is set to have a capacitance of 1*1.38 pF, and the capacitance CABi13 is set to have a capacitance of 2*1.38 pF. That is, it can be seen that a Q-factor becomes larger as the capacitances of the capacitors CA1, CB1, Cint1, CA2, CB2, and Cint2 are set to become larger. It can be seen that a gain value is constantly maintained even when the Q-factor becomes larger. That is, the band pass filter BPFa of an embodiment has desired features in that the Q-factor is allowed be independently set regardless of the gain value. A group delay increases as the Q-factor becomes larger.

Figure 13:
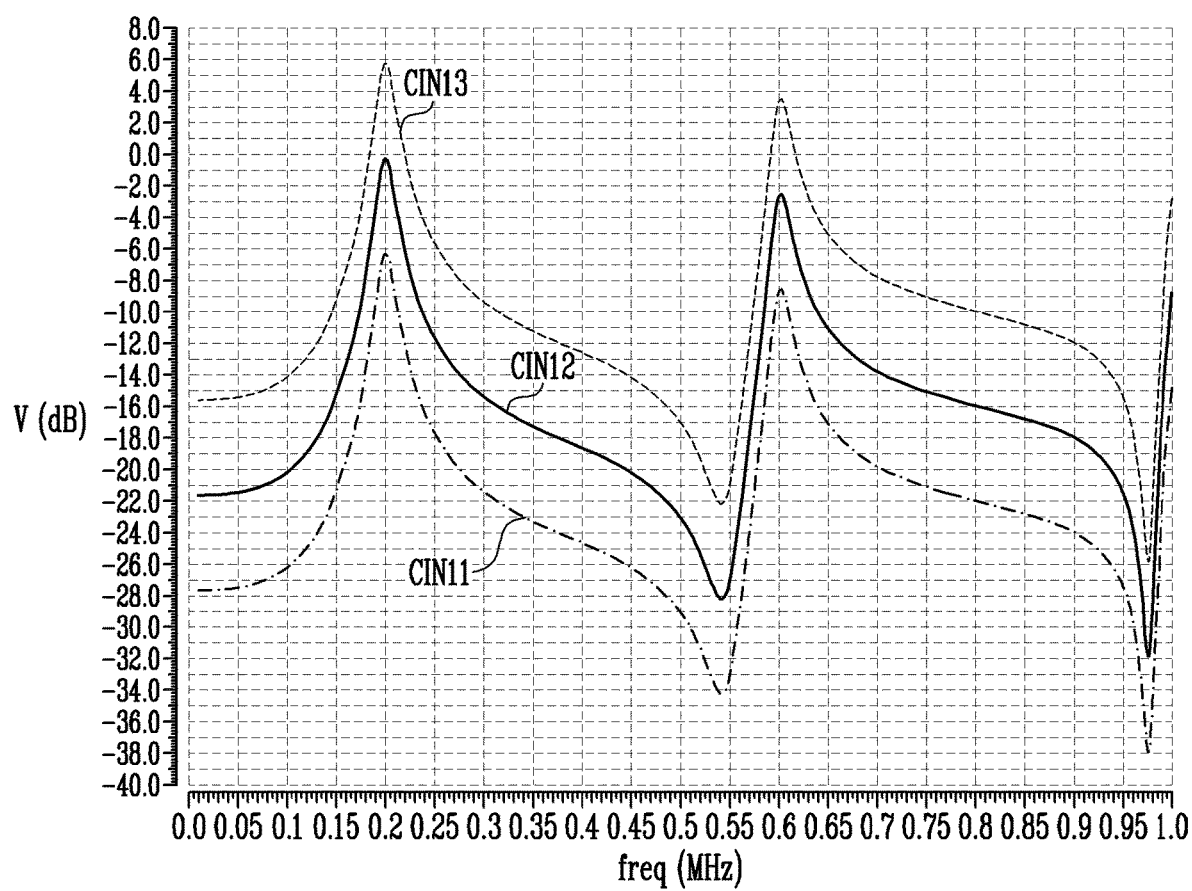
FIG. 13 is a diagram illustrating that a gain of the band pass filter shown in FIG. 10 may be independently set.

FIG. 13 is a diagram illustrating that a gain of the band pass filter shown in FIG. 10 may be independently set.

Referring to FIG. 13, amplitude graphs in cases where capacitances of the input capacitors CIN1 and CIN2 are set as capacitances CIN11, CIN12, and CIN13 are illustrated. The capacitances of the input capacitors CIN1 and CIN2 may be set equal to each other.

FIG. 13 shows a case where the capacitance CIN11 is smallest and the capacitance CIN13 is largest. For example, FIG. 13 is a graph in a case where the capacitance CIN11 is set to have a capacitance of 0.25 pF, the capacitance CIN12 is set to have a capacitance of 0.5 pF, and the capacitance CIN13 is set to have a capacitance of 1 pF. That is, it can be seen that a gain becomes larger as the capacitances of the input capacitors CIN1 and CIN2 are set to become larger. It can be seen that a Q-factor is constantly maintained even when a gain becomes larger. That is, the band pass filter BPFa of this embodiment has desired features in that the gain is allowed be independently set regardless of the Q-factor. Since the Q-factor is constant even when the gain is changed, a group delay is constantly maintained.

The auxiliary capacitors CF1 and CF2 also contribute to gain setting of the band pass filter BPFa. However, when capacitances of the auxiliary capacitors CF1 and CF2 are independently changed, the Q-factor in addition to the gain is also changed, and hence the advantage in that the gain and the Q-factor are independently set. Therefore, the capacitances of the auxiliary capacitors CF1 and CF2 may be set to maintain a ratio with the capacitances of the input capacitors CIN1 and CIN2. For example, in the graphs shown in FIGS. 12 and 13, the capacitances of the auxiliary capacitors CF1 and CF2 are set to maintain ½ of the capacitances of the input capacitors CIN1 and CIN2.

Referring to FIGS. 12 and 13, the Q-factor and the gain value are allowed to be independently set even when a single amplifier is used, without any parameter mismatch since no resistance element is included.

Figure 14A:
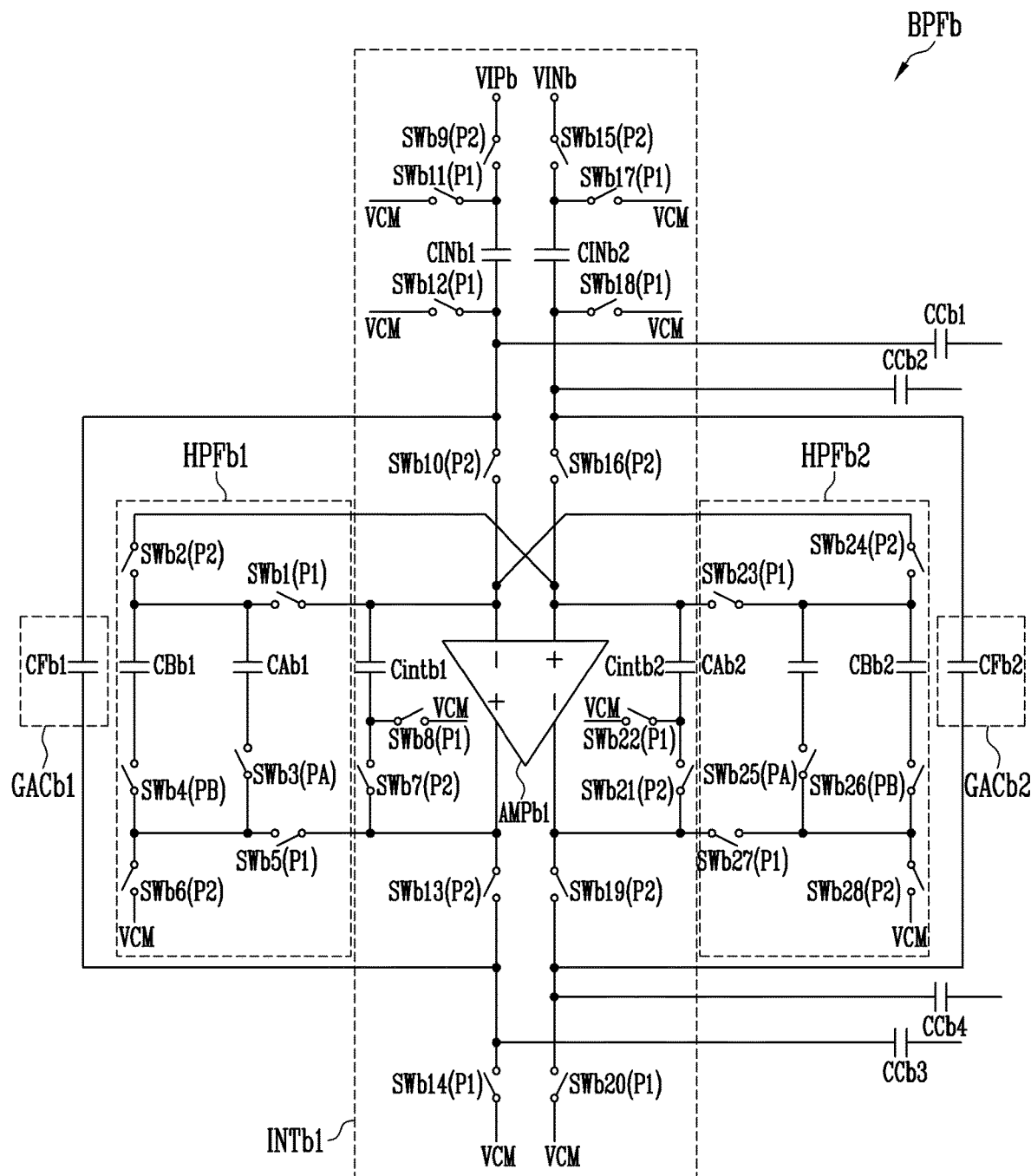
FIGS. 14A to 14C are diagrams illustrating a band pass filter in accordance with an alternative embodiment of the disclosure.
Figure 14B:
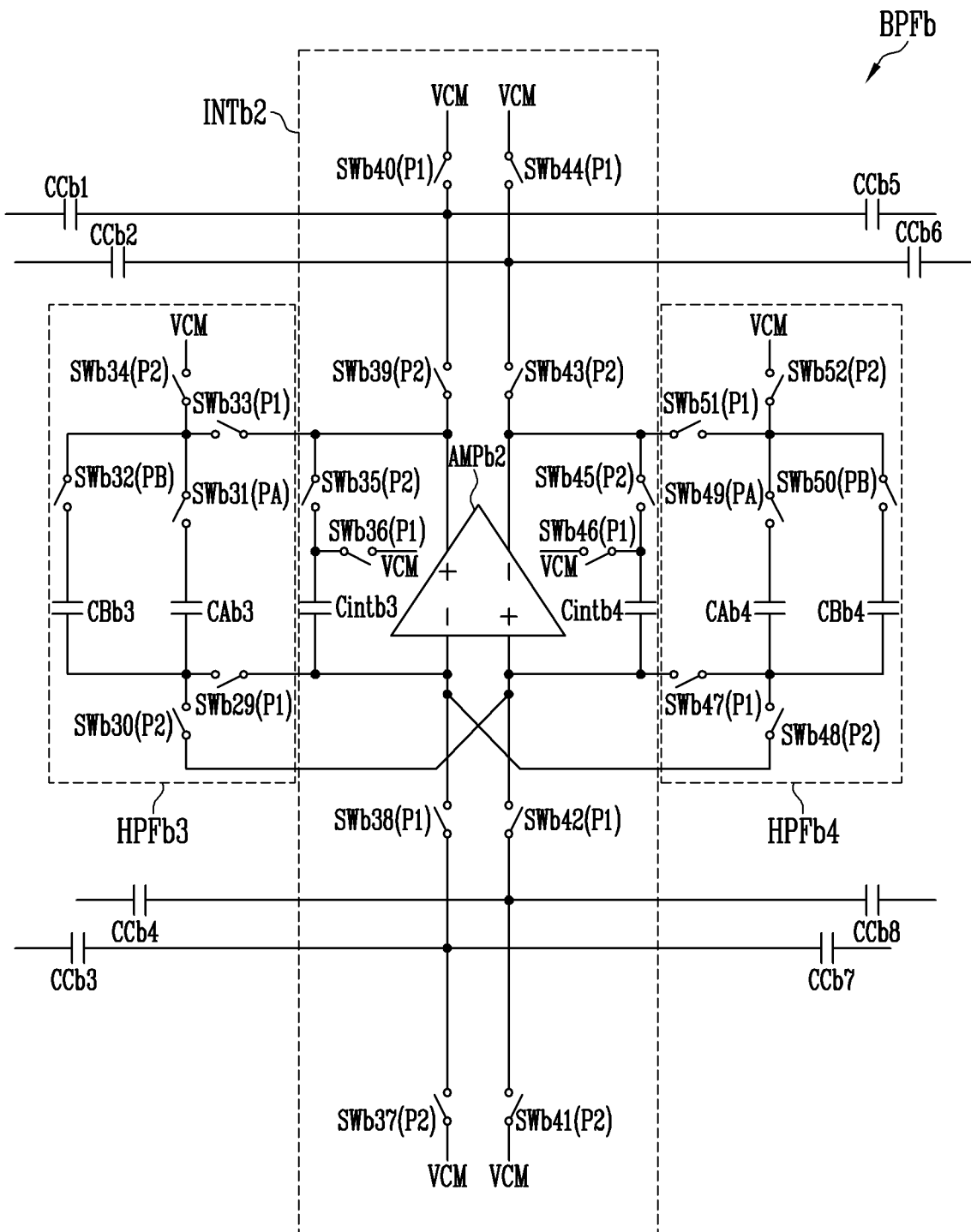
Figure 14C:
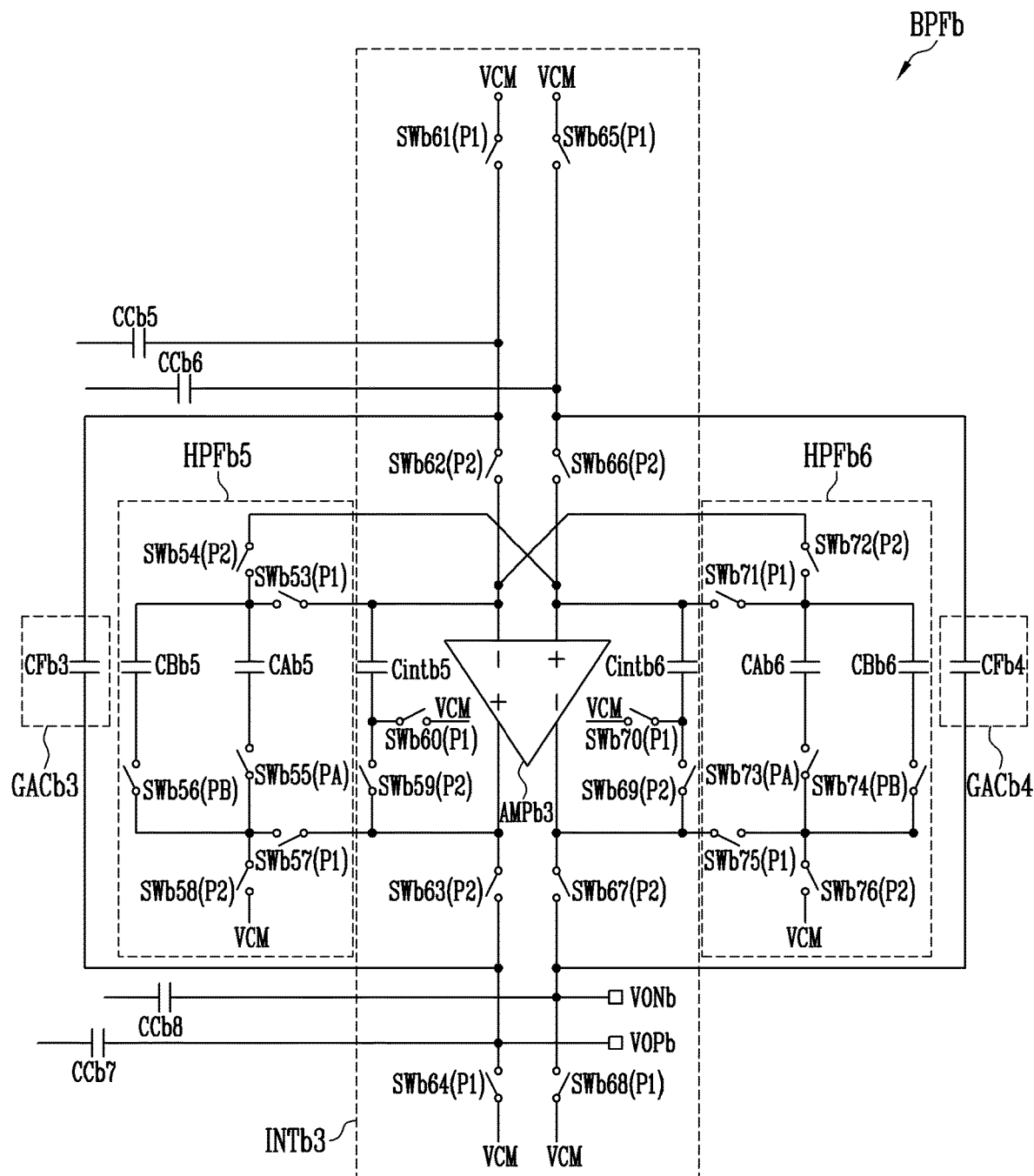

FIGS. 14A to 14C are diagrams illustrating a band pass filter in accordance with an alternative embodiment of the disclosure.

FIGS. 14A to 14C illustrate a band pass filter BPFb in accordance with an embodiment of the disclosure. Due to limitation of paper, one band pass filter BPFb is dividedly illustrated in three drawings.

In an embodiment, as shown in FIGS. 14A to 14C, the band pass filter BPFb may include a first integrator INTb1, a second integrator INTb2, a third integrator INTb3, a first high pass filter converter HPFb1, a second high pass filter converter HPFb2, a third high pass filter converter HPFb3, a fourth high pass filter converter HPFb4, a fifth high pass filter converter HPFb5, a sixth high pass filter converter HPFb6, a first gain auxiliary component GACb1, a second gain auxiliary component GACb2, a third gain auxiliary component GACb3, and a fourth gain auxiliary component GACb4. The first integrator INTb1 and the second integrator INTb2 may be connected to each other through first to fourth connection capacitors CCb1, CCb2, CCb3, and CCb4. In addition, the second integrator INTb2 and the third integrator INTb3 may be connected to each other through fifth to eighth connection capacitors CCb5, CCb6, CCb7, and CCb8. The band pass filter BPFb may operate in a same manner as the band pass filter BPFa shown in FIG. 10 by using the first to fourth control signals P1, P2, PA, and PB shown in FIG. 11, and therefore, any repetitive detailed description thereof will be omitted. In FIGS. 14A to 14C, a control signal P1, P2, PA or PB, by which each of the switches SWb1 to SWb76 is controlled, is specified in parentheses of each.

First, referring to FIG. 14A, the first integrator INTb1, the first high pass filter converter HPFb1, the second high pass filter converter HPFb2, the first gain auxiliary component GACb1, and the second gain auxiliary component GACb2 will be described.

The first integrator INTb1 may include a first amplifier AMPb1, a first input capacitor CINb1, a second input capacitor CINb2, a first integration capacitor Cintb1, a second integration capacitor Cintb2, and switches SWb7 to SWb22.

Output terminals of the first amplifier AMPb1 may be configured as two fully differential amplifiers. A first electrode of the first integration capacitor Cintb1 may be connected to a first input terminal (e.g., an inverting input terminal) of the first amplifier AMPb1, and a second electrode of the first integration capacitor Cintb1 may be connected to a first terminal of a seventh switch SWb7. The seventh switch SWb7 may be connected between the second electrode of the first integration capacitor Cintb1 and a first output terminal (e.g., a non-inverting output terminal) of the first amplifier AMPb1. An eighth switch SWb8 may be connected between the second electrode of the first integration capacitor Cintb1 and a reference power source VCM (e.g., a ground).

A ninth switch SWb9 may be connected between a first input terminal VIPb of the band pass filter BPFb and a first electrode of the first input capacitor CINb1. The first input terminal VIPb of the band pass filter BPFb may be a non-inverting input terminal. A tenth switch SWb10 may be connected between a second electrode of the first input capacitor CINb1 and the first input terminal of the first amplifier AMPb1. An eleventh switch SWb11 may be connected between the first electrode of the first input capacitor CINb1 and the reference power source VCM. A twelfth switch SWb12 may be connected between the second electrode of the first input capacitor CINb1 and the reference power source VCM. A first electrode of the first connection capacitor CCb1 may be connected to the second electrode of the first input capacitor CINb1.

A thirteenth switch SWb13 may be connected between the first output terminal of the first amplifier AMPb1 and a first electrode of the third connection capacitor CCb3. A fourteenth switch SWb14 may be connected between the first electrode of the third connection capacitor CCb3 and the reference power source VCM.

A fifteenth switch SWb15 may be connected between a second input terminal VINb of the band pass filter BPFb and a first electrode of the second input capacitor CINb2. The second input terminal VINb of the band pass filter BPFb may be an inverting input terminal. A sixteenth switch SWb16 may be connected between a second electrode of the second input capacitor CINb2 and a second input terminal of the first amplifier AMPb1. The second input terminal of the first amplifier AMPb1 may be a non-inverting input terminal. A seventeenth switch SWb17 may be connected between the first electrode of the second input capacitor CINb2 and the reference power source VCM. An eighteenth switch SWb18 may be connected between the second electrode of the second input capacitor CINb2 and the reference power source VCM. A first electrode of the second connection capacitor CCb2 may be connected to the second electrode of the second input capacitor CINb2.

A nineteenth switch SWb19 may be connected between a second output terminal of the first amplifier AMPb1 and a first electrode of the fourth connection capacitor CCb4. The second output terminal of the first amplifier AMPb1 may be an inverting output terminal. A twentieth switch SWb20 may be connected between the first electrode of the fourth connection capacitor CCb4 and the reference power source VCM.

A first electrode of the second integration capacitor Cintb2 may be connected to the second input terminal of the first amplifier AMPb1. A twenty-first switch SWb21 may be connected between a second electrode of the second integration capacitor Cintb2 and the second output terminal of the first amplifier AMPb1. A twenty-second switch SWb22 may be connected between the second electrode of the second integration capacitor Cintb2 and the reference power source VCM.

The first high pass filter converter HPFb1 may include a first conversion capacitor CAb1, a second conversion capacitor CBb1, and switches SWb1 to SWb6. The first high pass filter converter HPFb1 may be connected to the first input terminal, the second input terminal, and the first output terminal of the first amplifier AMPb1.

A first switch SWb1 may connect the first input terminal of the first amplifier AMPb1 and a first electrode of the first conversion capacitor CAb1 to each other. A second switch SWb2 may connect the second input terminal of the first amplifier AMPb1 and a first electrode of the second conversion capacitor CBb1. A first terminal of a third switch SWb3 may be connected to a second electrode of the first conversion capacitor CAb1. A fourth switch SWb4 may be connected to a second electrode of the second conversion capacitor CBb2. A fifth switch SWb5 may be connected between the first output terminal of the first amplifier AMPb1 and a second terminal of the third switch SWb3. A sixth switch SWb6 may be connected between a second terminal of the fourth switch SWb4 and the reference power source VCM.

The first gain auxiliary component GACb1 may include a first auxiliary capacitor CFb1. The first auxiliary capacitor CFb1 may be connected between the second electrode of the first input capacitor CINb1 and the first electrode of the third connection capacitor CCb3.

The second high pass filter converter HPFb2 may be connected to the first input terminal, the second input terminal, and the second output terminal of the first amplifier AMPb1. The second high pass filter converter HPFb2 may include a third conversion capacitor CAb2, a fourth conversion capacitor CBb2, and switches SWb23 to SWb28. A twenty-third switch SWb23 may connect the second input terminal of the first amplifier AMPb1 and a first electrode of the third conversion capacitor CAb2 to each other. A twenty-fourth switch SWb24 may connect the first input terminal of the first amplifier AMPb1 and a first electrode of the fourth conversion capacitor CBb2. A first terminal of a twenty-fifth switch SWb25 may be connected to a second electrode of the third conversion capacitor CAb2. A first terminal of a twenty-sixth switch SWb26 may be connected to a second electrode of the fourth conversion capacitor CBb2. A twenty-seventh switch SWb27 may be connected between the second output terminal of the first amplifier AMPb1 and a second terminal of the twenty-fifth switch SWb25. A twenty-eighth switch SWb28 may be connected between a second terminal of the twenty-sixth switch SWb26 and the reference power source VCM.

The second gain auxiliary component GACb2 may include a second auxiliary capacitor CFb2. The second auxiliary capacitor CFb2 may be connected between the second electrode of the second input capacitor CINb2 and the first electrode of the fourth connection capacitor CCb4.

Next, the second integrator INTb2, the third high pass filter converter HPFb3, and the fourth high pass filter converter HPFb4 will be described with reference to FIG. 14B.

The second integrator INTb2 may include a second amplifier AMPb2. The third high pass filter converter HPFb3 may be connected to a first input terminal, a second input terminal, and a first output terminal of the second amplifier AMPb2, and time-divisionally provide P (here, P is an integer greater than 1) high pass filter conversion paths. The fourth high pass filter converter HPFb4 may be connected to the first input terminal, the second input terminal, and a second output terminal of the second amplifier AMPb2, and time-divisionally provide Q (here, Q is an integer greater than 1) high pass filter conversion paths. P and Q may be the same as each other. In addition, P and N may be the same as each other.

The second integrator INTb2 may include the second amplifier AMPb2, a third integration capacitor Cintb3, a fourth integration capacitor Cintb4, and switches SWb35 to SWb46.

The output terminals of the second amplifier AMPb2 may be configured as two fully differential amplifiers. A first electrode of the third integration capacitor Cintb3 may be connected to the first input terminal (e.g., an inverting input terminal) of the second amplifier AMPb2, and a second electrode of the third integration capacitor Cintb3 may be connected to a first terminal of a thirty-fifth switch SWb35. The thirty-fifth switch SWb35 may be connected between the second electrode of the third integration capacitor Cintb3 and the first output terminal (e.g., a non-inverting output terminal) of the second amplifier AMPb2. A thirty-sixth switch SWb36 may be connected between the second electrode of the third integration capacitor Cintb3 and the reference power source VCM (e.g., the ground).

A thirty-seventh switch SWb37 may be connected between the reference power source VCM and a second electrode of the third connection capacitor CCb3. The second electrode of the third connection capacitor CCb3 may be connected to a first electrode of the seventh connection capacitor CCb7. A thirty-eighth switch SWb38 may be connected between the second electrode of the third connection capacitor CCb3 and the first input terminal of the second amplifier AMPb2.

A thirty-ninth switch SWb39 may be connected between the first output terminal of the second amplifier AMPb2 and a second electrode of the first connection capacitor CCb1. A fortieth switch SWb40 may be connected between the second electrode of the first connection capacitor CCb1 and the reference power source VCM.

A forty-first switch SWb41 may be connected between the reference power source VCM and a second electrode of the fourth connection capacitor CCb4. The second electrode of the fourth connection capacitor CCb4 may be connected to a first electrode of the eighth connection capacitor CCb8. A forty-second switch SWb42 may be connected between the second electrode of the fourth connection capacitor CCb4 and the second input terminal of the second amplifier AMPb2. The second input terminal of the second amplifier AMPb2 may be a non-inverting input terminal.

A forty-third switch SWb43 may be connected between the second output terminal of the second amplifier AMPb2 and a first electrode of the sixth connection capacitor CCb6. The second output terminal of the second amplifier AMPb2 may be an inverting output terminal. The first electrode of the sixth connection capacitor CCb6 may be connected to a second electrode of the second connection capacitor CCb2. A forty-fourth switch SWb44 may be connected between the first electrode of the sixth connection capacitor CCb6 and the reference power source VCM.

A first electrode of the fourth integration capacitor Cintb4 may be connected to the second input terminal of the second amplifier AMPb2. A forty-fifth switch SWb45 may be connected to a second electrode of the fourth integration capacitor Cintb4 and the second output terminal of the second amplifier AMPb2. A forty-sixth switch SWb46 may be connected between the second electrode of the fourth integration capacitor Cintb4 and the reference power source VCM.

The third high pass filter converter HPFb3 may include a fifth conversion capacitor CAb3, a sixth conversion capacitor CBb3, and switches SWb29 to SWb34. The third high pass filter converter HPFb3 may be connected to the first input terminal, the second input terminal, and the first output terminal of the second amplifier AMPb2.

A twenty-ninth switch SWb29 may connect the first input terminal of the second amplifier AMPb2 and a first electrode of the fifth conversion capacitor CAb3 to each other. A thirtieth switch SWb30 may connect the second input terminal of the second amplifier AMPb2 and a first electrode of the sixth conversion capacitor CBb3 to each other. A first terminal of a thirty-first switch SWb31 may be connected to a second electrode of the fifth conversion capacitor CAb3. A first terminal of a thirty-second switch SWb32 may be connected to a second electrode of the sixth conversion capacitor CBb3. A thirty-third switch SWb33 may be connected between the first output terminal of the second amplifier AMPb2 and a second terminal of the thirty-first switch SWb31. A thirty-fourth switch SWb34 may be connected to a second terminal of the thirty-second switch SWb32 and the reference power source VCM.

The fourth high pass filter converter HPFb4 may be connected to the first input terminal, the second input terminal, and the second output terminal of the second amplifier AMPb2. The fourth high pass filter converter HPFb4 may include a seventh conversion capacitor CAb4, an eighth conversion capacitor CBb4, and switches SWb47 to SWb52. A forty-seventh switch SWb47 may connect the second input terminal of the second amplifier AMPb2 and a first electrode of the seventh conversion capacitor CAb4 to each other. A forty-eighth switch SWb48 may connect the first input terminal of the second amplifier AMPb2 and a first electrode of the eighth conversion capacitor CBb4 to each other. A first terminal of a forty-ninth switch SWb49 may be connected to a second electrode of the seventh conversion capacitor CAb4. A first terminal of a fiftieth switch SWb50 may be connected to a second electrode of the eighth conversion capacitor CBb4. A fifty-first switch SWb51 may be connected between the second output terminal of the second amplifier AMPb2 and a second terminal of the forty-ninth switch SWb49. A fifty-second switch SWb52 may be connected between a second terminal of the fiftieth switch SWb50 and the reference power source VCM.

Next, referring to FIG. 14C, the third integrator INTb3, the fifth high pass filter converter HPFb5, the sixth high pass filter converter HPFb5, the third gain auxiliary component GACb3, and the fourth gain auxiliary component GACb4 will be described with reference to FIG. 14C.

The third integrator INTb3 may include a third amplifier AMPb3. The fifth high pass filter converter HPFb5 may be connected to a first input terminal, a second input terminal, and a first output terminal, and time-divisionally provide S (here, S is an integer greater than 1) high pass filter conversion paths. The third gain auxiliary component GACb3 may be connected to the first input terminal and the first output terminal of the third amplifier AMPb3 while the third integrator INTb3 performs an integral function. The sixth high pass filter converter HPFb6 may be connected to the first input terminal, the second input terminal, and a second output terminal of the third amplifier AMPb3, and time-divisionally provide T (here, T is an integer greater than 1) high pass filter conversion paths. The fourth gain auxiliary component GACb4 may be connected to the second input terminal and the second output terminal of the third amplifier AMPb3 while the third integrator INTb3 performs the integral function. S and T may be the same as each other. In addition, S may be the same as N.

The third integrator INTb3 may include the third amplifier AMPb3, a fifth integration capacitor Cintb5, a sixth integration capacitor Cintb6, and switches SWb59 to SWb70.

The output terminals of the third amplifier AMPb3 may be configured as two fully differential amplifiers. A first electrode of the fifth integration capacitor Cintb5 may be connected to the first input terminal (e.g., an inverting input terminal) of the third amplifier AMPb3, and a second electrode of the fifth integration capacitor Cintb5 may be connected to a first terminal of a fifty-ninth switch SWb59. The fifty-ninth switch SWb59 may be connected between the second electrode of the fifth integration capacitor Cintb5 and the first output terminal (e.g., a non-inverting output terminal) of the third amplifier AMPb3. A sixtieth switch SWb60 may be connected between the second electrode of the fifth integration capacitor Cintb5 and the reference power source VCM (e.g., the ground).

A sixty-first switch SWb61 may be connected between the reference power source VCM and a second electrode of the fifth connection capacitor CCb5. A sixty-second switch SWb62 may be connected between the second electrode of the fifth connection capacitor CCb5 and the first input terminal of the third amplifier AMPb3.

A sixty-third switch SWb63 may be connected between the first output terminal of the third amplifier AMPb3 and a second electrode of the seventh connection capacitor CCb7. A sixty-fourth switch SWb64 may be connected between the second electrode of the seventh connection capacitor CCb7 and the reference power source VCM. A first output terminal VOPb of the band pass filter BPFb may be connected to the second electrode of the seventh connection capacitor CCb7. The first output terminal VOPb of the band pass filter BPFb may be a non-inverting output terminal.

A sixty-fifth switch SWb65 may be connected between the reference power source VCM and a second electrode of the sixth connection capacitor CCb6. A sixty-sixth switch SWb66 may be connected between the second electrode of the sixth connection capacitor CCb6 and the second input terminal of the third amplifier AMPb3. The second input terminal of the third amplifier AMPb3 may be a non-inverting input terminal.

A sixty-seventh switch SWb67 may be connected between the second output terminal of the third amplifier AMPb3 and a second electrode of the eighth connection capacitor CCb8. The second output terminal of the third amplifier AMPb3 may be an inverting output terminal. A sixty-eighth switch SWb68 may be connected between the second electrode of the eighth connection capacitor CCb8 and the reference power source VCM. A second output terminal VONb of the band pass filter BPFb may be connected to the second electrode of the eighth connection capacitor CCb8. The second output terminal VONb of the band pass filter BPFb may be an inverting output terminal.

A first electrode of the sixth integration capacitor Cintb6 may be connected to the second input terminal of the third amplifier AMPb3. A sixty-ninth switch SWb69 may be connected between a second electrode of the sixth integration capacitor Cintb6 and the second output terminal of the third amplifier AMPb3. A seventieth switch SWb70 may be connected between the second electrode of the sixth integration capacitor Cintb6 and the reference power source VCM.

The fifth high pass filter converter HPFb5 may include a ninth conversion capacitor CAb5, a tenth conversion capacitor CBb5, and switches SWb53 to SWb58. The fifth high pass filter converter HPFb5 may be connected to the first input terminal, the second input terminal, and the first output terminal.

A fifty-third switch SWb53 may connect the first input terminal of the third amplifier AMPb3 and a first electrode of the ninth conversion capacitor CAb5 to each other. A fifty-fourth switch SWb54 may connect the second input terminal of the third amplifier AMPb3 and a first electrode of the tenth conversion capacitor CBb5 to each other. A first terminal of a fifty-fifth switch SWb55 may be connected to a second electrode of the ninth conversion capacitor CAb5. A first terminal of a fifty-sixth switch SWb56 may be connected to a second electrode of the tenth conversion capacitor CBb5. A fifty-seventh switch SWb57 may be connected between the first output terminal of the third amplifier AMPb3 and a second terminal of the fifty-fifth switch SWb55. A fifty-eighth switch SWb58 may be connected between a second terminal of the fifty-sixth switch SWb56 and the reference power source VCM.

The third gain auxiliary component GACb3 may include a third auxiliary capacitor CFb3. The third auxiliary capacitor CFb3 may be connected between the second electrode of the fifth connection capacitor CCb5 and the second electrode of the seventh connection capacitor CCb7.

The sixth high pass filter converter HPFb6 may be connected to the first input terminal, the second input terminal, and the second output terminal of the third amplifier AMPb3. The sixth high pass filter converter HPFb6 may include an eleventh conversion capacitor CAb6, a twelfth conversion capacitor CBb6, and switches SWb71 to SWb76. A seventy-first switch SWb71 may connect the second input terminal of the third amplifier AMPb3 and a first electrode of the eleventh conversion capacitor CAb6 to each other. A seventy-second switch SWb72 may connect the first input terminal of the third amplifier AMPb3 and a first electrode of the twelfth conversion capacitor CBb6 to each other. A first terminal of a seventy-third switch SWb73 may be connected to a second electrode of the eleventh conversion capacitor CAb6. A first terminal of a seventy-fourth switch SWb74 may be connected to a second electrode of the twelfth conversion capacitor CBb6. A seventy-fifth switch SWb75 may be connected between the second output terminal of the third amplifier AMPb3 and a second terminal of the seventy-third switch SWb73. A seventy-sixth SWb76 may be connected between a second terminal of the seventy-fourth switch SWb74 and the reference power source VCM.

The fourth gain auxiliary component GACb4 may include a fourth auxiliary capacitor CFb4. The fourth auxiliary capacitor CFb4 may be connected between the second electrode of the sixth connection capacitor CCb6 and the second electrode of the eighth connection capacitor CCb8.

Figure 15:
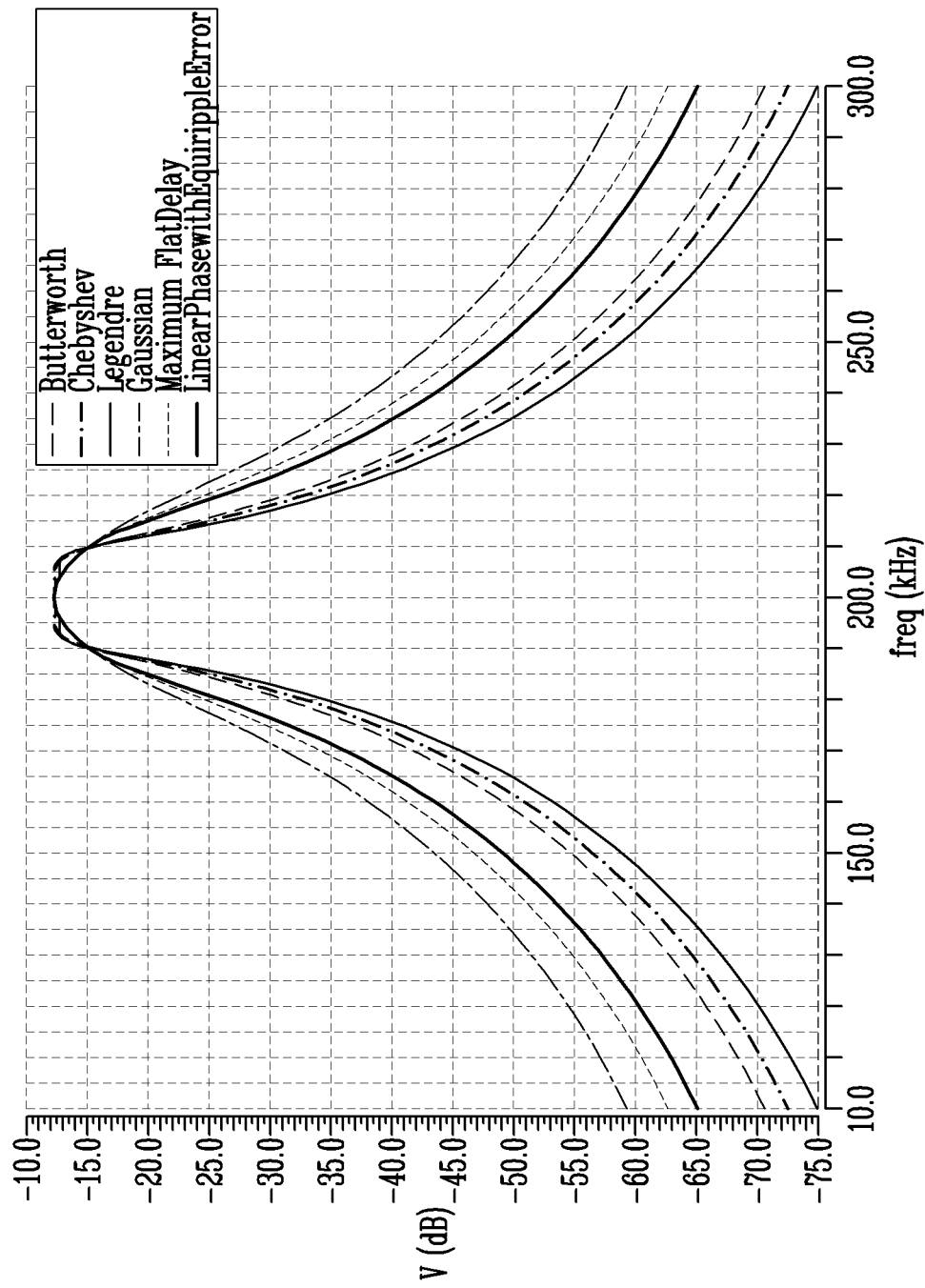
FIG. 15 is a diagram illustrating that a Q-factor may be set according to an application function of the band pass filter shown in FIGS. 14A to 14C.

FIG. 15 is a diagram illustrating that a Q-factor may be set according to an application function of the band pass filter shown in FIGS. 14A to 14C.

Referring to FIG. 15, there are illustrated amplitude graphs in which various existing functions (Butterworth, CHebyshev, Legendre, Gaussian, Maximum Flat Delay, and Linear Phase with Equiripple Error) are implemented by applying various capacitance values to the capacitors of the band pass filter BPFb shown in FIGS. 14A to 14C.

Figure 16:
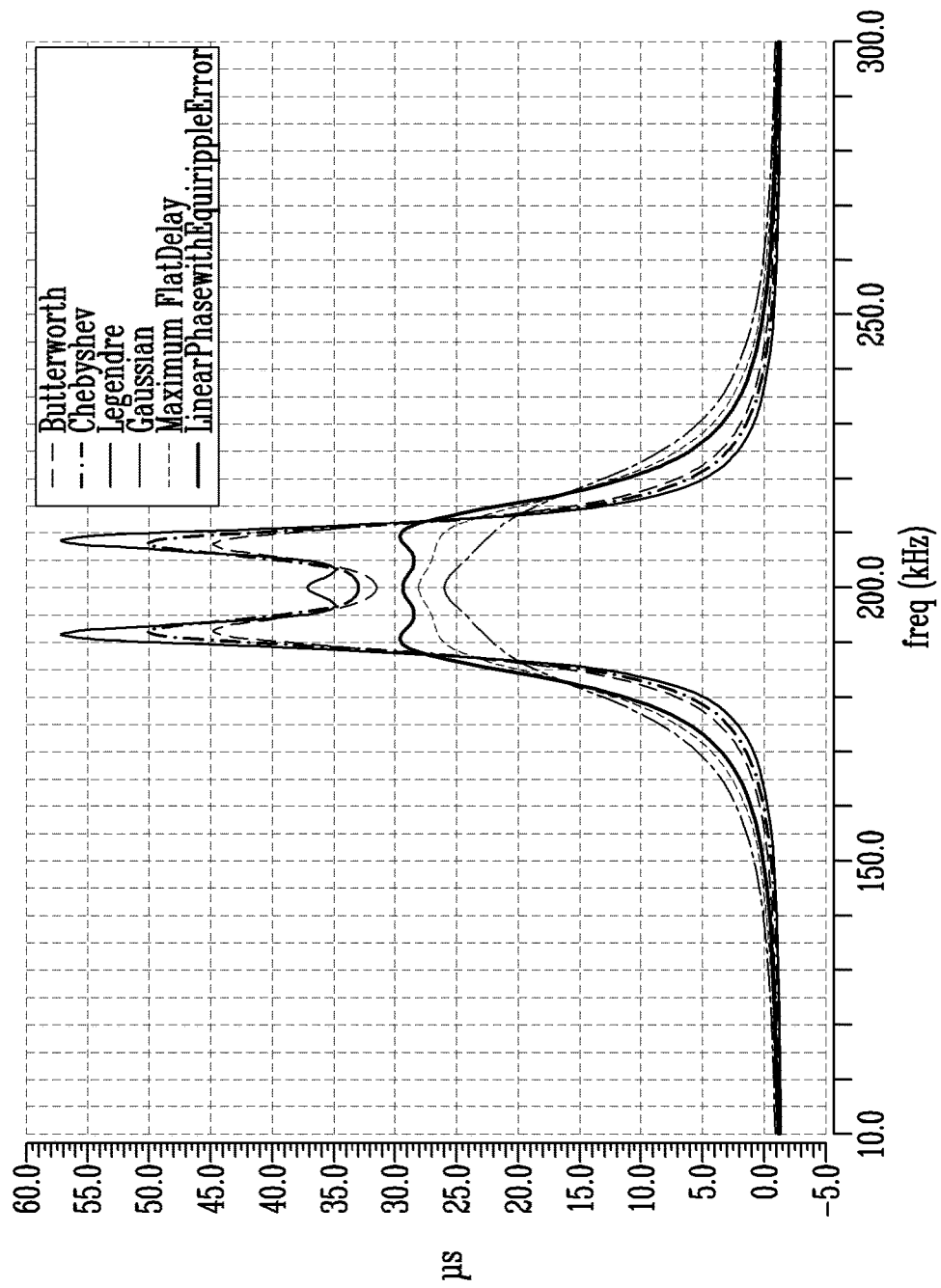
FIG. 16 is a diagram illustrating that a group delay may be minimized according to an application function of the band pass filter shown in FIGS. 14A to 14C.

FIG. 16 is a diagram illustrating that a group delay may be minimized according to an application function of the band pass filter shown in FIGS. 14A to 14C.

Referring to FIG. 16, there are illustrated group delay graphs in which various existing functions (Butterworth, CHebyshev, Legendre, Gaussian, Maximum Flat Delay, and Linear Phase with Equiripple Error) are implemented by applying various capacitance values to the capacitors of the band pass filter BPFb shown in FIGS. 14A to 14C. A group delay may mean a delay time as a difference between an output time and an input time of the band pass filter BPFb. In FIG. 16, the vertical axis is represented in a micro-second unit.

In order to implement Gaussian, Maximum Flat Delay, and Linear Phase with Equiripple Error functions, the band pass filter BPFb may satisfy a condition of the following Equation 7.

$$CN1<CN2<CN3 \qquad \text{Equation 7}$$

Here, CN1 denotes capacitances of the capacitors Cintb1, CAb1, CBb1, Cintb2, CAb2, and CBb2 shown in FIG. 14A, CN2 denotes capacitances of the capacitors Cintb3, CAb3, CBb3, Cintb4, CAb4, and CBb4 shown in FIG. 14B, and CN3 denotes capacitances of the capacitors Cintb5, Cab5, CBb5, Cintb6, Cab6, and CBb6 shown in FIG. 14C. The capacitances of the capacitors Cintb1, Cab1, CBb1, Cintb2, Cab2, and CBb2 may be the same as each other. Similarly, the capacitances of the capacitors Cintb3, CAb3, CBb3, Cintb4, CAb4, and CBb4 may be the same as each other, and the capacitances of the capacitors Cintb5, CAb5, CBb5, Cintb6, CAb6, and CBb6 may be the same as each other.

In order to implement Butterworth, CHebyshev, and Legendre functions, the band pass filter BPFb may satisfy a condition of the following Equation 8.

$$CN1=CN3<CN2 \qquad \text{Equation 8}$$

Here, CN1 denotes capacitances of the capacitors Cintb1, CAb1, CBb1, Cintb2, CAb2, and CBb2 shown in FIG. 14A, CN2 denotes capacitances of the capacitors Cintb3, CAb3, CBb3, Cintb4, CAb4, and CBb4 shown in FIG. 14B, and CN3 denotes capacitances of the capacitors Cintb5, CAb5, CBb5, Cintb6, CAb6, and CBb6 shown in FIG. 14C. The capacitances of the capacitors Cintb1, CAb1, CBb1, Cintb2, CAb2, and CBb2 may be the same as each other. Similarly, the capacitances of the capacitors Cintb3, CAb3, CBb3, Cintb4, CAb4, and CBb4 may be the same as each other, and the capacitances of the capacitors Cintb5, CAb5, CBb5, Cintb6, CAb6, and CBb6 may be the same as each other.

Referring to the graphs shown in FIG. 15, the band pass filter BPFb implemented with the Butterworth, CHebyshev, and Legendre functions has a cutoff characteristic (amplitude characteristic) sharper than a cutoff characteristic (amplitude characteristic) of the Gaussian, Maximum Flat Delay, and Linear Phase with Equiripple Error functions. Hence, the band pass filter BPFb implemented with the Butterworth, CHebyshev, and Legendre functions may be more desired when a channel number of a touch panel is small or in low speed driving.

Referring to the graphs shown in FIG. 16, it can be seen that the group delay of the band pass filter BPFb implemented with Gaussian, Maximum Flat Delay, and Linear Phase with Equiripple Error functions is minimized in a bandwidth and is maintained evenly. Thus, the band pass filter BPFb satisfying Equation 7 is desired in becoming large in area or high in speed according to an increase in channel number of the touch panel.

FIGS. 17 to 23 are views illustrating a configuration of an embodiment of the display device. Reference numerals shown in FIGS. 17 to 23 and reference numerals shown in FIGS. 1 to 16 are independent from each other.

Figure 17:
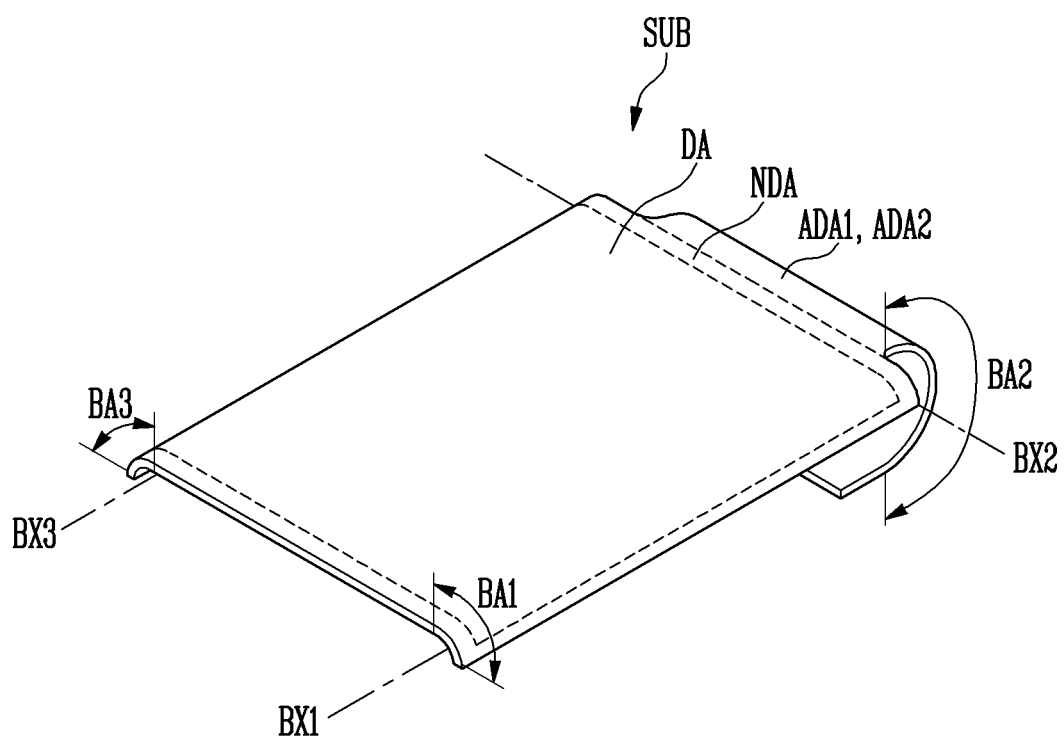
FIGS. 17 to 23 are views illustrating a configuration of an embodiment of the display device.
Figure 18:
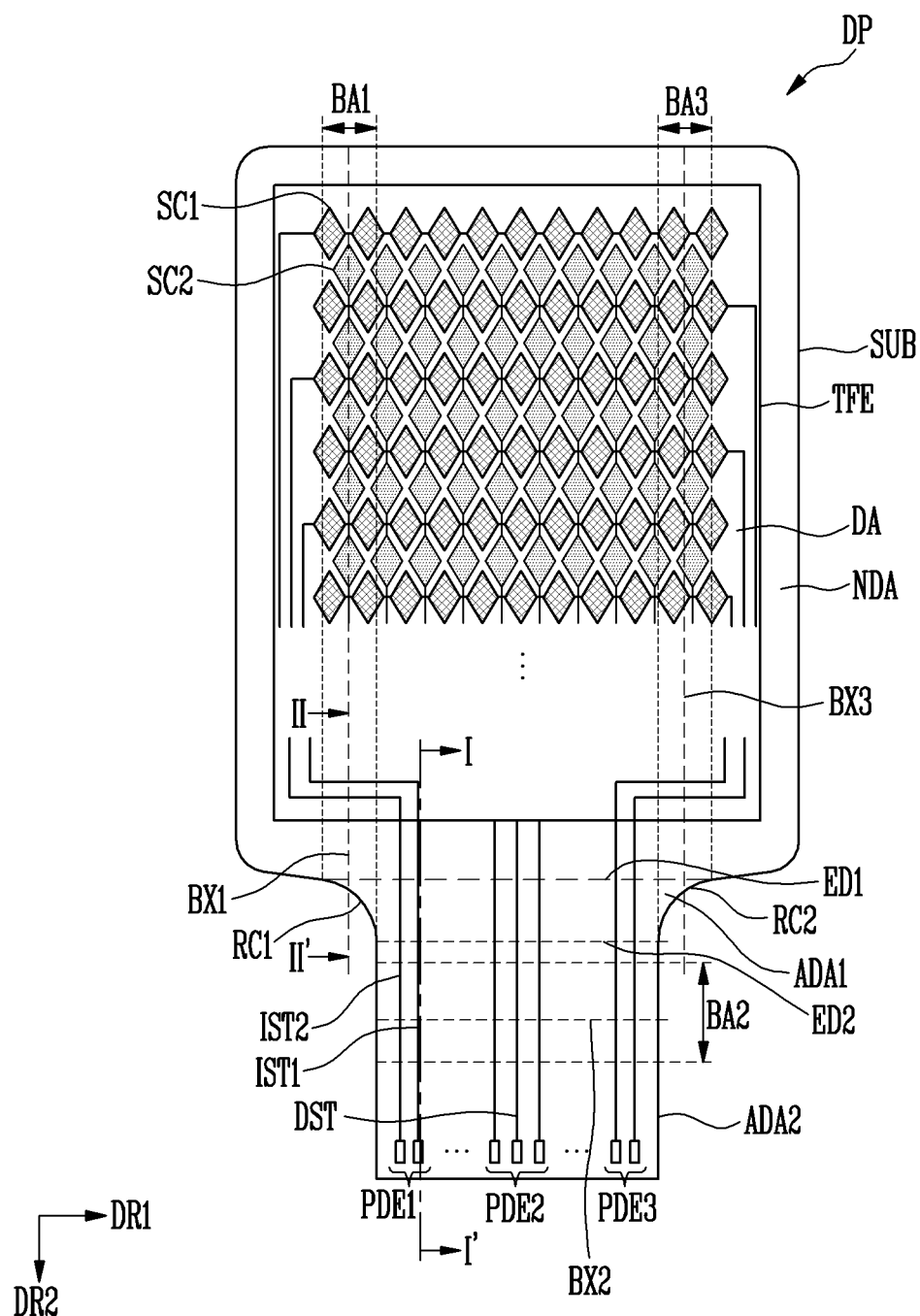

FIG. 17 is a view illustrating a substrate in accordance with an embodiment of the disclosure, and FIG. 18 is a view illustrating a display device in accordance with an embodiment of the disclosure.

In embodiments described below, a plane may be defined by a first direction DR1 and a second direction DR2, and a height may define a position in a third direction DR3 (see FIG. 19). The first direction DR1, the second direction DR2, and the third direction DR3 may be directions orthogonal to each other.

In an embodiment, the display device DP may include a substrate SUB. The substrate SUB may include a display area DA, a non-display area NDA, a first additional area ADA1, and a second additional area ADA2.

The display area DA may have a rectangular shape. Each corner of the display area DA may have an angular shape or a curved shape. In an embodiment, where the display device DP is a circular display, the display area DA may have a circular shape. Alternatively, the display area DA may be configured in a polygonal shape, an elliptical shape, or the like, instead of a quadrangular shape. As described above, the shape of the display area DA may be differently set according to products.

Pixels may be located on the display area DA. Each pixel may include a light emitting diode or include a liquid crystal layer based on the kind of the display device DP.

The non-display area NDA may surround the periphery of the display area DA. In an embodiment, for example, the display area NDA may have a rectangular shape. Each corner of the non-display area NDA may have an angular shape or a curved shape. An embodiment where each corner of the non-display area NDA has a curved shape is illustrated in FIG. 18. The non-display area NDA may have a circular shape. In an embodiment, the non-display area NDA is minimized to have a narrow bezel structure, and therefore, the shape of the non-display area NDA may be similar to that of the display area DA.

The first additional area ADA1 may be located between the non-display area NDA and the second additional area ADA2. The first additional area ADA1 may be connected to the non-display area NDA at a first boundary ED1. The first additional area ADA1 may be connected to the second additional area ADA2 at a second boundary ED2. Each of the first boundary ED1 and the second boundary ED2 may extend in the first direction DR1.

A width (or a length in the third direction DR1) of the first additional area ADA1 may become narrower as approaching the second boundary ED2 from the first boundary ED1. That is, a width of the first additional area ADA1 in the first direction DR1 may become narrower along the second direction DR2. Accordingly, the first additional area ADA1 may include a curved first side surface RC1 and a curved second side surface RC2. The side surfaces RC1 and RC2 may be convex toward the inside of the substrate (e.g., the center of the substrate).

In an embodiment, as shown in FIG. 18, the first additional area ADA1 may include two side surfaces RC1 and RC2 in the first direction DR1 and the opposite direction thereof. In an alternative embodiment, the first additional area ADA1 may include only the first side surface RC1 as a boundary of the first additional area ADA1, which is located in the first direction DR1, accords with that of the non-display area NDA. In another alternative embodiment, the first additional area ADA1 may include only the second side surface RC2 as a boundary of the first additional area ADA1, which is located in the opposite direction of the first direction DR1, accords with that of the non-display area NDA.

Figure 26:
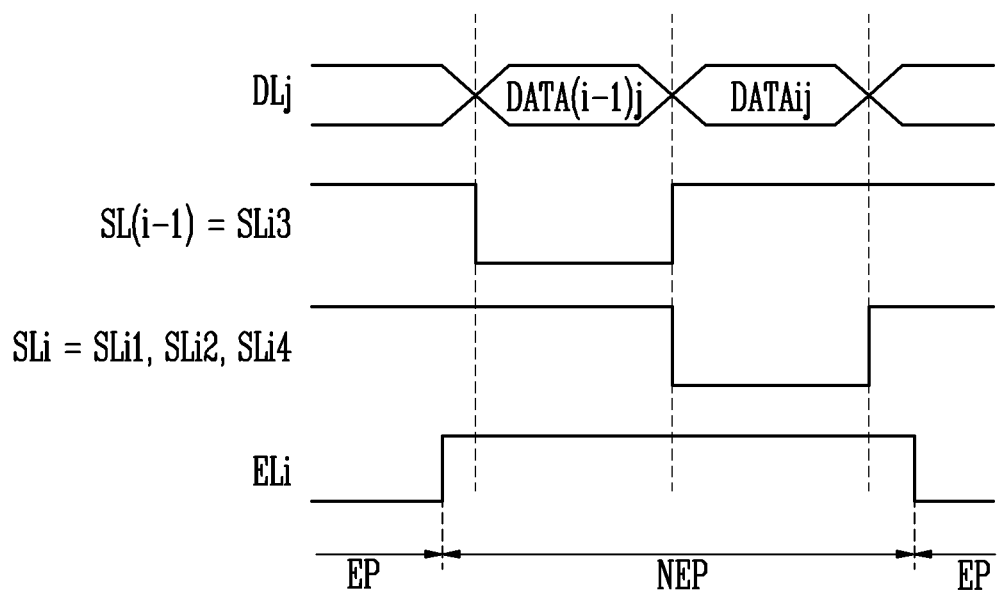

The second additional area ADA2 may have a rectangular shape. Each corner of the second additional area ADA2, which is located in the second direction DR2, may have an angular shape or a curved shape. an embodiment where each corner of the second additional area ADA2, which is located in the second direction DR2, has an angular shape is illustrated in FIG. 26.

An encapsulation layer TFE may be located over the pixels. In an embodiment, for example, the encapsulation layer TFE may cover the pixels in the display area DA, and a boundary of the encapsulation layer TFE may be located in the non-display area NDA. The encapsulation layer TFE covers light emitting elements and pixel circuit elements of the pixels in the display area DA, to prevent the light emitting elements and pixel circuit elements from being damaged by external moisture or impact.

Sensing electrodes SC1 and SC2 may be located on the encapsulation layer TFE. The sensing electrodes SC1 and SC2 may sense a touch input by a body of a user, hovering, a gesture, proximity, etc. The sensing electrodes SC1 and SC2 may be configured in another shape according to various types including a resistive type, a capacitive type, an electro-magnetic (EM) type, an optical type, and the like. In an embodiment, for example, where the sensing electrodes SC1 and SC2 is configured using the capacitive type, the sensing electrodes SC1 and SC2 may be configured using a self-capacitive type, a mutual capacitive type, or the like. Hereinafter, for convenience of description, embodiments where the sensing electrodes SC1 and SC2 are configured using the mutual capacitive type will be described as an example.

In an embodiment where the sensing electrodes SC1 and SC2 are configured using the mutual capacitive type, a driving signal may be transmitted through a sensing line corresponding to a first sensing electrode SC1, a sensing signal may be received through a sensing line corresponding to a second sensing electrode SC2 which forms a mutual capacitance together with the first sensing electrode SC1. When a body of a user comes close, the mutual capacitance between the first sensing electrode SC1 and the second sensing electrode SC2 may be changed, and whether a touch of the user is input may be detected based on a difference in sensing signal, which is caused by the change in the mutual capacitance. In an alternative embodiment, a driving signal may be transmitted through the sensing line corresponding to the second sensing electrode SC2, and a sensing signal may be received through the sensing line corresponding to the first sensing electrode SC1 which forms the mutual capacitance together with the second sensing electrode SC2.

Pads PDE1, PDE2, and PDE3 may be located on the second additional area ADA2. Pads PDE1 and PDE3 may be connected to the sensing electrodes SC1 and SC2 located on the encapsulation layer TFE through sensing lines IST1 and IST2. The pads PDE1 and PDE3 may be connected to an external touch integrated circuit (IC). In addition, pads PDE2 may be connected to the pixels or a driver of the pixels, located on the bottom of the encapsulation layer TFE, through display lines DST. The driver may include a scan driver, an emission driver, a data driver, and the like. The driver may be located below the encapsulation layer TFE, and be located in an external display IC connected through the pads PDE2.

In an embodiment where the sensing electrodes SC1 and SC2 are configured using the mutual capacitive type, the touch IC may transmit a driving signal through a first sensing line IST1, and receive a sensing signal through a second sensing line IST2. In an alternative embodiment, the touch IC may transmit a driving signal through the second sensing line IST2, and receive a sensing signal through the first sensing line IST1. In an embodiment where the sensing electrodes SC1 and SC2 are configured using the self-capacitive type, there may be no difference in driving method between the first sensing line IST1 and the second sensing line IST2. The display lines DST may include a control line, a data line, a power line, and the like, and provide signals such that the pixels can display an image. The signals may be provided from the driver connected to the display lines DL.

FIG. 17 illustrates an embodiment of a display device DP in a state in which the substrate SUB is bent, and FIG. 18 illustrates an embodiment of a display device DP in a state in which the substrate Sub is not bent. The display device DP may be bent as shown in FIG. 17, after elements are stacked on the substrate SUB in a state in which the display device DP is not bent as shown in FIG. 18.

The substrate SUB may include a first bending area BA1 extending to overlap with the non-display area NDA from the first side surface RC1 of the first additional area ADA1. Additionally, the first bending area BA1 may extend to overlap with the display area DA. That is, each of the display area DA, the non-display area NDA, and the first additional area ADA1 may partially overlap with the first bending area BA1. The first bending area BA1 may have a width in the first direction DR1, and have a length extending in the second direction DR2. A first bending axis BX1 may be defined as a folding line extending in the second direction DR2 at the center of the first bending area BA1. In some embodiments, the first bending area BA1 may be a portion at which stress is reduced as a partial insulating layer or the like is removed unlike another portion at the periphery thereof. In some embodiments, the first bending area BA1 may have a same configuration as the another portion at the periphery thereof.

The substrate SUB may include a third bending area BA3 extending to overlap with the non-display area NDA from the second side surface RC2 of the first additional area ADA1. Additionally, the third bending area BA3 may extend to overlap with the display area DA. That is, each of the display area DA, the non-display area NDA, and the first additional area ADA1 may partially overlap with the third bending area BA3. The third bending area BA3 may have a width in the first direction DR1, and have a length extending in the second direction DR2. A third bending axis BX3 may be defined as a folding line extending in the second direction DR2 at the center of the third bending area BA3. In some embodiments, the third bending area BA3 may be a portion at which stress is reduced as a partial insulating layer or the like is removed unlike another portion at the periphery thereof. In some embodiments, the third bending area BA3 may have a same configuration as the another portion at the periphery thereof.

The second additional area ADA2 may include a second bending area BA2. The second bending area BA2 may have a width in the second direction DR2, and have a length extending in the first direction DR1. A second bending axis BX2 may be defined as a folding line extending in the first direction DR1 at the center of the second bending area BA2. In some embodiments, the second bending area BA2 may be a portion at which stress is reduced as a partial insulating layer or the like is removed unlike another portion at the periphery thereof. In some embodiments, the second bending area BA2 may have a same configuration as the another portion at the periphery thereof.

The first to third bending areas BA1, BA2, and BA3 may not overlap with each other.

The term "folded" does not mean a fixed shape but may inclusively mean a shape deformable into another shape from the original shape. The term "folded" may include a shape folded, curved, or rolled like a roll along at least one bending axis. By the first and third bending areas BA1 and BA3, side bezel widths of the display device DP in the first direction DR1 and the opposite direction of the first direction DR1 may be decreased. In addition, by the second bending area BA2, a side bezel width of the display device DP in the second direction DR2 may be decreased.

Figure 19:
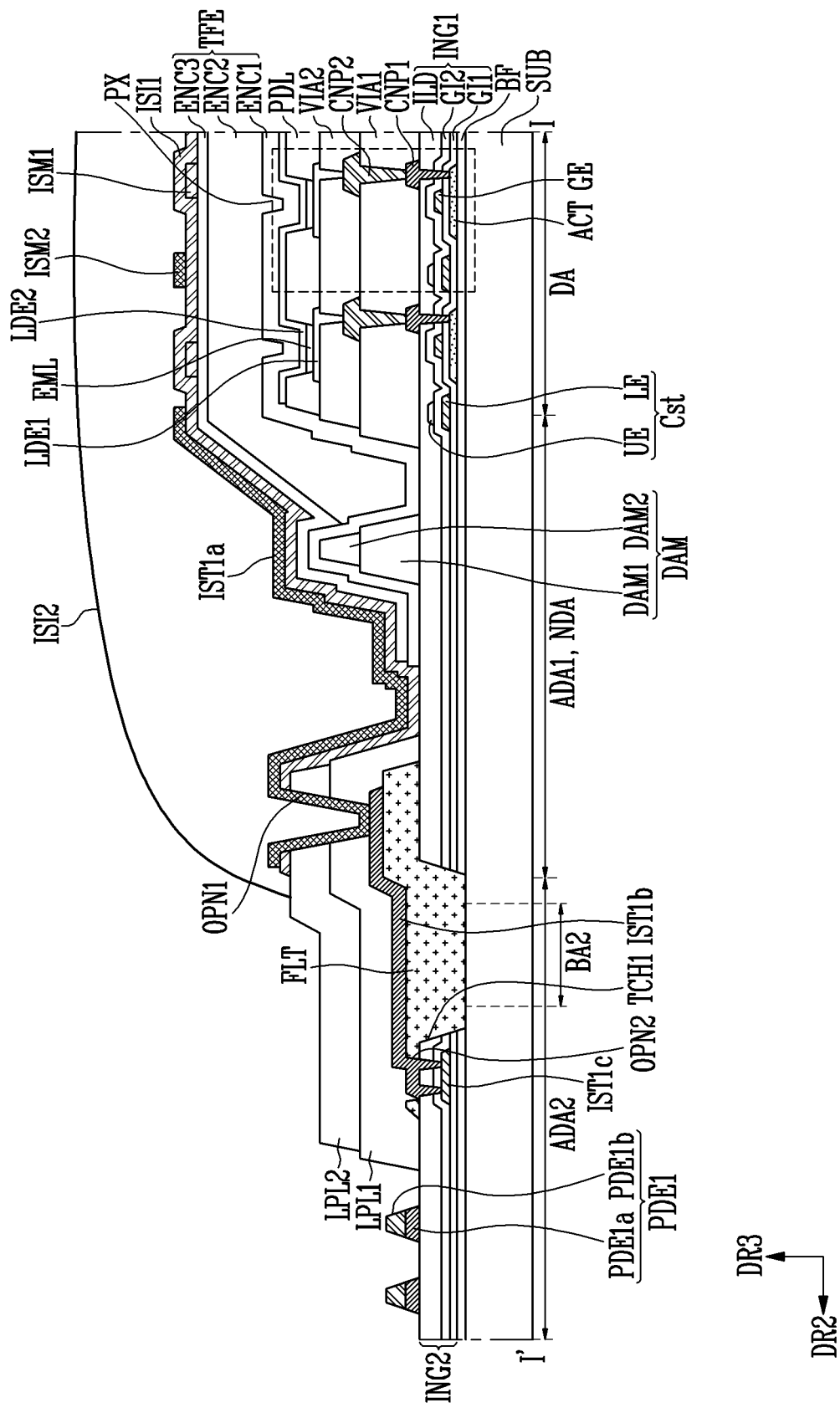

FIG. 19 is a cross-sectional view taken along line I-I' shown in FIG. 18. It is assumed that the line I-I' shown in FIG. 18 passes through the first pad PDE1 and the first sensing line IST1.

First, the display area DA will be described. In an embodiment of the disclosure, pixels PX are provided in the display area DA. Each pixel PX may include a transistor connected to a corresponding line among the display lines DST, a light emitting element connected to the transistor, and a capacitor Cst. In FIG. 19, for convenience of description, one transistor, one light emitting element, and one capacitor Cst are exemplarily illustrated with respect to one pixel PX.

The substrate SUB may include or be made of an insulative material such as glass or resin. Also, the substrate SUB may include or be made of a material having flexibility to be bendable or foldable, and have a single- or multi-layered structure.

In an embodiment, for example, the substrate SUB may include at least one selected from polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material constituting the substrate SUB may be variously changed, and the substrate SUB may include or be made of a fiber reinforced plastic (FRP), etc.

In an embodiment, for example, where the substrate SUB has a multi-layered structure, inorganic materials such as silicon nitride, silicon oxide, and silicon oxynitride may be interposed as a single layer or a multi-layer between a plurality of layers.

A buffer layer BF may cover the substrate SUB. The buffer layer BF may prevent an impurity from being diffused into a channel of the transistor. The buffer layer BF may be an inorganic insulating layer made of an inorganic material. In an embodiment, for example, the buffer layer BF may include or be formed of silicon nitride, silicon oxide, silicon oxynitride, etc. Alternatively, the buffer layer BF may be omitted according to the material and process conditions of the substrate SUB. In some embodiments, a barrier layer may be further provided.

An active layer ACT may be located on the buffer layer BF. The active layer ACT may be patterned to constitute the channel, a source electrode, and a drain electrode of the transistor or to constitute a line. The active layer ACT may include or be formed of a semiconductor material. The active layer ACT may be a semiconductor pattern including or made of poly-silicon, amorphous silicon, an oxide semiconductor, etc. The channel of the transistor is a semiconductor pattern undoped with an impurity, and may be an intrinsic semiconductor. The source electrode, the drain electrode, and the line may correspond to a semiconductor pattern doped with the impurity. The impurity may include impurities such as an n-type impurity, a p-type impurity, and other metals.

A first gate insulating layer GI1 may cover the active layer ACT. The first gate insulating layer GI1 may be an inorganic insulating layer including or made of an inorganic material. The inorganic material may include inorganic insulating materials such as polysiloxane, silicon nitride, silicon oxide, and silicon oxynitride.

A gate electrode GE of the transistor and a lower electrode LE of the capacitor Cst may be located on the first gate insulating layer GI1. The gate electrode GE may overlap with an area corresponding to the channel.

The gate electrode GE and the lower electrode LE may be made of a metal. In an embodiment, for example, the gate electrode GE may be made of at least one selected from metals such as gold (Au), silver (Ag), aluminum (Al), molybdenum (Mo), chromium (Cr), titanium (Ti), nickel (Ni), neodymium (Nd), and copper (Cu), or any alloy thereof. Also, the gate electrode GE may be formed as or defined by a single layer (i.e., have a single layer structure). However, the disclosure is not limited thereto, and the gate electrode GE may be formed as a multi-layer in which two or more material among metals and alloys are stacked one on another.

A second gate insulating layer GI2 may cover the gate electrode GE and the lower electrode LE. The second gate insulating layer GI2 may be an inorganic insulating layer including or made of an inorganic material. The inorganic material may include polysiloxane, silicon nitride, silicon oxide, silicon oxynitride, etc.

An upper electrode UE of the capacitor Cst may be located on the second gate insulating layer GI2. The upper electrode of the capacitor Cst may include or be made of a metal. In an embodiment, for example, the upper electrode UE may be made of at least one selected from metals such as gold (Au), silver (Ag), aluminum (Al), molybdenum (Mo), chromium (Cr), titanium (Ti), nickel (Ni), neodymium (Nd), and copper (Cu), or any alloy thereof. Also, the upper electrode UE may be formed as a single layer. However, the disclosure is not limited thereto, and the upper electrode UE may be formed as a multi-layer in which two or more material among metals and alloys are stacked.

Figure 20:
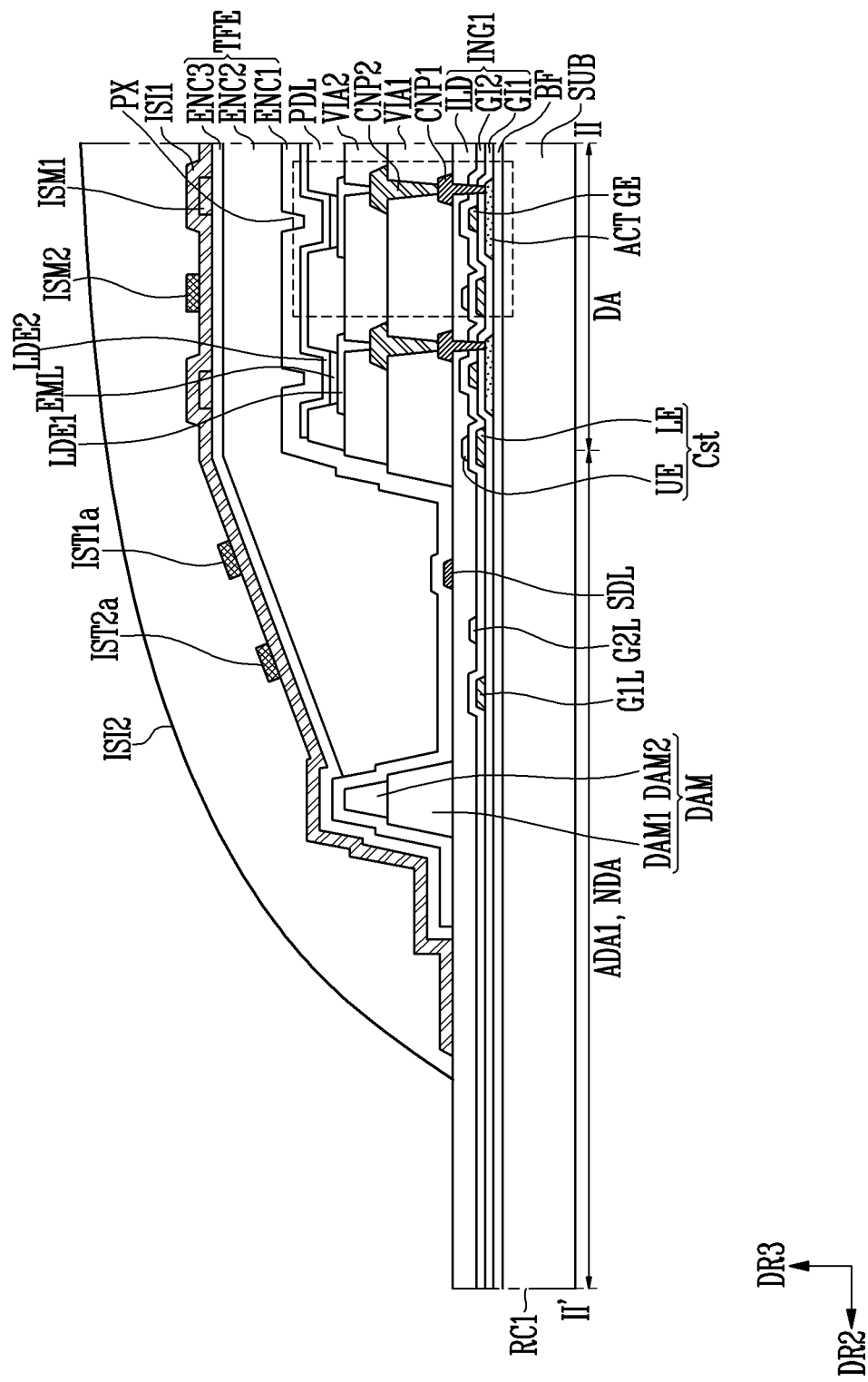

The lower electrode LE and the upper electrode UE may constitute the capacitor Cst with the second gate insulating layer GI2 interposed therebetween. In an embodiment, as shown in FIG. 20, the capacitor Cst has a two-layer electrode structure of the lower electrode LE and the upper electrode UE. However, in an alternative embodiment, the capacitor Cst may be configured in a three-layer electrode structure by using the active layer ACT, be configured in a three-layer electrode structure by using an electrode in a same layer as a first connection pattern CNP1, or be configured in a four or more-layer electrode structure.

An interlayer insulating layer ILD may cover the upper electrode UE. The interlayer insulating layer ILD may be an inorganic insulating layer including or made of an inorganic material. The inorganic material may include polysiloxane, silicon nitride, silicon oxide, silicon oxynitride, etc.

In an embodiment, for convenience of description, the first gate insulating layer GI1, the second gate insulating layer GI2, and the interlayer insulating layer ILD in the display area DA may be designated as a first insulating layer group ING1. The first insulating layer group ING1 may cover a portion of the transistor. In some embodiments, the first insulating layer group ING1 may further include the buffer layer BF.

The first connection pattern CNP1 may be located on the interlayer insulating layer ILD. The first connection pattern CNP1 may be in contact with each of the source electrode and the drain electrode of the active layer ACT through a contact hole defined or formed in the interlayer insulating layer ILD, the second gate insulating layer GI2, and the first gate insulating layer GI1.

The first connection pattern CNP1 may include or be made of a metal. In an embodiment, for example, the first connection pattern CNP1 may be made of at least one selected from metals such as gold (Au), silver (Ag), aluminum (Al), molybdenum (Mo), chromium (Cr), titanium (Ti), nickel (Ni), neodymium (Nd), and copper (Cu), or any alloy thereof.

Although not shown in the drawing, in some embodiments, a passivation layer may cover the first connection pattern CNP1. The passivation layer may be an inorganic insulating layer made of an inorganic material. The inorganic material may include polysiloxane, silicon nitride, silicon oxide, silicon oxynitride, etc.

A first via layer VIA1 may cover the passivation layer or the transistor. The first via layer VIA1 may be an organic insulating layer made of an organic material. The organic material may include an organic insulating material such as a polyacryl-based compound, a polyimide-based compound, a fluorine-based compound such as Teflon®, or a benzocyclobutene-based compound.

A second connection pattern CNP2 may be connected to the first connection pattern CNP1 through an opening of the first via layer VIA1. The second connection pattern CNP2 may include or be made of at least one selected from metals such as gold (Au), silver (Ag), aluminum (Al), molybdenum (Mo), chromium (Cr), titanium (Ti), nickel (Ni), neodymium (Nd), and copper (Cu), or any alloy thereof.

A second via layer VIA2 may cover the first via layer VIA1 and the second connection pattern CNP2. The second via layer VIA2 may be an organic insulating layer including or made of an organic material. The organic material may include an organic insulating material such as a polyacryl-based compound, a polyimide-based compound, a fluorine-based compound such as Teflon®, or a benzocyclobutene-based compound.

A first light emitting element electrode LDE1 may be connected to the second connection pattern CNP2 through an opening of the second via layer VIA2. In some embodiments, the first light emitting element electrode LDE1 may be an anode of the light emitting element.

In some embodiments, the configuration of the second via layer VIA2 and the second connection pattern CNP2 may be omitted, and the first light emitting element electrode LDE1 may be directly connected to the first connection electrode CNP1 through the opening of the first via layer VIA1.

The first light emitting element electrode LDE1 may include or be made of a metal layer such as Ag, Mg, Al, Pt, Pd, Au, Ni, Nd, Ir, Cr, or any alloy thereof, and/or a transparent conductive layer such as indium tin oxide (ITO), indium zinc oxide (IZO), zinc oxide (ZnO), or indium tin zinc oxide (ITZO). The first light emitting element electrode LDE1 may include or be made of a kind of metal. However, the disclosure is not limited thereto, and the first light emitting element electrode LDE1 may include or be made of an alloy of two or more kinds of metals, e.g., Ag and Mg.

In an embodiment where an image is to be provided in a lower direction of the substrate SUB, the first light emitting element electrode LDE1 may be formed as a transparent conductive layer. In an embodiment where an image is to be provided in an upper direction of the substrate SUB, the first light emitting element electrode LDE1 may be formed as a metal reflective layer and/or a transparent conductive layer.

A pixel defining layer PDL defining an emission area of each pixel PX is provided on the substrate SUB on which the first light emitting element electrode LDE1 and the like are formed. The pixel defining layer PDL may be an organic insulating layer including or made of an organic material. The organic material may include an organic insulating material such as a polyacryl-based compound, a polyimide-based compound, a fluorine-based compound such as Teflon®, or a benzocyclobutene-based compound.

The pixel defining layer PDL may expose a top surface of the first light emitting element electrode LDE1, and protrude from the substrate SUB along the circumference of the pixel PX. A light emitting layer EML may be provided in an area of the pixel PX surrounded by the pixel defining layer PDL.

The light emitting layer EML may include a low molecular material or a high molecular material. The low molecular material may include copper phthalocyanine (CuPc), N,N'-Di(naphthalene-1-yl)-N,N'-diphenyl-benzidine (NPB), tris-8-hydroxyquinoline aluminum (Alq3), etc. These materials may be formed through vacuum deposition. The high molecular material may include PEDOT, a poly-phenylenevinylene-based (PPV)-based material, a polyfluorene-based material, etc.

The light emitting layer EML may be provided as a single layer, but may be provided as a multi-layer including various functional layers. in an embodiment where the light emitting layer EML is provided as the multi-layer, the light emitting layer EML may have a structure in which a hole injection layer (HIL), a hole transport layer (HTL), an emission layer (EML), an electron transport layer (ETL), an electron injection layer (EIL), and the like are stacked in a single- or multi-layered structure. The light emitting layer EML may be formed through screen printing or inkjet printing, laser induced thermal imaging (LITI), etc.

In some embodiments, at least a portion of the light emitting layer EML may be integrally or commonly formed throughout a plurality of first light emitting element electrodes LDE1, and be individually provided to correspond to each of the plurality of first light emitting element electrodes LDE1.

A second light emitting element electrode LDE2 may be provided on the light emitting layer EML. The second light emitting element electrode LDE2 may be provided for each pixel PX. However, the second light emitting element LDE2 may be provided to cover most of the display area DA, and be shared by a plurality of pixels PX.

In some embodiments, the second light emitting element electrode LDE2 may be used as a cathode or an anode. In an embodiment where the first light emitting element electrode LDE1 is the anode, the second light emitting element electrode LDE2 may be used as the cathode. In an embodiment where the first light emitting element electrode LDE1 is the cathode, the second light emitting element electrode LDE2 may be used as the anode.

The second light emitting element electrode LDE2 may include or be made of a metal layer such as Ag, Mg, Al, Pt, Pd, Au, Ni, Nd, Ir, Cr, or any alloy thereof, and/or a transparent conductive layer such as indium tin oxide (ITO), indium zinc oxide (IZO), zinc oxide (ZnO), or indium tin zinc oxide (ITZO). In an embodiment of the disclosure, the second light emitting element electrode LDE2 may be configured as a multi-layer having two or more layers including a metal thin film. In an embodiment, for example, the second light emitting element electrode LDE2 may be configured as a triple layer of ITO/Ag/ITO.

In an embodiment where an image is to be provided in a lower direction of the substrate SUB, the second light emitting element electrode LDE2 may be formed as a metal reflective layer and/or a transparent conductive layer. In an embodiment where a image is to be provided in an upper direction of the substrate SUB, the first light emitting element electrode LDE1 may be formed as a transparent conductive layer.

A set of the first light emitting element electrode LDE1, the light emitting layer EML, and the second light emitting element electrode LDE2, which are described above, may collectively define or be designated as the light emitting element.

The encapsulation layer TFE may be provided over the second light emitting element electrode LDE2. The encapsulation layer TFE may be provided as a single layer, but be provided as a multi-layer. In an embodiment, the encapsulation layer TFE may be provided with or defined by first to third encapsulation layers ENC1, ENC2, ENC3. The first to third encapsulation layers ENC1, ENC2, and ENC3 may include or be made of an organic material and/or an inorganic material. The third encapsulation layer ENC3 located at an outermost portion of the encapsulation layer TFE may include or be made of an inorganic material. In an embodiment, for example, the first encapsulation layer ENC1 may be an inorganic layer including or made of an inorganic material, the second encapsulation layer ENC2 may be an organic layer including or made of an organic material, and the third encapsulation layer ENC3 may be an inorganic layer including or made of an inorganic material. As compared with the organic material, moisture or oxygen less penetrates into the inorganic material, but the inorganic material is weak to cracks due to its low flexibility. The first encapsulation layer ENC1 and the third encapsulation layer ENC3 include or are formed of an inorganic material, and the second encapsulation layer ENC2 includes or is formed of an organic material, so that the propagation of cracks may be prevented. The layer made of the organic material, i.e., the second encapsulation layer ENC2 may be completely covered by the third encapsulation layer ENC3 such that an end portion of the second encapsulation layer ENC2 is not exposed to the outside. The organic material may include organic insulating materials such as a polyacryl-based compound, a polyimide-based compound, a fluorine-based compound such as Teflon®, and a benzocyclobutene-based compound. The inorganic material may include inorganic insulating materials such as polysiloxane, silicon nitride, silicon oxide, and silicon oxynitride.

The light emitting layer EML constituting the light emitting element may be easily damaged by moisture, oxygen or the like from the outside. The encapsulation layer TFE covers the light emitting layer EML, to protect the light emitting layer EML. The encapsulation layer TFE may cover the display area DA, and extend up to the non-display area NDA as the outside of the display area DA. In the case of insulating layers made of an organic material, the insulating layers are advantageous in terms of flexibility, elasticity, and the like, but moisture or oxygen easily penetrates into the insulating layers, as compared with insulating layers made of an inorganic material. In an embodiment of the disclosure, end portions of the insulating layers including or made of the organic material may be covered by the insulating layers including or made of the inorganic material to prevent penetration of moisture or oxygen through the insulating layers made of the organic material. In an embodiment, for example, the first via layer VIA1, the second via layer VIA2, and the pixel defining layer PDL, which are made of an organic material, do not continuously extend, and may be covered by the first encapsulation layer ENC1. Accordingly, a top surface of the pixel defining layer PDL and side surfaces of the first via layer VIA1, the second via layer VIA2, and the pixel defining layer PDL are encapsulated by the encapsulation layer TFE including an inorganic material, so that exposure to the outside may be prevented.

However, whether the encapsulation layer TFE is provided as a multi-layer or the material of the encapsulation layer TFE is not limited thereto, and may be variously changed. In an embodiment, for example, the encapsulation layer TFE may include a plurality of organic material layers and a plurality of inorganic material layers, which are alternately stacked one on another.

A first sensing electrode layer ISM1 may be located on the encapsulation layer TFE. In some embodiments, an additional buffer layer may be located between the first sensing electrode layer ISM1 and the encapsulation layer TFE. The first sensing electrode layer ISM1 may be configured as a metal layer including Ag, Mg, Al, Pt, Pd, Au, Ni, Nd, Ir, Cr, etc., and/or a transparent conductive layer including indium tin oxide (ITO), indium zinc oxide (IZO), zinc oxide (ZnO), indium tin zinc oxide (ITZO), etc.

A first sensing insulating layer ISI1 may be located over the first sensing electrode layer IMS1. The first sensing insulating layer ISM may be an inorganic insulating layer including or made of an inorganic material. The inorganic material may include inorganic insulating materials such as polysiloxane, silicon nitride, silicon oxide, and silicon oxynitride.

A second sensing electrode layer ISM2 may be located on the first sensing insulating layer ISM. The second sensing electrode layer ISM2 may be configured as a metal layer including Ag, Mg, Al, Pt, Pd, Au, Ni, Nd, Ir, Cr, etc., and/or a transparent conductive layer including indium tin oxide (ITO), indium zinc oxide (IZO), zinc oxide (ZnO), indium tin zinc oxide (ITZO), etc.

Various input sensing units may be configured using the first sensing electrode layer ISM1, the first sensing insulating layer ISM, and the second sensing electrode layer ISM2, which will be described later with reference to FIGS. 21 to 23.

In an embodiment, as shown in FIG. 19, the second sensing electrode layer ISM2 may be patterned to constitute a first pattern IST1a of the first sensing line IST1.

A second sensing insulating layer ISI2 may be located over the second sensing electrode layer ISM2. The second sensing insulating layer ISI2 may be configured as an organic layer. In an embodiment, for example, the organic material may include an organic insulating material such as a polyacryl-based compound, a polyimide-based compound, a fluorine-based compound such as Teflon®, or a benzocyclobutene-based compound. For example, the second sensing insulating layer ISI2 may include polymethyl methacrylate, polydimethylsiloxane, polyimide, acrylate, polyethylene terephthalate, polyethylene naphthalate, etc.

Next, the non-display area NDA, the first additional area ADA1, and the second additional area ADA2 will be described. Distinguishing of the non-display area NDA and the first additional area ADA1 on a section shown in FIG. 27 is not any characteristic, and therefore, the non-display area NDA and the first additional area ADA1 are described without distinguishing the non-display area NDA and the first additional area ADA1 from each other. Hereinafter, in description of the non-display area NDA and the second additional area ADA2, any repetitive detailed descriptions of the same or like elements as those in the display area DA described above will be omitted or simplified.

A dam DAM may be located at a boundary of the second encapsulation layer ENC2. In an embodiment, for example, the dam DAM may be located between a planarization layer FLT and the second encapsulation layer ENC2. The dam DAM may have a double-layered structure. In an embodiment, for example, the dam DAM may include a first dam DAM1 and a second dam DAM2. In an embodiment, for example, the first and second dams DAM1 and DAM2 may be made of an organic material. Each of the first and second dams DAM1 and DAM2 may correspond to any one of the first via layer VIA1, the second via layer VIA2, and the pixel defining layer PDL. In an embodiment, for example, where the first dam DAM1 is formed of a same material as the first via layer VIA1 through a same process as the first via layer VIA1, the second dam DAM2 may be formed of a same material as the second via layer VIA2 or the pixel defining layer PDL through a same process as the second via layer VIA2 or the pixel defining layer PDL. In an alternative embodiment, for example, where the first dam DAM1 is formed of the same material as the second via layer VIA2 through a same process as the second via layer VIA2, the second dam DAM2 may be formed of a same material as the pixel defining layer PDL through a same process as the pixel defining layer PDL. In an embodiment, where a spacer is formed on the pixel defining layer of the display area DA, the dam DAM may be formed by using a same material as the spacer. Here, when two elements are formed of a same material through a same process, the two elements may include a same material as each other, and disposed in a same layer as each other.

The dam DAM prevents the organic material of the second encapsulation layer ENC2 having strong liquidity from overflowing to the outside of the dam DAM. The first and third encapsulation layers ENC1 and ENC3, which include or are made of the inorganic material, extend while covering the data DAM, so that adhesion of the first and third encapsulation layers ENC1 and ENC3 with the substrate SUB or other layers on the top of the substrate SUB.

A first pad PDE1 is located on the substrate SUB, and may be spaced apart from the planarization layer FLT. The first pad PDE1 may be supported by a second insulating layer group ING2. Insulating layers of the second insulating layer group ING2 may respectively correspond to those of the first insulating layer group ING1. The first pad PDE1 may include a first pad electrode PDE1a and a second pad electrode PDE1b. The first pad electrode PDE1a may include or be made of a same material as the first connection pattern CNP1. The second pad electrode PDE1b may include or be made of a same material as the second connection pattern CNP2.

The planarization layer FLT is located on the substrate SUB, and may be spaced apart from an area covered by the encapsulation layer TFE. The planarization layer FLT may be an organic insulating layer including or made of an organic material. The organic material may include an organic insulating material such as a polyacryl-based compound, a polyimide-based compound, a fluorine-based compound such as Teflon®, or a benzocyclobutene-based compound.

In an embodiment, the planarization layer FLT may be formed before the first connection pattern CNP1 is formed after the interlayer insulating layer ILD is formed. Therefore, the planarization layer FLT and the first via layer VIA1 may be formed through different processes from each other. In some embodiments, the planarization layer FLT and the first via layer VIA1 may include different organic materials from each other.

One end of the planarization layer FLT may cover the first insulating layer group ING1. In addition, a portion of the planarization layer FLT corresponding to the second banding area BA2 may fill a first trench TCH1 between the first insulating layer group ING1 and the second insulating layer group ING2.

Since inorganic insulating layers have high hardness and small flexibility, as compared with organic insulating layers, the probability that cracks will occur in the inorganic insulating layers is relatively high. When cracks occur in the inorganic insulating layers, the cracks may propagate to lines on the inorganic insulating layers. As a result, a failure such as line disconnection may occur.

Accordingly, in an embodiment, as shown in FIG. 19, the inorganic insulating layers are removed in the second bending area BA2 to form the first trench TCH1, and the first insulating layer group ING1 and the second insulating layer group ING2 may be distinguished from each other. In an embodiment, as shown in FIG. 19, all inorganic insulating layers corresponding to the area of the first trench TCH1 may be removed. However, in an alternative embodiment, some inorganic insulating layers may remain. The some remaining inorganic insulating layers may include a slit, so that bending stress may be dispersed.

A second pattern IST1b of the first sensing line IST1 may extend on the planarization layer FLT, and be electrically connected to the first pad PDE1. In an embodiment, the second pattern IST1b may be formed of a same material as the first connection pattern CNP1 through a same process as the first connection pattern CNP1.

A first line protective layer LPL1 may cover the planarization layer FLT and the second pattern IST1b. In addition, a second line protective layer LPL2 may cover the first line protective layer LPL1. In some embodiments, the configuration of the second line protective layer LPL2 may be omitted. The first and second line protective layers LPL1 and LPL2 may include or be made of an organic material. Each of the first and second line protective layers LPL1 and LPL2 may correspond to any one of the first via layer VIA1, the second via layer VIA2, and the pixel defining layer PDL. In an embodiment, for example, when the first line protective layer LPL1 is formed of a same material as the first via layer VIA1 through a same process as the first via layer VIA1, the second line protective layer LPL2 may be formed of a same material as the second via layer VIA2 or the pixel defining layer PDL through a same process as the second via layer VIA2 or the pixel defining layer PDL. In an alternative embodiment, for example, where the first line protective layer LPL1 is formed of the same material as the second via layer VIA2 through the same process as the second via layer VIA2, the second line protective layer LPL2 may be formed of a same material as the pixel defining layer PDL through a same process as the pixel defining layer PDL.

In an embodiment, a first opening OPN1 may be defined through the first and second line protective layers LPL1 and LPL2 and the first sensing insulating layer ISI1 to expose the second pattern IST1b.

The first pattern IST1a may be connected to the second pattern IST1b through the first opening OPN1. In such an embodiment, a height of the second pattern IST1b located on one end of the first insulating layer group ING1 and the planarization layer FLT may be greater than that of the second pattern IST1b located on the planarization layer FLT corresponding to the first trench TCH1.

Thus, the first pattern IST1a and the second pattern IST1b may be directly connected to each other without another bridge pattern. Since the bridge pattern does not exist, connection reliability between the first pattern IST1a and the second pattern IST1b is improved. Further, the length of the non-display area NDA may be decreased by the length of the bridge pattern. Accordingly, a dead space may be decreased, and a thin bezel may be easily implemented.

A third pattern IST1c of the first sensing line IST1 may connect the first pad PDE1 and the second pattern IST1b to each other. The third pattern IST1c may be formed of a same material as the gate electrode GE of the transistor through a same process as the gate electrode GE of the transistor. In some embodiments, the third pattern IST1c may be formed of a same material as the upper electrode UE through a same process as the upper electrode UE. In some embodiments, an odd-numbered third pattern IST1c may be formed of a same material as the gate electrode GE of the transistor through a same process as the gate electrode GE of the transistor, and an even-numbered third pattern IST1c may be formed of a same material as the upper electrode UE through a same process as the upper electrode UE. In such an embodiment, the even-numbered third pattern IST1c may be formed of a same material as the gate electrode GE of the transistor through a same process as the gate electrode GE of the transistor, and the odd-numbered third pattern IST1c may be formed of a same material as the upper electrode UE through a same process as the upper electrode UE. Accordingly, the problem of a short circuit between adjacent lines may be more efficiently prevented.

The second insulating layer group ING2 may include a second opening OPN2 exposing the third pattern IST1c. In addition, an opening corresponding to the second opening OPN2 may be defined through the planarization layer FLT. The second pattern IST1b may be connected to the third pattern IST1c though the second opening OPN2.

FIG. 20 is a cross-sectional view taken along line II-II' shown in FIG. 18.

The line II-II' shown in FIG. 18 may correspond to the first bending axis BX1. However, the features described below may be applied to not only the first side surface RC1 but also the second side surface RC2.

The display lines DST may be configured as a single-layered line or a multi-layered line by using at least one of lines G1L, G2L, and SDL. The line G1L may be formed of a same material as the gate electrode GE through a same process as the gate electrode GE. The line G2L may be formed of a same material as the upper electrode UE through a same process as the upper electrode UE. The line SDL may be formed of a same material as the first connection pattern CNP1 through a same process as the first connection pattern CNP1.

The patterns IST1a and IST2a of the sensing lines IST1 and IST2 are located on the encapsulation layer TFE and the first sensing insulating layer ISI1 (with respect to the third direction DR3), and may be located between the dam DAM and the display area DA (with respect to the second direction DR2). The first sensing insulating layer ISM may be located between the encapsulation layer TFE and the sensing lines IST1 and IST2.

Figure 21:
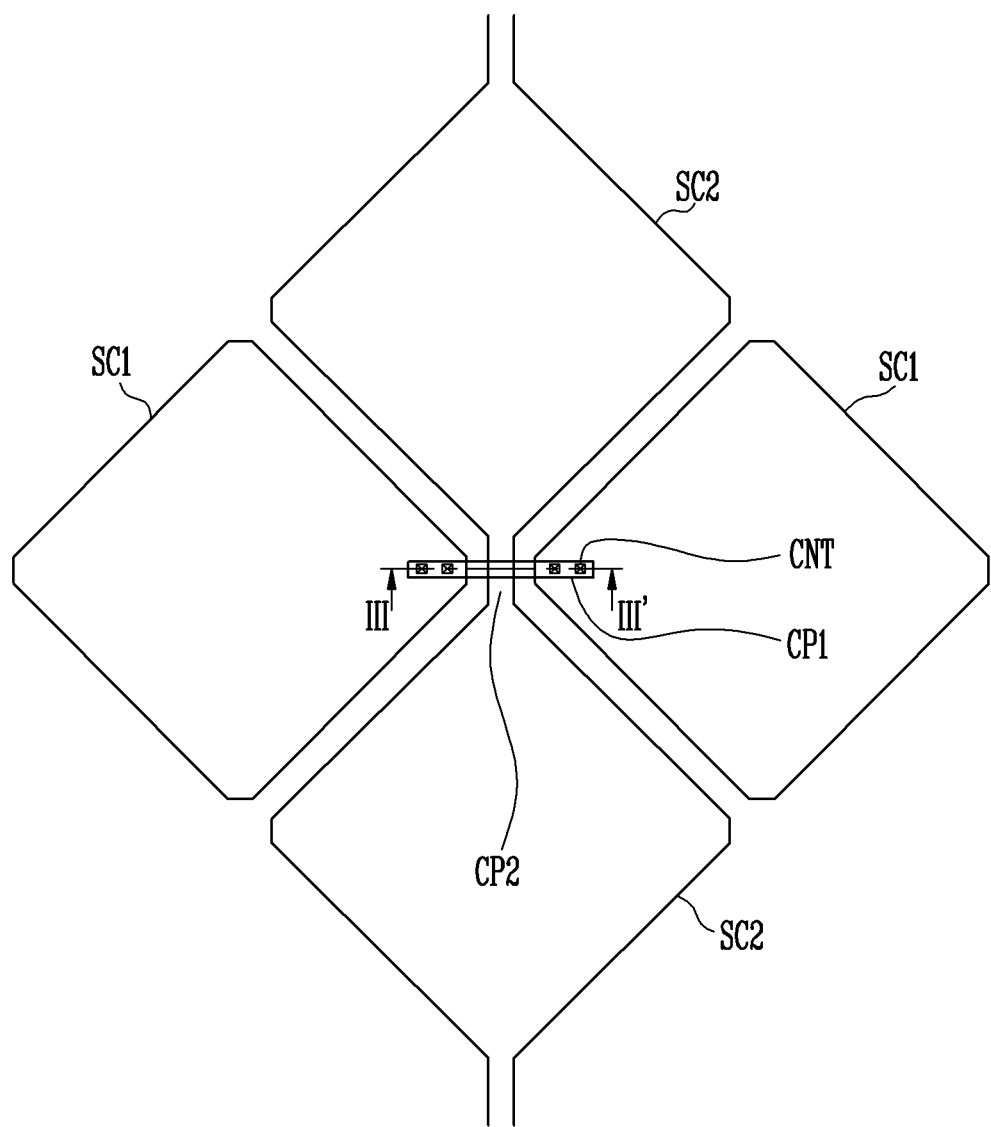
Figure 22:
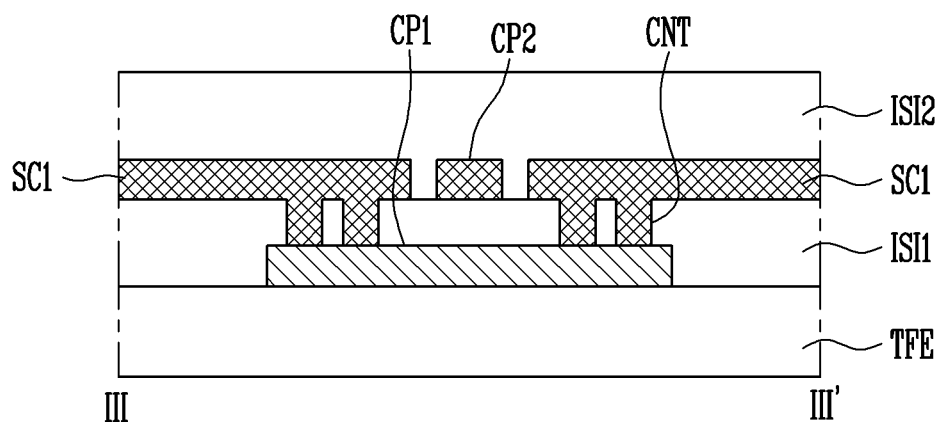

FIGS. 21 and 22 are views illustrating sensing electrodes and bridge electrodes in accordance with an embodiment of the disclosure. FIG. 22 is a cross-sectional view taken along line III-III' shown in FIG. 21.

Bridge electrodes CP1 may be located on the encapsulation layer TFE by patterning the first sensing electrode layer ISM1.

The first sensing insulating layer ISM covers the bridge electrodes CP1, and contact holes CNT are defined through the first sensing insulating layer ISI1 to expose some of the bridge electrodes CP1.

First sensing electrodes SC1 and second sensing electrodes SC2 may be formed on the first sensing insulating layer ISM by patterning the second sensing electrode layer ISM2. The first sensing electrodes SC1 may be connected to the bridge electrode CP1 through the contact holes CNT.

The second sensing electrodes SC2 may have a connection pattern CP2 in a same layer by patterning the second sensing electrode layer ISM2. Therefore, any separate bridge electrode may be unnecessary when the second sensing electrodes SC2 are connected to each other.

In some embodiments, each of the sensing electrodes SC1 and SC2 may cover a plurality of pixels PX. In an embodiment where each of the sensing electrodes SC1 and SC2 is configured as an opaque conductive layer, each of the sensing electrodes SC1 and SC2 may include a plurality of openings capable of exposing the plurality of pixels PX covered thereby. In an embodiment, for example, each of the sensing electrodes SC1 and SC2 may be configured in a mesh form. In an embodiment where each of the sensing electrodes SC1 and SC2 is configured as a transparent conductive layer, each of the sensing electrodes SC1 and SC2 may be configured in the form of a plate which does not any opening.

Figure 23:
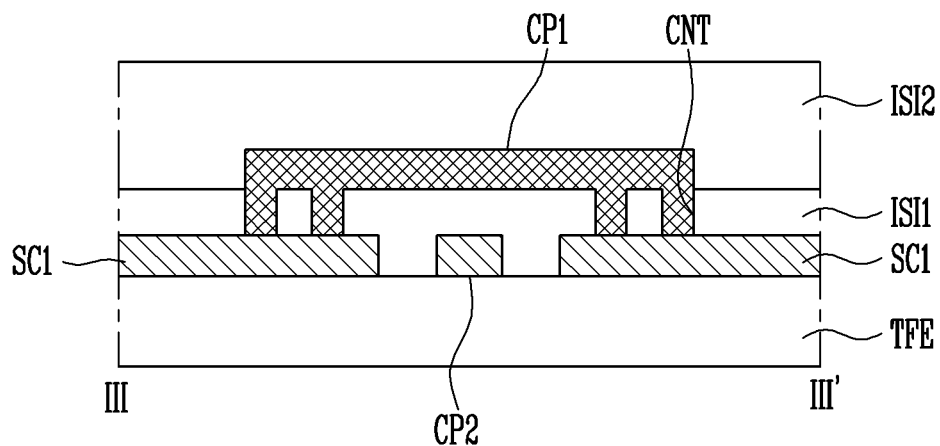

FIG. 23 is a view illustrating sensing electrodes and bridge electrodes in accordance with an alternative embodiment of the disclosure.

FIG. 23 is a cross-sectional view corresponding to FIG. 22.

First sensing electrodes SC1 and second sensing electrodes SC2 may be located on the encapsulation layer TFE by patterning the first sensing electrode layer ISM1.

The first sensing insulating layer ISM covers the first sensing electrodes SC1 and the second sensing electrodes SC2, and contact holes CNT may be defined through the first sensing insulating layer ISM to expose some of the first and second sensing electrodes SC1 and SC2.

Bridge electrodes CP1 may be located on the first sensing insulating layer ISM by patterning the second sensing electrode layer ISM2. The bridge electrodes CP1 may be connected to the first sensing electrodes SC1 through the contact holes CNT.

Figure 24:
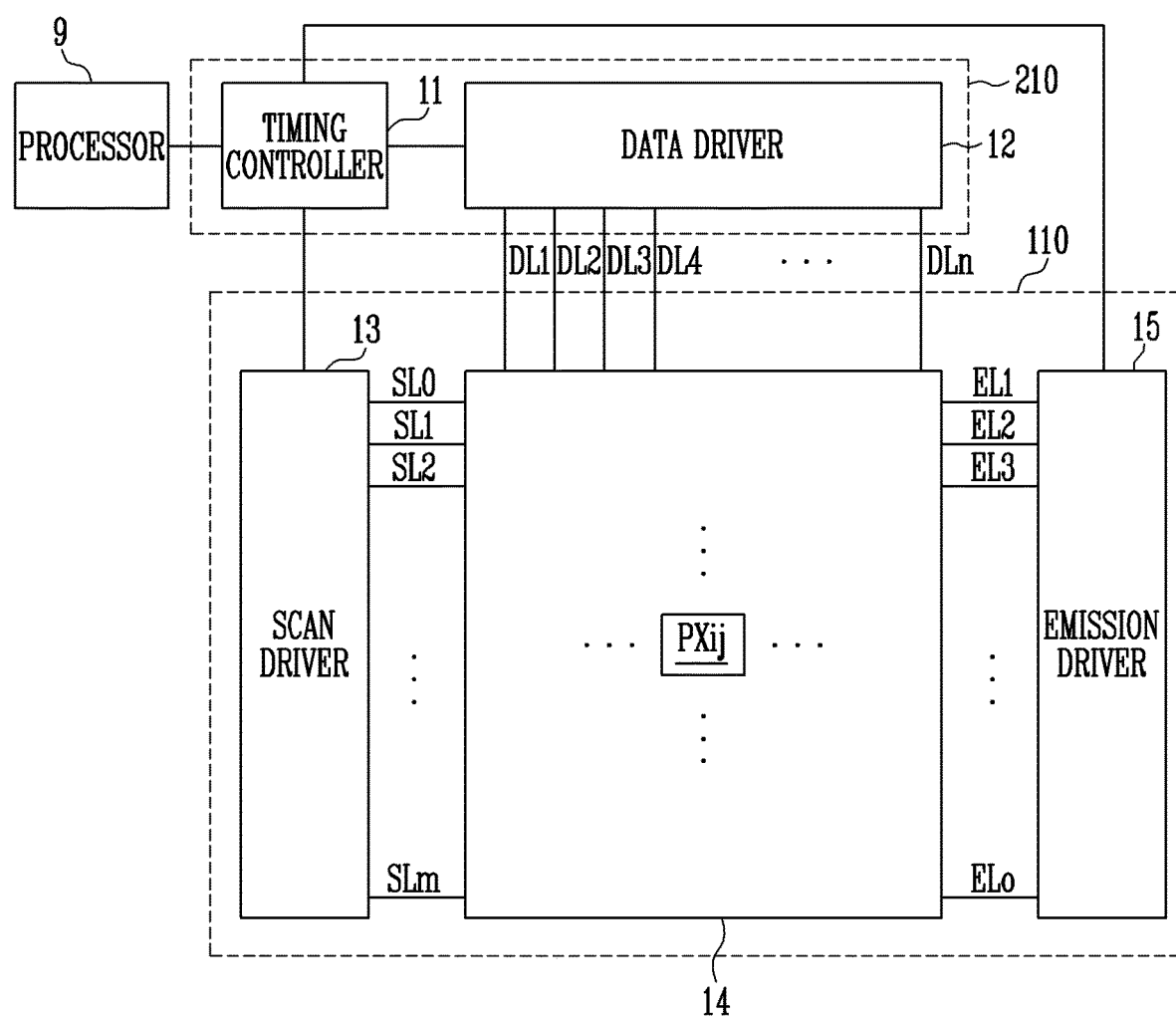
FIGS. 24 to 26 are diagrams illustrating a display device including a pixel in accordance with alternative embodiments of the disclosure.
Figure 25:
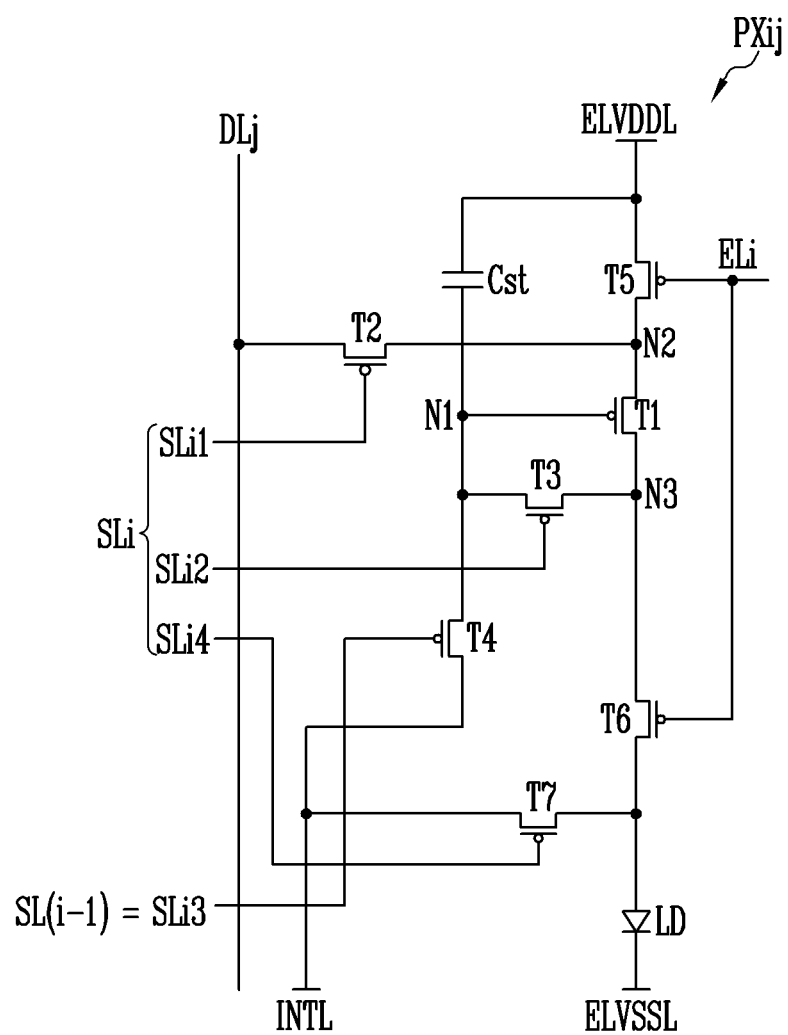

FIGS. 24 to 26 are diagrams illustrating a display device including a pixel in accordance with alternative embodiment of the disclosure.

FIG. 24 is a diagram illustrating a display unit and a display driver in accordance with an embodiment of the disclosure.

Referring to FIG. 24, an embodiment of the display driver 210 may include a data driver 12 and a timing controller 11, and the display unit 110 may include a scan driver 13, a pixel unit 14, and an emission driver 15. However, as described above, whether functional units may be variously configured (e.g., integrated in one IC, to be integrated in a plurality of ICs, or to be mounted on the display substrate 111) according to specifications of the display device 1.

The timing controller 11 may receive grayscales for each display frame period and timing signals from a processor 9. The processor 9 may correspond to at least one selected from a graphics processing unit (GPU), a central processing unit (CPU), an application processor (AP), and the like. The timing signals may include a vertical synchronization signal, a horizontal synchronization signal, a data enable signal, and the like.

Each cycle of the vertical synchronization signal may correspond to each display frame period. Each cycle of the horizontal synchronization signal may correspond to each horizontal period. The grayscales may be supplied by using a horizontal line as a unit in each horizontal period, corresponding to a pulse having an enable level of the data enable signal. The horizontal line may mean pixels (e.g., a pixel row) connected to a same scan line and a same emission line.

The timing controller 11 may render grayscales to correspond to the specifications of the display device 1. In an embodiment, for example, the processor 9 may provide a red grayscale, a green grayscale, and a blue grayscale with respect to each unit dot. In an embodiment, for example, where the pixel unit 14 has a RGB stripe structure, pixels may correspond one-to-one to the respective grayscales without rendering the grayscales. In an alternative embodiment, for example, where the pixel unit 14 has a PENTILE™ structure, adjacent unit dots share a pixel with each other, and hence the pixels may not correspond one-to-one to the respective grayscales. In such an embodiment, the grayscales may be rendered. Grayscales which are rendered or are not rendered may be provided to the data driver 12. Also, the timing controller 11 may provide a data control signal to the data driver 12. Also, the timing controller 11 may provide a scan control signal to the scan driver 13, and provide an emission control signal to the emission driver 15.

The data driver 12 may generate data voltages (i.e., data signals) to be provided to data lines DL1, DL2, DL3, DL4, . . . , and DLn by using the grayscales and the data control signal, which are received from the timing controller 11. Here, n may be an integer greater than 0.

The scan driver 13 may generate scan signals to be provided to scan lines SL0, SL1, SL2, . . . , and SLm by using a scan control signal (e.g., a clock signal, a scan start signal, and the like) received from the timing controller 11. The scan driver 13 may sequentially supply the scan signals having a pulse of a turn-on level to the scan lines SL0 to SLm. The scan driver 13 may include scan stages configured in the form of shift registers. The scan driver 13 may generate the scan signals in a manner that sequentially transfers the scan start signal in the form of a pulse of the turn-on level to a next scan stage under the control of the clock signal. Here, m may be an integer greater than 0.

The emission driver 15 may generate emission signals to be provided to emission lines EL1, EL2, EL3, . . . , ELo by using an emission control signal (e.g., a clock signal, an emission stop signal, and the like) received from the timing controller 11. The emission driver 15 may sequentially supply the emission signals having a pulse of a turn-off level to the emission lines EL1 to ELo. The emission driver 15 may include emission stages configured in the form of shift registers. The emission driver 15 may generate the emission signals in a manner that sequentially transfers the emission stop signal in the form of a pulse of the turn-off level to a next emission stage under the control of the clock signal. Here, o may be an integer greater than 0.

The pixel unit 14 includes pixels. Each pixel PXij may be connected to a corresponding data line, a corresponding scan line, and a corresponding emission line. The pixels may include pixels emitting light of a first color, pixels emitting light of a second color, and pixels emitting light of a third color. The first color, the second color, and the third color may be different colors. In an embodiment, for example, the first color may be one color among red, green, and blue, the second color may be one color except the first color among red, green, and blue, and the third color may be the other color except the first color and the second color among red, green, and blue. In an alternative embodiment, magenta, cyan, and yellow instead of red, green, and blue may be used as the first to third colors.

FIG. 25 is a diagram illustrating a pixel in accordance with an embodiment of the disclosure.

Referring to FIG. 25, an embodiment of the pixel PXij may include transistors T1, T2, T3, T4, T5, T6, and T7, a storage capacitor Cst, and a light emitting element LD.

Hereinafter, an embodiment where a circuit is implemented with a P-type transistor will be described. However, those skilled in the art may design a circuit implemented with an N-type transistor by changing the polarity of a voltage applied to a gate terminal. Similarly, those skilled in the art may design a circuit implemented with a combination of the P-type transistor and the N-type transistor. The P-type transistor refers to a transistor in which an amount of current flowing when the difference in voltage between a gate electrode and a source electrode increases in a negative direction increases. The N-type transistor refers to a transistor in which an amount of current flowing when the difference in voltage between a gate electrode and a source electrode increases in a positive direction increases. The transistor may be configured in various forms including a thin film transistor (TFT), a field effect transistor (FET), a bipolar junction transistor (BJT), and the like.

A gate electrode of the first transistor T1 may be connected to a first node N1, a first electrode of the first transistor T1 may be connected to a second node N2, and a second electrode of the first transistor T1 may be connected to a third node N3. The first transistor T1 may be referred to as a driving transistor.

A gate electrode of a second transistor T2 may be connected to a scan line SLi1, a first electrode of the second transistor T2 may be connected to a data line DLj, and a second electrode of the second transistor T2 may be connected to the second node N2. The second transistor T2 may be referred to as a scan transistor.

A gate electrode of a third transistor T3 may be connected to a scan line SLi2, a first electrode of the third transistor T3 may be connected to the first node N1, and a second electrode of the third transistor T3 may be connected to the third node N3. The third transistor T3 may be referred to as a diode connection transistor.

A gate electrode of a fourth transistor T4 may be connected to a scan line SLi3, a first electrode of the fourth transistor T4 may be connected to the first node N1, and a second electrode of the fourth transistor T4 may be connected to an initialization line INTL. The fourth transistor T4 may be referred to as a gate initialization transistor.

A gate electrode of the fifth transistor T5 may be connected to an ith emission line ELi, a first electrode of the fifth transistor T5 may be connected to a first power line ELVDDL, and a second electrode of the fifth transistor T5 may be connected to the second node N2. The fifth transistor T5 may be referred to as an emission transistor. In another embodiment, the gate electrode of the fifth transistor T5 may be an emission line different from that connected to a gate electrode of a sixth transistor T6.

The gate electrode of the sixth transistor T6 may be connected to the ith emission line ELi, a first electrode of the sixth transistor T6 may be connected to the third node N3, and a second electrode of the sixth transistor T6 may be connected to an anode of the light emitting element LD. The sixth transistor T6 may be referred to as an emission transistor. In an alternative embodiment, the gate electrode of the sixth transistor T6 may be connected to an emission line different from that connected to the gate electrode of the fifth transistor T5.

A gate electrode of a seventh transistor T7 may be connected to a scan line SLi4, a first electrode of the seventh transistor T7 may be connected to an initialization line INTL, and a second electrode of the seventh transistor T7 may be connected to the anode of the light emitting element LD. The seventh transistor T7 may be referred to as a light emitting element initialization transistor.

A first electrode of the storage capacitor Cst may be connected to the first power line ELVDDL, and a second electrode of the storage capacitor Cst may be connected to the first node N1.

The anode of the light emitting element LD may be connected to the second electrode of the sixth transistor T6, and a cathode of the light emitting element LD may be connected to a second power line ELVSSL. The light emitting element LD may be a light emitting diode. The light emitting element LD may be configured as an organic light emitting diode, an inorganic light emitting diode, a quantum dot/well light emitting diode, or the like. The light emitting element LD may emits line of any one color among a first color, a second color, and a third color. In an embodiment, as shown in FIG. 25, only a single light emitting element LD may be provided in each pixel. However, in an alternative embodiment, a plurality of light emitting elements may be provided in each pixel. The plurality of light emitting elements may be connected to each other in series, parallel, series/parallel, or the like.

A first power voltage may be applied to the first power line ELVDDL, a second power voltage may be applied to the second power line ELVSSL, and an initialization voltage may be applied to the initialization line INTL. In an embodiment, for example, the first power voltage may be higher than the second power voltage. In an embodiment, for example, the initialization voltage may be equal to or higher than the second power voltage. In an embodiment, for example, the initialization voltage may correspond to a data voltage having the smallest magnitude among magnitudes of data voltages which may be provided. In an alternative embodiment, for example, the magnitude of the initialization voltage may be smaller than those of the data voltages which may be provided.

FIG. 26 is a diagram illustrating an exemplarily driving method of the pixel shown in FIG. 25.

Hereinafter, for convenience of description, it is assumed that the scan lines SLi1, SLi2, and SLi4 correspond to an i-th scan line SLi, and the scan line SLi3 is an (i−1)-th scan line SL(i−1). However, in some embodiments, a connection relationship between the scan lines SLi1, SLi2, SLi3, and SLi4 may be diverse. In an alternative embodiment, for example, the scan line SLi4 may be an (i−1)-th scan line or an (i+1)-th scan line.

First, an emission signal having a turn-off level (logic high level) is applied to the ith emission line ELi, a data voltage DATA(i−1)j for an (i−1)t pixel is applied to the data line DLj, and a scan signal having a turn-on level (logic low level) is applied to the scan line SLi3. High/low of a logic level may be changed according to whether a transistor is of a P-type or an N-type.

Since a scan signal having the turn-off level is applied to the scan lines SLi1 and SLi2, the second transistor T2 is in a turn-off state, and the data voltage DATA(i−1)j for the (i−1)-th pixel is prevented from being input to the pixel PXij.

Since the fourth transistor T4 is in a turn-on state, the first node N1 is connected to the initialization line INTL, so that a voltage of the first node N1 is initialized. Since the emission signal having the turn-off level is applied to the emission line ELi, the transistors T5 and T6 are in the turn-off state, and unnecessary emission of the light emitting element LD in a process of applying the initialization voltage is prevented.

Next, a data voltage DATAij for an ith pixel PXij is applied to the data line DLj, and the scan signal having the turn-on level is applied to the scan lines SLi1 and SLi2. Accordingly, the transistors T2, T1, and T3 are in a conduction state, and the data line DLj and the first node N1 are electrically connected to each other. Therefore, a compensation voltage obtained by subtracting a threshold voltage of the first transistor T1 from the data voltage DATAij is applied to the second electrode of the storage capacitor Cst (i.e., the first node N1), and the storage capacitor Cst maintains a voltage corresponding to the difference between the first power voltage and the compensation voltage. Such a period may be referred to as a threshold voltage compensation period or a data write period.

In addition, when the scan line SLi4 is an ith scan line, the seventh transistor T7 is in the turn-on state. Hence, the anode of the light emitting element LD and the initialization line INTL are connected to each other, and the light emitting element LD is initialized to a charge amount corresponding to the voltage difference between the initialization voltage and the second power voltage.

Subsequently, since the emission signal having the turn-on level is applied to the ith emission line ELi, the transistors T5 and T6 may be electrically connected to each other. Therefore, a driving current path is formed, through which the first power line ELVDDL, the fifth transistor T5, the first transistor T1, the sixth transistor T6, the light emitting element LD, and the second power line ELVSSL are connected to each other.

An amount of driving current flowing through the first electrode and the second electrode of the first transistor T1 is adjusted according to the voltage maintained in the storage capacitor Cst. The light emitting element LD emits light with a luminance corresponding to the amount of driving current. The light emitting element LD emits light until before the emission signal having the turn-off level is applied to the emission line ELi.

When an emission signal has the turn-on level, pixels receiving the corresponding emission signal may be in a display state. Therefore, the period in which the emission signal has the turn-on level may be referred to as an emission period EP (or emission allow period). In addition, when an emission signal has the turn-off level, pixels receiving the corresponding emission signal may be in a non-display state. Therefore, the period in which the emission signal has the turn-off level may be referred to as a non-emission period NEP (or emission inhibit period).

The non-emission period NEP described in FIG. 26 is used to prevent the pixel PXij from emitting light with an undesired luminance while passing through the initialization period and the data write period.

One or more non-emission periods NEP may be additionally provided while data written to the pixel PXij is maintained (e.g., one frame period). This is for the purpose of reducing the emission period EP of the pixel PXij, thereby effectively expressing a low grayscale or gently blurring motion of an image.

In embodiments of the band pass filter and the sensor device including the band pass filter in accordance with the disclosure, since parameters may be determined based on a capacitance ratio of capacitors, without any mismatch, and the band pass filter may be implemented with a single amplifier.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A sensor device comprising:
   first sensors;
   second sensors which form capacitances with the first sensors;
   a sensor transmitter connected to the first sensors, wherein the sensor transmitter supplies driving signals to the first sensors; and
   a sensor receiver connected to the second sensors, wherein the sensor receiver receives sensing signals from the second sensors, and the sensor receiver includes a band pass filter which filters the sensing signals,
   wherein the band pass filter includes:
   a first integrator including a first amplifier;
   a first high pass filter converter connected to a first input terminal, a second input terminal and a first output terminal of the first amplifier, wherein the first high pass filter converter time-divisionally provides N high pass filter conversion paths, wherein N is an integer greater than 1; and
   a first gain auxiliary component connected to the first input terminal and the first output terminal of the first amplifier while the first integrator performs an integral function in a shorter cycle than a cycle in which at least one of the N high pass filter conversion paths is provided, and
   wherein the first gain auxiliary component includes an auxiliary capacitor.

2. The sensor device of claim 1,
   wherein the N high pass filter conversion paths include a first high pass filter conversion path, and
   wherein a cycle in which the first integrator performs the integral function is shorter than a cycle in which the first high pass filter conversion path is provided.

3. The sensor device of claim 2, wherein the cycle in which the first integrator performs the integral function is 1/N of the cycle in which the first high pass filter conversion path is provided.

4. The sensor device of claim 1,
   wherein the first integrator includes a first input capacitor, and
   wherein, while the first integrator performs the integral function, the first input capacitor is connected between a first input terminal of the band pass filter and the first input terminal of the first amplifier, and the first integration capacitor is connected between the first input terminal and the first output terminal of the first amplifier.

5. The sensor device of claim 4,
   wherein the first high pass filter converter includes N conversion capacitors corresponding to the N high pass filter conversion paths, and
   wherein capacitances of the N conversion capacitors and a capacitance of the first integration capacitor are the same as each other.

6. The sensor device of claim 5,
   wherein a capacitance of the auxiliary capacitor and the capacitance of the first integration capacitor are different from each other.

7. The sensor device of claim 1, wherein the band pass filter further includes:
   a second high pass filter converter connected to the first input terminal, the second input terminal and a second output terminal of the first amplifier, wherein the second high pass filter time-divisionally provides M high pass filter conversion paths, wherein M is an integer greater than 1; and
   a second gain auxiliary component connected to the second input terminal and the second output terminal of the first amplifier while the first integrator performs the integral function.

8. The sensor device of claim 7, wherein N and M are the same as each other.

9. The sensor device of claim 7, wherein the band pass filter further includes:

a second integrator including a second amplifier;
a third high pass filter converter connected to a first input terminal, a second input terminal and a first output terminal of the second amplifier, wherein the third high pass filter converter time-divisionally provides P high pass filter conversion paths, wherein P is an integer greater than 1; and
a fourth high pass filter converter connected to the first input terminal, the second input terminal and a second output terminal of the second amplifier, wherein the fourth high pass filter converter time-divisionally provides Q high pass filter conversion paths, wherein Q is an integer greater than 1, and
wherein P and Q are the same as each other.

10. The sensor device of claim 9, wherein the band pass filter further includes:
a third integrator including a third amplifier;
a fifth high pass filter converter connected to a first input terminal, a second input terminal, and a first output terminal of the third amplifier, wherein the fifth high pass filter converter time-divisionally provides S high pass filter conversion paths, wherein S is an integer greater than 1;
a third gain auxiliary component connected to the first input terminal and the first output terminal of the third amplifier while the third integrator performs an integral function;
a sixth high pass filter converter connected to the first input terminal, the second input terminal and a second output terminal of the third amplifier, wherein the sixth high pass filter converter time-divisionally provides T high pass filter conversion paths, wherein T is an integer greater than 1; and
a fourth gain auxiliary component connected to the second input terminal and the second output terminal of the third amplifier while the third integrator performs the integral function, and
wherein S and T are the same as each other.

11. The sensor device of claim 7, wherein the first high pass filter converter includes:
a first conversion capacitor;
a second conversion capacitor;
a first switch connected between the first input terminal of the first amplifier and a first electrode of the first conversion capacitor;
a second switch connected between the second input terminal of the first amplifier and a first electrode of the second conversion capacitor;
a third switch including a first terminal connected to a second electrode of the first conversion capacitor;
a fourth switch including a first terminal connected to a second electrode of the second conversion capacitor;
a fifth switch connected between the first output terminal of the first amplifier and a second terminal of the third switch; and
a sixth switch connected between a second terminal of the fourth switch and a reference power source.

12. The sensor device of claim 11, wherein the first integrator includes:
a first integration capacitor including a first electrode connected to the first input terminal of the first amplifier;
a seventh switch connected between a second electrode of the first integration capacitor and the first output terminal of the first amplifier;
an eighth switch connected between the second electrode of the first integration capacitor and the reference power source;
a first input capacitor;
a ninth switch connected between a first input terminal of the band pass filter and a first electrode of the first input capacitor;
a tenth switch connected between a second electrode of the first input capacitor and the first input terminal of the first amplifier;
an eleventh switch connected between the first electrode of the first input capacitor and the reference power source;
a twelfth switch connected between the second electrode of the first input capacitor and the reference power source;
a thirteenth switch connected between the first output terminal of the first amplifier and a first output terminal of the band pass filter; and
a fourteenth switch connected between the first output terminal of the band pass filter and the reference power source.

13. The sensor device of claim 12, wherein the first integrator further includes:
a second input capacitor;
a fifteenth switch connected between a second input terminal of the band pass filter and a first electrode of the second input capacitor;
a sixteenth switch connected between a second electrode of the second input capacitor and the second input terminal of the first amplifier;
a seventeenth switch connected between the first electrode of the second input capacitor and the reference power source;
an eighteenth switch connected between the second electrode of the second input capacitor and the reference power source;
a nineteenth switch connected between the second output terminal of the first amplifier and a second output terminal of the band pass filter;
a twentieth switch connected between the second output terminal of the band pass filter and the reference power source;
a second integration capacitor including a first electrode connected to the second input terminal of the first amplifier;
a twenty-first switch connected between a second electrode of the second integration capacitor and the second output terminal of the first amplifier; and
a twenty-second switch connected between the second electrode of the second integration capacitor and the reference power source.

14. The sensor device of claim 13, wherein the second high pass filter converter includes:
a third conversion capacitor;
a fourth conversion capacitor;
a twenty-third switch connected between the second input terminal of the first amplifier and a first electrode of the third conversion capacitor;
a twenty-fourth switch connected between the first input terminal of the first amplifier and a first electrode of the fourth conversion capacitor;
a twenty-fifth switch including a first terminal connected to a second electrode of the third conversion capacitor;
a twenty-sixth switch including a first terminal connected to a second electrode of the fourth conversion capacitor;

a twenty-seventh switch connected between the second output terminal of the first amplifier and a second terminal of the twenty-fifth switch; and a twenty-eighth switch connected between a second terminal of the twenty-sixth switch and the reference power source.

15. The sensor device of claim 14, wherein the first gain auxiliary component includes a first auxiliary capacitor connected between the second electrode of the first input capacitor and the first output terminal of the band pass filter.

16. The sensor device of claim 15, wherein the second gain auxiliary component includes a second auxiliary capacitor connected between the second electrode of the second input capacitor and the second output terminal of the band pass filter.

17. A band pass filter comprising:

a first integrator including a first amplifier;

a first high pass filter converter connected to a first input terminal, a second input terminal and a first output terminal of the first amplifier, wherein the first high pass filter converter time-divisionally provides N high pass filter conversion paths, wherein N is an integer greater than 1; and a first gain auxiliary component connected to the first input terminal and the first output terminal of the first amplifier while the first amplifier performs an integral function, wherein the integral function is performed in a shorter cycle than a cycle in which at least one of the N high pass filter conversion paths is provided.

18. The band pass filter of claim 17, further comprising:

a second high pass filter converter connected to the first input terminal, the second input terminal and a second output terminal of the first amplifier, wherein the second high pass filter converter time-divisionally provides M high pass filter conversion paths, wherein M is an integer greater than 1; and a second gain auxiliary component connected to the second input terminal and the second output terminal of the first amplifier while the first amplifier performs the integral function.

19. The band pass filter of claim 18, further comprising:

a second integrator including a second amplifier;

a third high pass filter converter connected to a first input terminal, a second input terminal and a first output terminal of the second amplifier, wherein the third high pass filter converter time-divisionally provides P high pass filter conversion paths, wherein P is an integer greater than 1; and a fourth high pass filter converter connected to the first input terminal, the second input terminal and a second output terminal of the second amplifier, wherein the fourth high pass filter converter time-divisionally provides Q high pass filter conversion paths, wherein Q is an integer greater than 1, wherein P and Q are the same as each other.

20. The band pass filter of claim 19, further comprising:

a third integrator including a third amplifier;

a fifth high pass filter converter connected to a first input terminal, a second input terminal and a first output terminal of the third amplifier, wherein the fifth high pass filter converter time-divisionally provides S high pass filter conversion paths, wherein S is an integer greater than 1;

a third gain auxiliary component connected to the first input terminal and the first output terminal of the third amplifier while the third integrator performs an integral function;

a sixth high pass filter converter connected to the first input terminal, the second input terminal and a second output terminal of the third amplifier, wherein the sixth high pass filter converter time-divisionally provides T high pass filter conversion paths, wherein T is an integer greater than 1; and a fourth gain auxiliary component connected to the second input terminal and the second output terminal of the third amplifier while the third amplifier performs the integral function, wherein S and T are the same as each other.

* * * * *